US011282820B2

(12) United States Patent
Takeya et al.

(10) Patent No.: US 11,282,820 B2
(45) Date of Patent: Mar. 22, 2022

(54) DISPLAY DEVICE AND METHOD FOR MANUFACTURING THE SAME

(71) Applicant: Seoul Semiconductor Co., Ltd., Ansan-si (KR)

(72) Inventors: Motonobu Takeya, Ansan-si (KR); Sung Su Son, Ansan-si (KR); Jong Ik Lee, Ansan-si (KR); Seung Sik Hong, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 34 days.

(21) Appl. No.: 16/644,162

(22) PCT Filed: Sep. 4, 2018

(86) PCT No.: PCT/KR2018/010291
§ 371 (c)(1),
(2) Date: Mar. 4, 2020

(87) PCT Pub. No.: WO2019/045549
PCT Pub. Date: Mar. 7, 2019

(65) Prior Publication Data
US 2021/0111162 A1    Apr. 15, 2021

(30) Foreign Application Priority Data

Sep. 4, 2017   (KR) .................. 10-2017-0112750
Sep. 19, 2017  (KR) .................. 10-2017-0120303
Sep. 26, 2017  (KR) .................. 10-2017-0124432

(51) Int. Cl.
*H01L 25/075*   (2006.01)
*H01L 33/00*    (2010.01)
(Continued)

(52) U.S. Cl.
CPC ...... *H01L 25/0753* (2013.01); *H01L 33/0095* (2013.01); *H01L 33/50* (2013.01); *H01L 33/62* (2013.01); *H01L 2933/0066* (2013.01)

(58) Field of Classification Search
CPC . H01L 25/0753; H01L 33/0095; H01L 33/50; H01L 33/62; H01L 2933/0066;
(Continued)

(56) References Cited

U.S. PATENT DOCUMENTS 9,206,967 B2   12/2015  Bang
9,698,128 B2    7/2017  Moriguchi et al.
(Continued)

FOREIGN PATENT DOCUMENTS

EP    3128505       2/2017
JP    2007-233220   9/2007
(Continued)

OTHER PUBLICATIONS

Extended European Search Report dated May 4, 2021, issued in European Patent Application No. 18849878.6.
(Continued)

*Primary Examiner* — Victor A Mandala
(74) *Attorney, Agent, or Firm* — H.C. Park & Associates, PLC

(57) ABSTRACT

A display device including light emitting modules having signal lines and common lines arranged thereon, each including light emitting diodes mounted on an upper surface thereof and electrically connected to the signal lines and the common lines, respectively, a motherboard coupled to the light emitting modules, and a bonding layer having electrical conductivity and coupling the light emitting modules to the motherboard, in which each of the light emitting modules includes signal line terminals and common line terminals disposed on a lower surface thereof and electrically con-
(Continued)

nected to the signal lines and the multiple common lines, respectively, and the motherboard includes board signal line terminals and board common line terminals disposed on an upper surface thereof at locations corresponding to the signal line terminals and the common line terminals of the light emitting modules.

20 Claims, 46 Drawing Sheets

(51) Int. Cl.
*H01L 33/50* (2010.01)
*H01L 33/62* (2010.01)

(58) Field of Classification Search
CPC ....... H01L 25/075; H01L 33/00; H01L 33/38; H01L 33/48; H01L 33/56; H01L 33/58; H01L 33/486; H01L 33/60; H01L 2933/0033
See application file for complete search history.

(56) References Cited

U.S. PATENT DOCUMENTS

| | | | |
|---|---|---|---|
| 2009/0153939 | A1 | 6/2009 | Roh |
| 2016/0097501 | A1* | 4/2016 | Yoshitani ............... H02J 7/025 362/183 |
| 2017/0093106 | A1 | 3/2017 | Hochman et al. |
| 2017/0103926 | A1* | 4/2017 | Aoyagi .................. H01L 33/58 |
| 2017/0250329 | A1 | 8/2017 | Takeya et al. |
| 2017/0294479 | A1* | 10/2017 | Cha ....................... H01L 33/507 |
| 2018/0114800 | A1* | 4/2018 | Pan ..................... H01L 25/0753 |
| 2018/0190615 | A1* | 7/2018 | Pan ......................... G06F 3/044 |
| 2018/0197471 | A1* | 7/2018 | Rotzoll ................ H01L 25/167 |

FOREIGN PATENT DOCUMENTS

| | | |
|---|---|---|
| JP | 2013-026510 | 2/2013 |
| KR | 10-2005-0106263 | 11/2005 |
| KR | 10-2009-0063369 | 6/2009 |
| KR | 10-1476688 | 12/2014 |

OTHER PUBLICATIONS

International Search Report dated Dec. 13, 2018, issued in International Patent Application No. PCT/KR2018/010291.

* cited by examiner

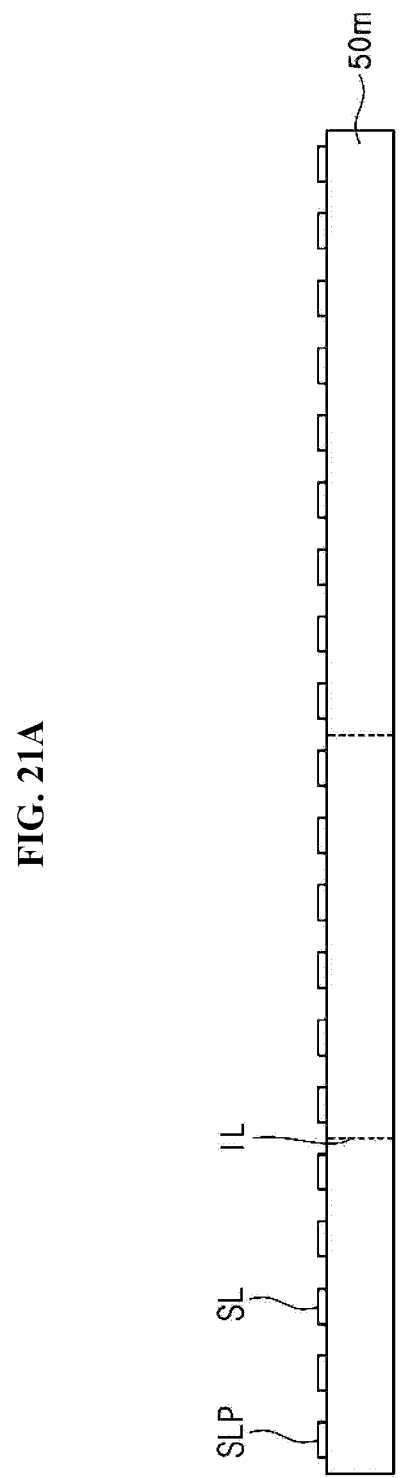

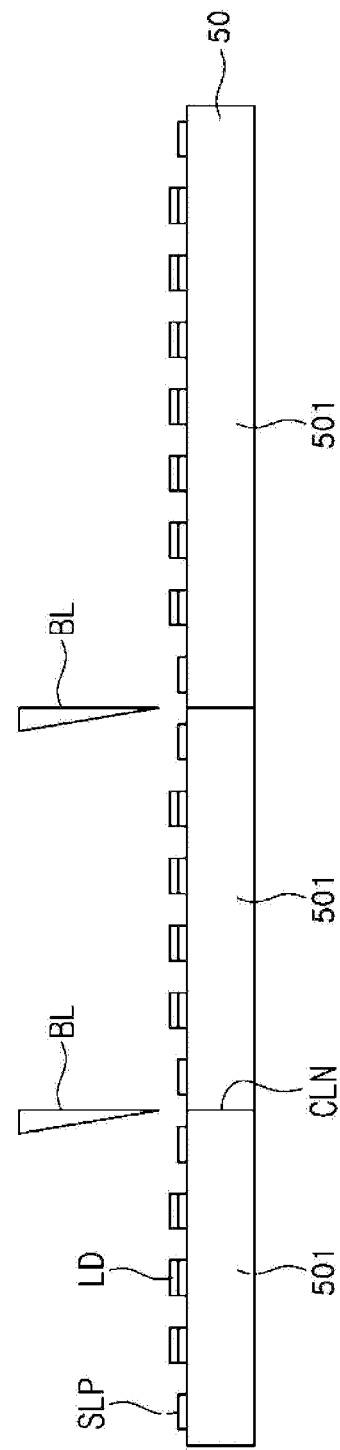

DISPLAY DEVICE AND METHOD FOR MANUFACTURING THE SAME

CROSS-REFERENCE TO RELATED APPLICATIONS

This application is a National Stage Entry of International Patent Application No. PCT/KR2018/010291, filed on Sep. 4, 2018, and claims priority from and the benefit of Korean Patent Application No. 10-2017-0112750, filed on Sep. 4, 2017, Korean Patent Application No. 10-2017-0120303, filed on Sep. 19, 2017, and Korean Patent Application No. 10-2017-0124432, filed on Sep. 26, 2017, each of which is hereby incorporated by reference for all purposes as if fully set forth herein.

BACKGROUND

Field

Exemplary embodiments of the invention relate to a display device and a method for manufacturing the same, and, more specifically, to a display device including light emitting devices and a method for manufacturing the same.

Discussion of the Background

In recent years, there are consistent demands for display devices having various sizes and high resolution. In particular, for indoor and outdoor billboards, a display device having a large size of 100 inches or more is required depending upon an installation structure of the display device and various requirements. However, such a large display device requires a complicated manufacturing process, thereby making it difficult to provide a display device of a desired size.

Digital signage is an outdoor media that provides various content and messages through digital displays, rather than existing hardware matches, such as posters, guide displays, and signboards displayed on roadsides, stores, and public facilities. With the rapid development of intelligent digital imaging devices, digital signage has become commonplace.

In recent years, products manufactured through application of light emitting diodes applied to such digital signage have been released. A light emitting diode is an inorganic semiconductor device that emits light generated through recombination of electrons and holes. As the light emitting diodes are applied to digital signage, products having low power consumption and fast response rate are more commonly used.

FIGS. 1A to 1D show a method for manufacturing a typical display device.

A display device 10 for digital signage is manufactured by a method as shown in FIGS. 1A to 1D. First, referring to FIG. 1A, blue light emitting diodes 22 emitting blue light, red light emitting diodes 24 emitting red light, and green light emitting diodes 26 emitting green light are selected to manufacture packages PKG, as shown in FIG. 1B. The packages PKG may be manufactured through wire bonding as needed, depending upon chip structures of the blue light emitting diode 22, the red light emitting diode 24, and the green light emitting diode 26.

Then, among the manufactured packages PKG, normal packages PKG are selected and arranged at constant intervals on a printed circuit board to be connected to one another, thereby providing light emitting modules 11, as shown in FIG. 1C. The selected packages PKG may be coupled to one another through a solder mount on the printed circuit board.

Thereafter, the light emitting modules 11 may be electrically connected to one another through connectors and be coupled to a frame structure, thereby providing the display device 10, as shown in FIG. 1D.

On the other hand, a display device having a large size and high resolution requires a long manufacturing time, and does not allow easy matching of color uniformity or white balance.

Moreover, due to tolerance of a manufactured printed circuit board or installation tolerance in the process of installing the light emitting modules in the frame, the manufactured display device has a problem in that a black line is visible at connection points between the light emitting modules therein.

Moreover, in addition to demand for high resolution full color display devices, there is an increasing demand for display devices having high levels of color purity and color reproducibility.

The above information disclosed in this Background section is only for understanding of the background of the inventive concepts, and, therefore, it may contain information that does not constitute prior art.

SUMMARY

Display devices constructed according to exemplary embodiments of the invention have a large size and high resolution.

Exemplary embodiments also provide a display device that has a simple structure that facilitates manufacture.

Exemplary embodiments further provide a display device having high levels of color purity and color reproducibility.

Additional features of the inventive concepts will be set forth in the description which follows, and in part will be apparent from the description, or may be learned by practice of the inventive concepts.

A display device according to an exemplary embodiment includes: multiple light emitting modules having multiple signal lines and multiple common lines arranged thereon, each light emitting module including multiple light emitting diodes mounted on an upper surface thereof and electrically connected to the multiple signal lines and the multiple common lines, respectively; a motherboard coupled to the multiple light emitting modules; and a bonding layer having electrical conductivity and coupling the multiple light emitting modules to the motherboard, in which each of the multiple light emitting modules is formed on a lower surface thereof with multiple signal line terminals electrically connected to the multiple signal lines and multiple common line terminals electrically connected to the multiple common lines, and the motherboard is formed on an upper surface thereof with multiple board signal line terminals at locations corresponding to the multiple signal line terminals formed on the multiple light emitting modules and multiple board common line terminals at locations corresponding to the multiple common line terminals formed on the multiple light emitting modules.

The multiple signal line terminals formed on adjacent light emitting modules among the multiple light emitting modules may be electrically connected to each other by the board signal line terminals formed on the motherboard and the bonding layer, and the multiple common line terminals formed on adjacent light emitting modules among the multiple light emitting modules may be electrically connected to each other by the board common line terminals formed on the motherboard and the bonding layer.

The bonding layer may include one of an anisotropic conductive film (ACF), anisotropic conductive pastes (ACP), self-assembly pastes (SAP/epoxy+Sn-Bi), eutectic, AuSn, AgSn, In, and solder pastes.

A display device according to another exemplary embodiment includes: multiple light emitting modules having multiple signal lines and multiple common lines arranged thereon, each light emitting module including multiple light emitting diodes mounted on an upper surface thereof and electrically connected to the multiple signal lines and the multiple common lines, respectively; a motherboard coupled to the multiple light emitting modules; and a bonding layer coupling the multiple light emitting modules to the motherboard, in which each of the multiple light emitting modules is formed on the upper surface thereof with multiple signal line terminals electrically connected to the multiple signal lines and multiple common line terminals electrically connected to the multiple common lines. The display device may further include a coupling part electrically connecting the multiple signal line terminals formed on adjacent light emitting modules among the multiple light emitting modules to each other and electrically connecting the multiple common line terminals formed on adjacent light emitting modules among the multiple light emitting modules to each other.

The coupling part may include bonding wires electrically connecting the adjacent multiple signal line terminals to each other and the adjacent multiple common line terminals to each other.

The coupling part may include an electrically conductive bonding layer electrically connecting the adjacent multiple signal line terminals to each other by covering upper surfaces thereof and electrically connecting the adjacent multiple common line terminals to each other by covering upper surfaces thereof.

The bonding layer may include one of an anisotropic conductive film (ACF), anisotropic conductive pastes (ACP), self-assembly pastes (SAP/epoxy+Sn-Bi), eutectic, AuSn, AgSn, In, and solder pastes.

Each of the multiple light emitting modules may be formed with multiple lateral signal line terminals on a side surface thereof at locations of the multiple signal line terminals formed thereon and multiple lateral common line terminals on a side surface thereof at locations of the multiple common line terminals formed thereon, and the coupling part may include an electrically conductive bonding layer electrically connecting adjacent multiple lateral signal line terminals to each other and adjacent multiple lateral common line terminals to each other.

The bonding layer may include one of an anisotropic conductive film (ACF), anisotropic conductive pastes (ACP), self-assembly pastes (SAP/epoxy+Sn-Bi), eutectic, AuSn, AgSn, In, and solder pastes.

A method for manufacturing a display device according to another exemplary embodiment includes: transferring multiple light emitting diodes to a base substrate having multiple signal lines and multiple common lines arranged thereon, the base substrate including multiple mounts provided on an upper surface thereof to which the multiple light emitting diodes are mounted to be electrically connected to the multiple signal lines and the multiple common lines, respectively; manufacturing multiple light emitting modules by cutting the base substrate having the multiple light emitting diodes mounted thereon into predetermined regions; forming a bonding layer having electrical conductivity on a motherboard; and coupling the multiple light emitting modules to the motherboard on which the bonding layer is disposed, in which each of the multiple light emitting modules is formed on a lower surface thereof with multiple signal line terminals electrically connected to the multiple signal lines and multiple common line terminals electrically connected to the multiple common lines, and the motherboard is formed on an upper surface thereof with multiple board signal line terminals at locations corresponding to the multiple signal line terminals formed on the multiple light emitting modules and multiple board common line terminals at locations corresponding to the multiple common line terminals formed on the multiple light emitting modules.

In coupling the multiple light emitting modules to the motherboard, the multiple light emitting modules may be coupled to the motherboard such that the multiple signal line terminals formed on adjacent light emitting modules among the multiple light emitting modules are electrically connected to each other by the board signal line terminals formed on the motherboard and the bonding layer, and the multiple common line terminals formed on adjacent light emitting modules among the multiple light emitting modules are electrically connected to each other by the board common line terminals formed on the motherboard and the bonding layer.

The bonding layer may include one of an anisotropic conductive film (ACF), anisotropic conductive pastes (ACP), self-assembly pastes (SAP/epoxy+Sn-Bi), eutectic, AuSn, AgSn, In, and solder pastes.

The method may further include testing operation states of the multiple light emitting diodes when the multiple light emitting diodes are mounted on the base substrate, in which the multiple light emitting modules may be manufactured after testing the operation states of the multiple light emitting diodes.

Testing the multiple light emitting diodes may be performed for each of the multiple light emitting modules manufactured by cutting.

A method for manufacturing a display device according to another exemplary embodiment includes: transferring multiple light emitting diodes to a base substrate having multiple signal lines and multiple common lines arranged thereon, the base substrate including multiple mounts provided on an upper surface thereof to which the multiple light emitting diodes are mounted to be electrically connected to the multiple signal lines and the multiple common lines, respectively; manufacturing multiple light emitting modules by cutting the base substrate having the multiple light emitting diodes mounted thereon into predetermined regions; forming a bonding layer on a motherboard; coupling the multiple light emitting modules to the motherboard on which the bonding layer is disposed; and electrically connecting adjacent light emitting modules to each other among the multiple light emitting modules, in which each of the multiple light emitting modules may be formed on an upper surface thereof with multiple signal line terminals electrically connected to the multiple signal lines and multiple common line terminals electrically connected to the multiple common lines, and electrically connecting the adjacent light emitting modules may include electrically connecting the multiple signal line terminals formed on the adjacent light emitting modules to each other and electrically connecting the multiple common line terminals formed on the adjacent light emitting modules to each other.

In electrically connecting the adjacent light emitting modules, the adjacent multiple signal line terminals may be electrically connected to each other by wire bonding and the adjacent multiple common line terminals may be electrically connected to each other by wire bonding.

In electrically connecting the adjacent light emitting modules, an upper surface of each of the adjacent multiple signal line terminals may be covered by an electrically conductive bonding layer and an upper surface of each of the adjacent multiple common line terminals may be covered by the electrically conductive bonding layer such that the adjacent multiple signal line terminals may be electrically connected to each other and the adjacent multiple common line terminals may be electrically connected to each other by the electrically conductive bonding layer.

The electrically conductive bonding layer may include one of an anisotropic conductive film (ACF), anisotropic conductive pastes (ACP), self-assembly pastes (SAP/epoxy+Sn-Bi), eutectic, AuSn, AgSn, In, and solder pastes.

The method may further include: forming multiple lateral signal line terminals on side surfaces of the multiple light emitting modules at locations of the multiple signal line terminals formed thereon, and forming multiple lateral common line terminals on side surfaces of the multiple light emitting modules at locations of the multiple common line terminals formed thereon, in which electrically connecting the adjacent light emitting modules may include electrically connecting adjacent multiple lateral signal line terminals to each other and adjacent multiple lateral common line terminals to each other using an electrically conductive bonding layer.

The electrically conductive bonding layer may include one of an anisotropic conductive film (ACF), anisotropic conductive pastes (ACP), self-assembly pastes (SAP/epoxy+Sn-Bi), eutectic, AuSn, AgSn, In, and solder pastes.

A display device according to another exemplary embodiment includes: multiple base substrates separated from each other; pixels arranged on one surface of each of the base substrates; and an interconnection part connected to the pixels. The interconnection part may include signal interconnects disposed on the base substrates and a connecting portion disposed on one surface of each of adjacent base substrates and connecting the signal interconnects to each other, and at least one base substrate may have a different area than the other base substrates.

At least one base substrate may include a different number of pixels than the other base substrates.

The base substrates may include at least one of glass, quartz, organic polymers, metal, silicone resins, ceramic materials, and organic-inorganic composites.

Each of the pixels may be a light emitting diode having first and second terminals, and the signal interconnects may include a first interconnect connected to the first terminal and a second interconnect connected to the second terminal. The connecting portion may connect the first interconnects or the second interconnects to each other on the adjacent base substrates.

The signal interconnects may further include a first pad provided to an end of the first interconnect and a second pad provided to an end of the second interconnect. The connecting portion may connect the first pads or the second pads to each other on the adjacent base substrates.

Each of the pixels may be driven by an active driving method. In this case, the pixel unit may further include a transistor connected to the interconnection part and the pixel.

Each of the pixels may be driven by a passive driving method.

The connecting portion may include at least one of a bonding wire and a conductive paste.

The display device may further include a light blocking layer formed on upper surfaces of the base substrates.

The display device may further include an encapsulation layer formed on the base substrates to cover the pixels and the interconnection part. The encapsulation layer may include one of an epoxy resin, a polysiloxane resin, and photo solder resist.

The display device may further include a printed circuit board provided to rear surfaces of the base substrates and including a drive circuit for driving the pixels mounted thereon. The printed circuit board may include at least one seating groove formed on an upper surface thereof to receive the base substrates seated thereon. In one embodiment, the seating groove may be provided in one-to-one correspondence to each of the base substrates.

The printed circuit board may include a seat portion on which the seating groove is formed and a peripheral portion surrounding the seat portion, and the connecting portion may include a connection interconnect provided to the peripheral portion and connecting the drive interconnect to the drive circuit. The connection interconnect may include a through-interconnect penetrating the printed circuit board from an upper surface of the printed circuit board to a lower surface thereof. The through-interconnect may be provided in plural.

The connecting portion may be a flexible circuit substrate.

The base substrates may overlap the printed circuit board in plan view.

The pixels may include multiple sub-pixels emitting different colors of light. Each of the sub-pixels may emit one of red, blue and green light. The pixels may include light emitting diodes.

A method for manufacturing a display device according to another exemplary embodiment may include: preparing a base mother substrate, followed by forming drive interconnects on the base mother substrate; forming multiple pixels on the base mother substrate to be connected to the drive interconnects; cutting the base mother substrate to form multiple pixel units; and connecting the multiple pixel units to one another.

The base mother substrate may include pixel unit regions corresponding to the pixel units, respectively, and may be cut along the pixel unit regions.

The base mother substrate may be cut to regions having different areas.

The pixels may be formed by a transfer process.

The method may further include preparing a printed circuit board having seating grooves corresponding to the pixel unit regions, and disposing the pixel units on the seating grooves.

A light emitting apparatus according to another exemplary embodiment includes a base substrate and at least one pixel unit mounted on the base substrate. The pixel unit may include a connection electrode provided to the base substrate with a first conductive bonding layer interposed between the connection electrode and the base substrate, a light non-transmitting layer formed on the connection electrode, and a light emitting device disposed on the light non-transmitting layer.

The light non-transmitting layer may be formed of a non-conductive light absorption material. The light non-transmitting layer may include a black photoresist.

The light non-transmitting layer may be formed of a non-conductive reflective material.

The light emitting apparatus may further include a second conductive bonding layer connecting the connection electrode to the light emitting device.

The light non-transmitting layer may have a through-hole partially exposing the connection electrode and the second conductive bonding layer may be disposed in the through-hole.

The light emitting device may be a light emitting diode and each of the first and second terminals may be electrically connected to the connection electrode through the through-hole of the light non-transmitting layer.

The light emitting device may be provided in plural and the light emitting devices may include a first light emitting device emitting a first light component and a second light emitting device emitting a second light component.

The first light and the second light may have different wavelength bands.

The light emitting apparatus may further include a color conversion layer disposed on the first light emitting device and converting the first light into light having a different wavelength band from the first light. In one embodiment, the color conversion layer may include a phosphor.

The first light and the second light may have the same wavelength band.

The light emitting device may be provided in plural and the light emitting devices may include a first light emitting device emitting a first light component, a second light emitting device emitting a second light component, and a third light emitting device emitting a third light component.

At least one of the first to third light emitting devices may be disposed at a different height from the other light emitting devices.

The first to third light components may have a red wavelength band, a green wavelength band, and a blue wavelength band, respectively.

The light emitting apparatus may further include a color conversion layer disposed on at least one of the first to third light emitting devices. The color conversion layer may be disposed on the first light emitting device and the first to third light components may have a blue wavelength band, a green wavelength band, and a blue wavelength band, respectively.

The light emitting device may include a light emitting diode having a first terminal and a second terminal, and the base substrate may include a first signal interconnect electrically connected to the first terminal and a second signal interconnect electrically connected to the second terminal.

The light emitting apparatus may further include a transistor disposed between the first and second signal interconnects and driving the light emitting device.

The light emitting devices may be arranged in a matrix, the first signal interconnect may be connected to the light emitting devices arranged in one of a row direction and a column direction, and the second signal interconnect may be connected to the light emitting devices arranged in the other direction.

The light emitting apparatus may include: a scan drive unit connected to the first signal interconnect; and a data drive unit connected to the second signal interconnect.

The light emitting apparatus may further include an encapsulation layer disposed on the light non-transmitting layer and covering the pixel unit.

A light emitting apparatus according to another exemplary embodiment includes: a base substrate; an interconnection part disposed on the base substrate; a connection electrode disposed on the interconnection part and connected to the interconnection part through a first conductive bonding layer; a light emitting device disposed on the connection electrode and connected to the connection electrode through a second conductive bonding layer; and a light non-transmitting layer interposed between the interconnection part and the connection electrode or between the connection electrode and the light emitting device.

A method for forming a light emitting apparatus according to another exemplary embodiment includes: forming a connection electrode on an initial substrate; forming a light non-transmitting layer on the connection electrode; forming a light emitting device on the light non-transmitting layer to be connected to the connection electrode; forming an encapsulation layer on the light emitting device; disposing a support substrate on the encapsulation layer, followed by removing the initial substrate; and connecting the connection electrode to the interconnection part of a circuit board, followed by removing the support substrate.

A display device includes: a printed circuit board; and multiple light emitting modules disposed on the printed circuit board, each of the light emitting modules including at least one pixel region, in which the at least one pixel region includes: a light transmitting base substrate; first to third light emitting devices disposed on the light transmitting base substrate; and first to fourth bumps disposed on the first to third light emitting devices to face the base substrate, in which the first to third bumps are electrically connected to the first to third light emitting devices, respectively, and the fourth bump is electrically commonly connected to the first to fourth light emitting devices.

Each of the light emitting modules may further include connection layers disposed between the first to third light emitting devices and the first to fourth bumps to electrically connect the first to third light emitting devices to the first to fourth bumps.

Each of the light emitting modules may further include a step regulation layer covering the first to third light emitting devices. The step regulation layer may have openings exposing the first to third light emitting devices and the connection layers may be disposed on the step regulation layer and may be connected to the first to fourth bumps of the first to third light emitting devices through the openings.

Each of the light emitting modules may further include a protective layer covering side surfaces of the first to fourth bumps.

The light emitting modules may be mounted on the printed circuit board.

The display device may further include an interposer substrate interposed between the printed circuit board and the light emitting modules, and the light emitting modules may be mounted on the interposer substrate.

The interposer substrate may include signal lines and common lines, and may be electrically connected to circuits on the printed circuit board.

At least one of the light emitting modules may have a different size from the other light emitting modules. In addition, at last one of the light emitting modules may have a different number of pixels from the other light emitting modules.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 21A, 21B, 21C, 21D, and 21E are cross-sectional views illustrating a method for manufacturing a display device according to an exemplary embodiment.

DETAILED DESCRIPTION

Figure 1A:
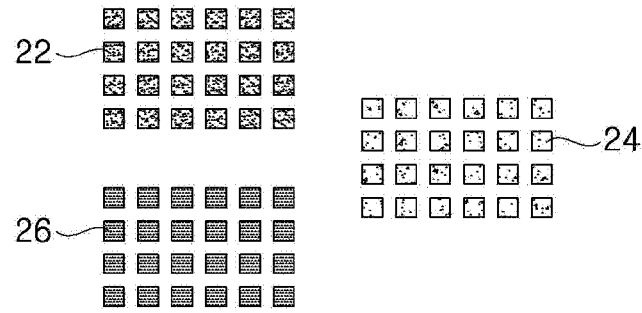
FIGS. 1A, 1B, 1C, and 1D show a method for manufacturing a typical display device.
Figure 1B:
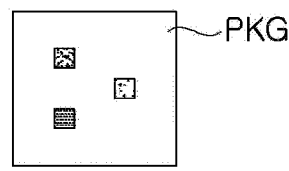
Figure 1C:
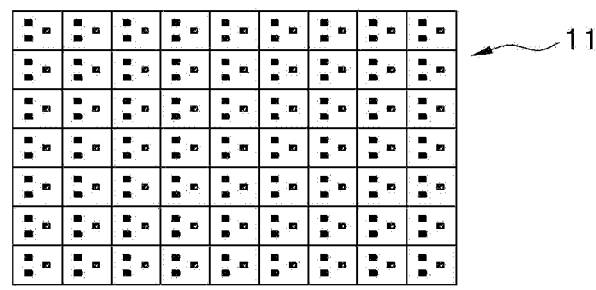
Figure 1D:
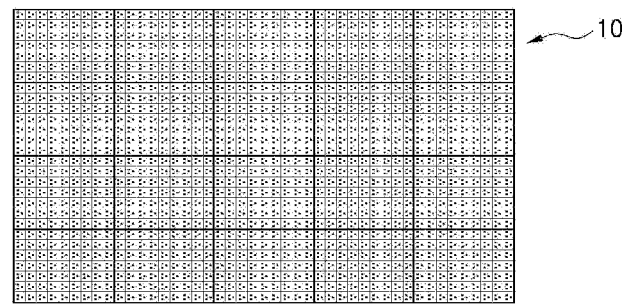

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings.

Figure 2:
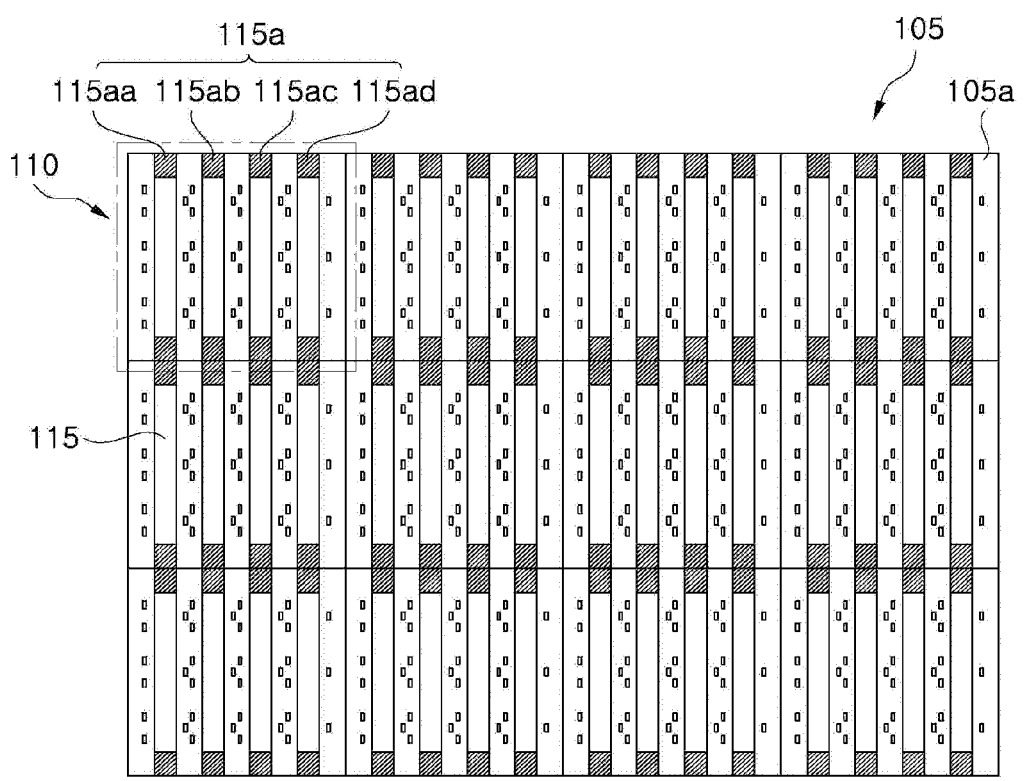
FIG. 2 is a plan view of a substrate for manufacturing light emitting modules of a display device according to a first exemplary embodiment.
Figure 3:
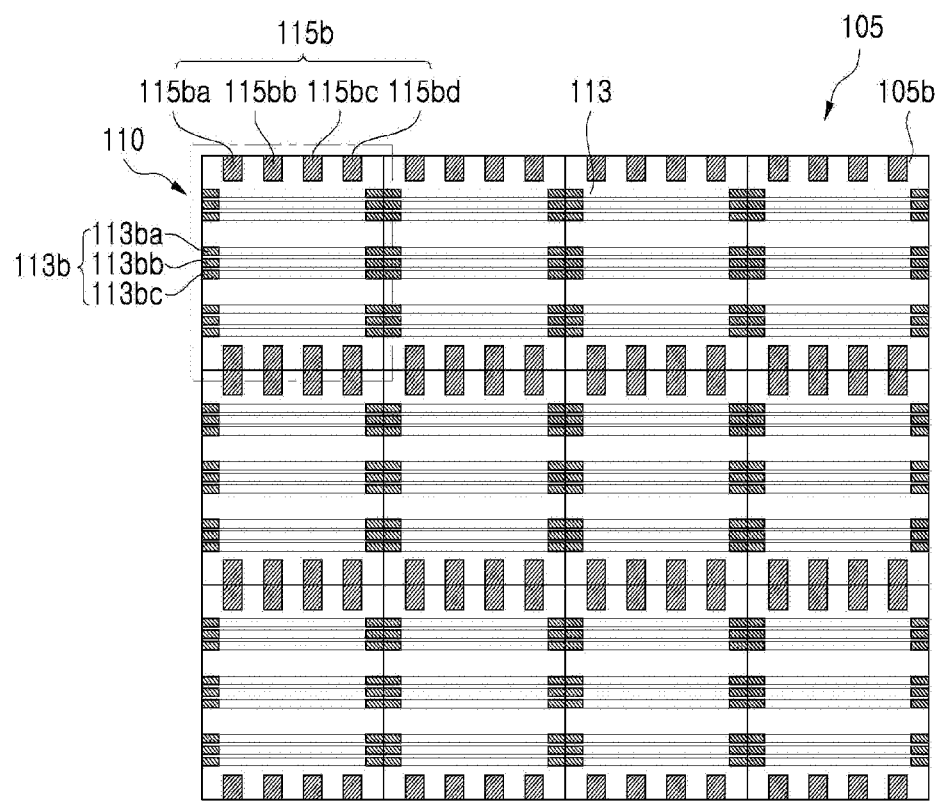
FIG. 3 is a rear view of the substrate of FIG. 2.
Figure 4:
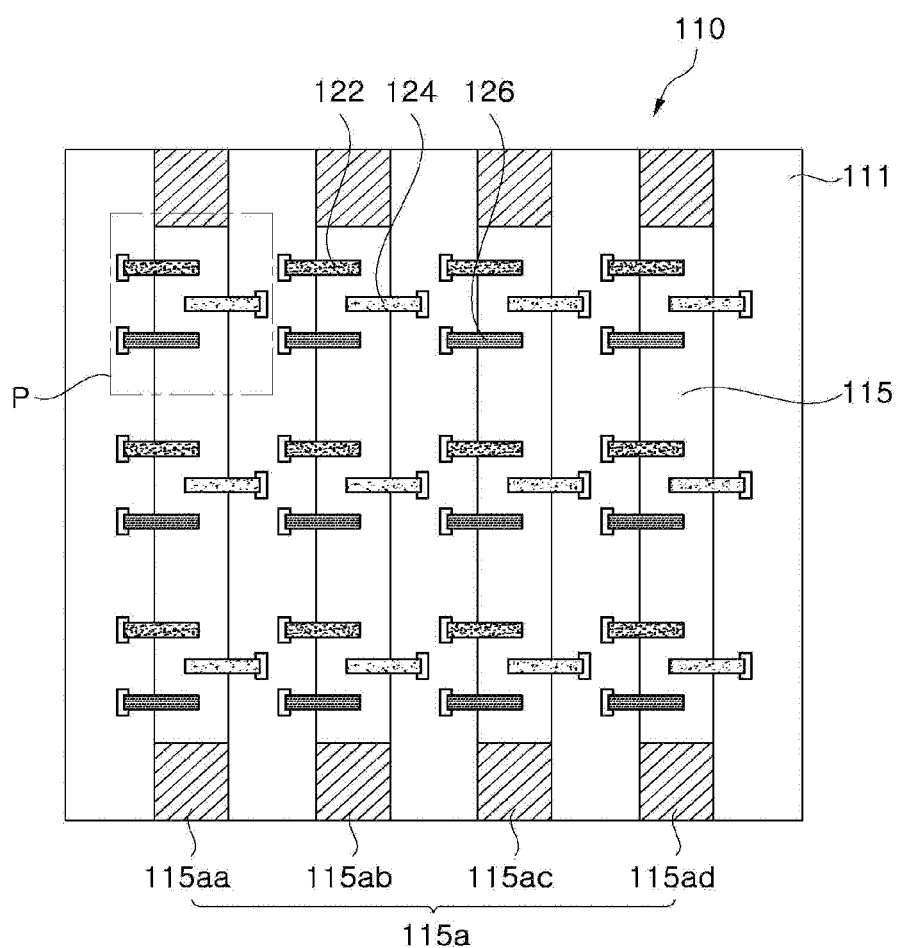
FIG. 4 is an enlarged plan view of a light emitting module of the display device of FIG. 2.

FIG. 2 is a plan view of a substrate for manufacturing light emitting modules of a display device according to a first exemplary embodiment, and FIG. 3 is a rear view of the substrate of FIG. 2. FIG. 4 is an enlarged plan view of a light emitting module of the display device of FIG. 2.

Referring to FIG. 2 and FIG. 3, a base substrate 105 for light emitting modules 110 used in manufacture of the display device 100 is first manufactured. Although FIG. 2 and FIG. 3 exemplarily illustrate twelve light emitting modules 110 disposed on the base substrate 105, the inventive concepts are not limited to a particular number of the light emitting modules 110 formed on the base substrate 105.

The base substrate 105 may support multiple light emitting diode chips on an upper surface thereof. The base substrate 105 is typically formed of an insulation material, and may have a conductive circuit pattern on an upper surface thereof to supply electric power received from an external power source to each of light emitting diode chips. The base substrate 105 may be selected from among a ceramic substrate, a polyimide (PI) substrate, a Tap substrate, a glass wafer, a silicon wafer, and the like.

The base substrate 105 may be provided with multiple signal lines 113 and multiple common lines 115. In addition, multiple upper common line terminals 115a electrically connected to the multiple common lines 115 may be formed on the upper surface 105a of the base substrate 105, as shown in FIG. 2. The multiple signal lines 113 and the multiple common lines 115 may not be exposed on the upper surface 105a of the base substrate 105. Although the upper surface 105a of the base substrate 105 according to the illustrated exemplary embodiment is not formed with multiple signal line terminals electrically connected to the multiple signal lines 113, in other exemplary embodiments, the multiple signal line terminals may be formed on the upper surface 105a of the base substrate 105. The multiple upper common line terminals 115a may be disposed along the periphery of a substrate 111, from which the light emitting modules 110 are separated.

Mounts may be disposed inside the light emitting modules 110, such that multiple light emitting diode chips, for example, a blue light emitting diode chip, a red light emitting diode chip, and a green light emitting diode chip, can be mounted thereon. The mounts may be formed inside the multiple upper common line terminals 115a formed along the periphery of the substrate 111 of the light emitting modules 110, and may be electrically connected to the multiple signal lines 113 and the multiple common lines 115.

Further, as shown in FIG. 3, multiple lower signal line terminals 113b and multiple lower common line terminals 115b electrically connected to the multiple signal lines 113 and the multiple common lines 115, respectively, may be formed on a lower surface 105b of the base substrate 105. The multiple lower common line terminals 115b formed on the lower surface 105b of the base substrate 105 may be disposed at locations corresponding to the multiple upper common line terminals 115a formed on the upper surface 105a of the base substrate 105. The multiple upper common line terminals 115a may be connected to the multiple lower common line terminals 115b through the common lines 115, respectively.

At least one of the multiple signal lines 113 and the multiple common lines 115 shown in FIG. 2 and FIG. 3 may be covered by an insulation layer, rather than being exposed on the upper surface 105a or the lower surface 105b of the base substrate 105.

The multiple light emitting diode chips, for example, a blue light emitting diode chip, a red light emitting diode chip, and a green light emitting diode chip, may be mounted on the upper surface 105a of the base substrate 105 by a single transfer process. After the multiple light emitting diode chips are mounted on the base substrate 1-5, the base substrate 105 may be cut in units corresponding to the light emitting modules 110, thereby providing the light emitting modules 110. In this manner, the light emitting modules 110 each including multiple blue light emitting diode chips 122, multiple red light emitting diode chips 124, and multiple green light emitting diode chips 126 on the substrate 111 can be manufactured as shown in FIG. 4.

The light emitting modules 110 manufactured by the above process is shown in FIG. 4. In the illustrated exemplary embodiment, although the multiple lower signal line terminals 113a, 113b and the multiple upper and lower common line terminals 115a, 115b are shown as having relatively large sizes for illustration purposes, it should be understood that the multiple lower signal line terminals and the multiple upper and lower common line terminals may be formed to have small sizes, as needed.

Accordingly, a separation distance between the light emitting diode chips 122, 124, 126 in a single light emitting module 110 may be the same as a separation distance between the light emitting diode chips 122, 124, 126 disposed along an edge of another light emitting module 110 adjacent thereto.

Referring again to FIG. 4, in the light emitting module 110 including the light emitting diode chips 122, 124, 126 mounted thereon, each of the light emitting diode chips 122, 124, 126 is mounted on the mount formed on the substrate to be electrically connected to the signal line 113 and the common line 115. In addition, a single pixel P is formed by one blue light emitting diode chip 122, one red light emitting diode chip 124, and one green light emitting diode chip 126. Although the illustrated exemplary embodiment shows that a single pixel includes one blue light emitting diode chip 122, one red light emitting diode chip 124, and one green light emitting diode chip 126 in a single pixel, in some exemplary embodiments, one pixel may include multiple blue, red, and green light emitting diode chips, as needed.

In the illustrated exemplary embodiment, each of the light emitting diode chips 122, 124, 126 may be electrically connected to the common line 115 and the signal line 113. In particular, although an upper signal line is not shown in FIG. 4, referring to the lower surface 105b of the base substrate 105 shown in FIG. 3, the blue light emitting diode chip 122 included in one pixel is electrically connected to a first signal line terminal 113ba and a first common line terminal 115aa, and the red light emitting diode chip 124 therein is electrically connected to a second signal line terminal 113bb and the first common line terminal 115aa. Further, the green light emitting diode chip 126 is electrically connected to a third signal line terminal 113bc and the first common line terminal 115aa.

Referring back to FIG. 2 and FIG. 3, the multiple upper common line terminals 115a, the multiple lower signal line terminals 113b, and the multiple lower common line terminals 115b are formed along the periphery of one light emitting module 110 on the base substrate 105, and the light emitting diode chips 122, 124, 126 are disposed on the upper surface 105a of the base substrate 105. The lower signal line terminals 113b may be formed at both sides of one signal line 113, and the upper and lower common line terminals 115a, 115b may be formed at both sides of one common line 115.

In addition, after the light emitting diode chips 122, 124, 126 are disposed on the upper surface 105a of the base substrate 105 as shown in FIG. 2, each of the light emitting modules 110 may be subjected to a test. The test may confirm normal operation of the multiple light emitting diode chips 122, 124, 126 mounted on the corresponding light emitting module 110. Only the light emitting modules 110 passing the test are coupled to a motherboard 130, thereby manufacturing the display device 100.

Next, the motherboard 130 will be described with reference to FIG. 5.

Figure 5:
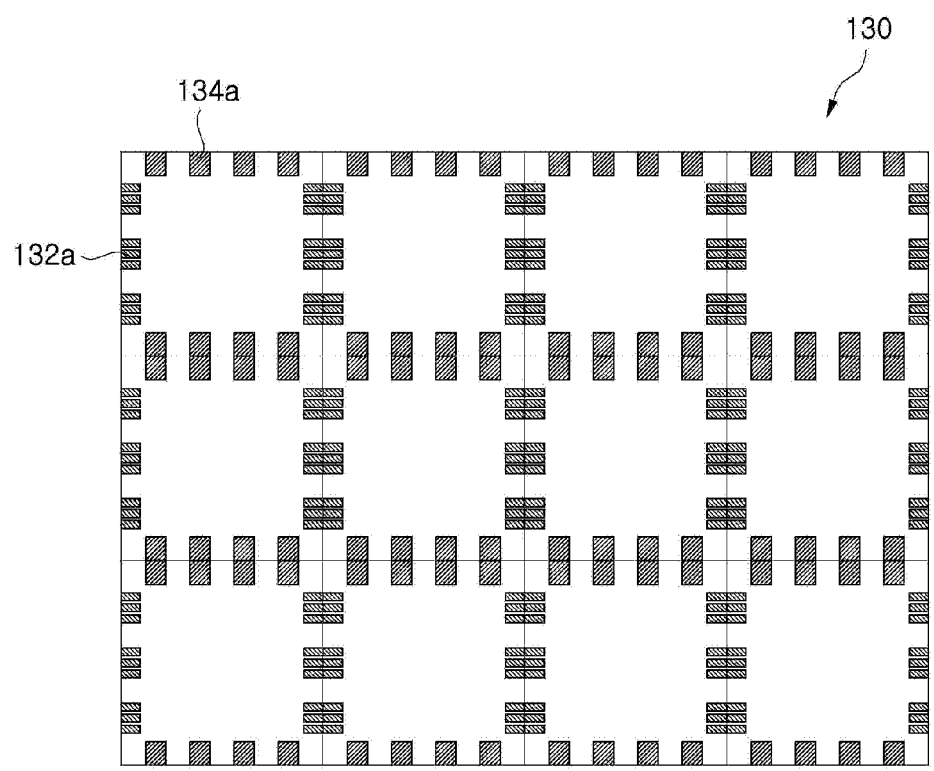
FIG. 5 is a plan view of a motherboard for manufacturing the display device according to an exemplary embodiment.

FIG. 5 is a plan view of a motherboard for manufacturing a display device according to an exemplary embodiment.

The motherboard 130 for manufacturing the display device 100 according to an exemplary embodiment has a structure shown in FIG. 5. Although the motherboard 130 according to the illustrated exemplary embodiment is shown as having a size capable of mounting twelve light emitting modules 110 thereon, the motherboard 130 according to some exemplary embodiments may have a larger size and may have substantially the same size as the display device 100 to be manufactured.

Referring to FIG. 5, the motherboard 130 according to the illustrated exemplary embodiment has substantially the same structure as that of the lower surface 105b of the base substrate 105 shown in FIG. 3. More particularly, like the base substrate 105, the motherboard 130 may be formed with multiple board signal line terminals 132a and multiple board common line terminals 134a without including multiple signal lines and multiple common lines. Alternatively, the motherboard 130 may be provided with the multiple signal lines and the multiple common lines together with the multiple board signal line terminals 132a and the multiple board common line terminals 134a.

The multiple board signal line terminals 132a and the multiple board common line terminals 134a may be disposed along the periphery of the motherboard 130 and inside the motherboard 130. Accordingly, electric power and image signals may be transferred to the multiple light emitting modules 110 mounted on the motherboard 130 through the multiple board signal line terminals 132a and the multiple board common line terminals 134a.

Figure 6:
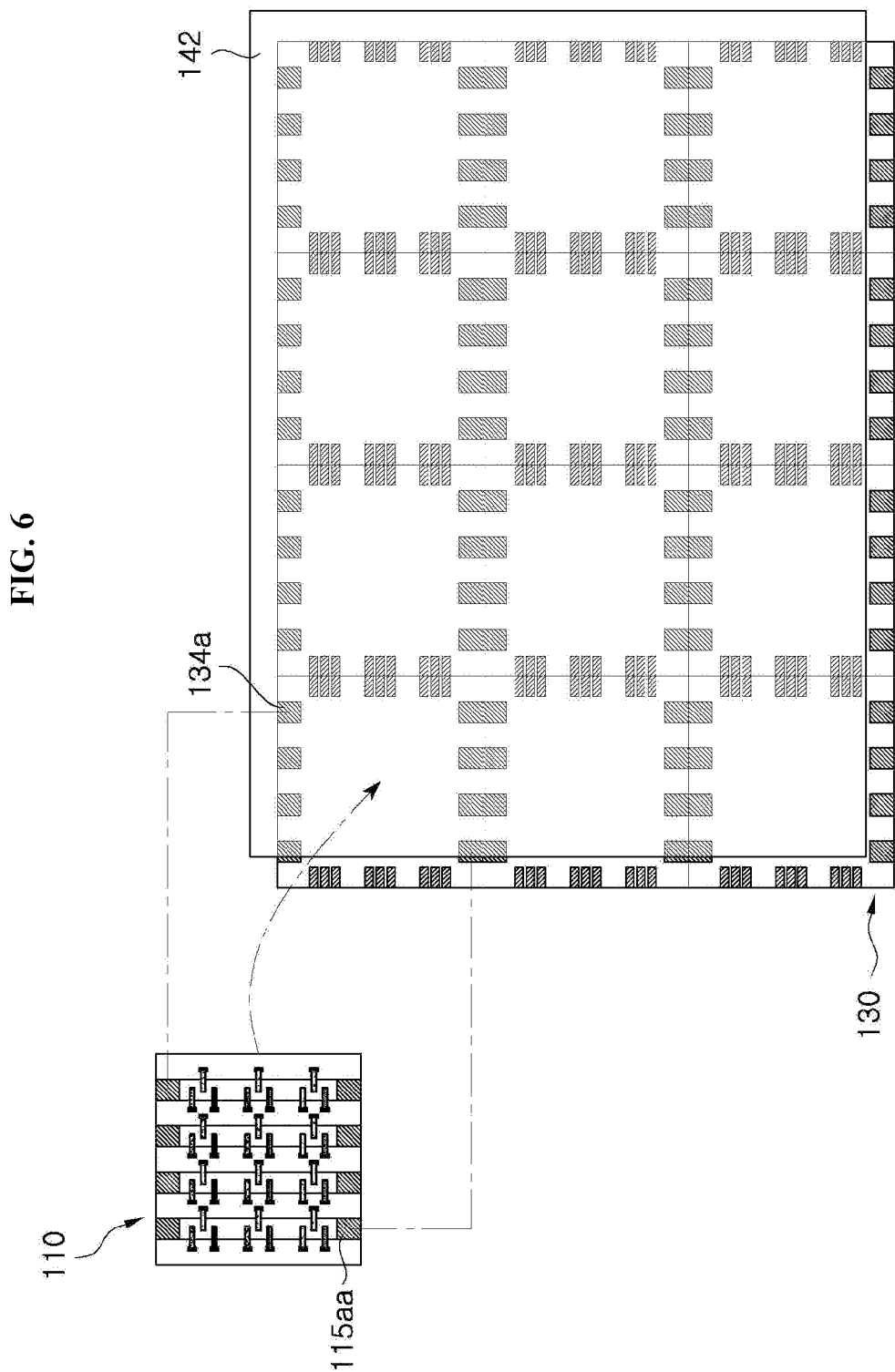
FIG. 6 is a view illustrating a process of manufacturing the display device according to an exemplary embodiment.
Figure 7:
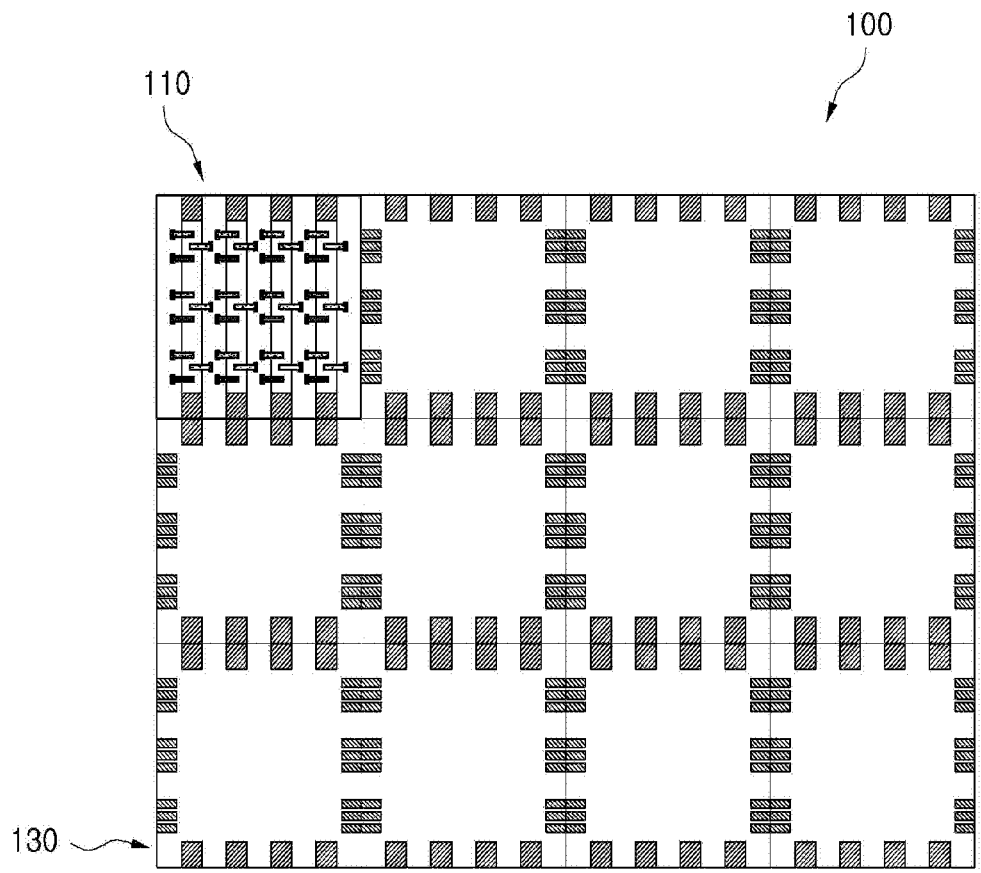
FIG. 7 is a plan view of the motherboard of the display device according to an exemplary embodiment, on which the light emitting modules are mounted in some region of the motherboard.
Figure 8:
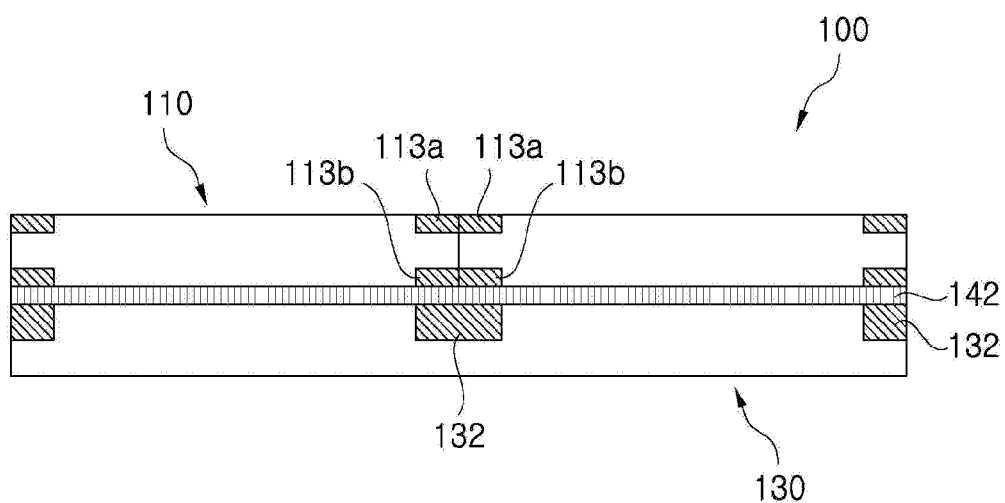
FIG. 8 is a cross-sectional view of the display device according to an exemplary embodiment.

FIG. 6 is a view illustrating a process of manufacturing the display device according to an exemplary embodiment, and FIG. 7 is a plan view of the motherboard of the display device according to an exemplary embodiment, on which the light emitting modules are mounted in some region of the motherboard. FIG. 8 is a cross-sectional view of the display device according to an exemplary embodiment.

Referring to FIG. 6 to FIG. 8, a process of coupling the multiple light emitting modules 110 to the motherboard 130 will be described.

First, the first bonding layer 142 may be disposed on the motherboard 130. The first bonding layer 142 may have the same size as the motherboard 130 or may have a smaller size than the motherboard 130. The first bonding layer 142 may include an electrically conductive bonding material, and may include one of an anisotropic conductive film (ACF), anisotropic conductive pastes (ACP), self-assembly pastes (SAP/epoxy+Sn-Bi), eutectic, AuSn, AgSn, In, and solder pastes, without being limited thereto. The first bonding layer 142 may be formed of any material having both electrical conductivity and bonding properties.

The anisotropic conductive film includes an adhesive organic material having insulating properties, and conductive particles for electrical connection uniformly distributed therein. Accordingly, the anisotropic conductive film is a bonding material that exhibits conductivity in a pressure application direction, and insulating properties in a plane direction when the anisotropic conductive film is pressed to bond two materials in one direction.

The multiple light emitting modules 110 may be coupled to the motherboard 130 via the first bonding layer 142 disposed on the motherboard 130. The multiple light emitting modules 110 may be coupled to the motherboard 130 such that adjacent light emitting modules 110 regularly adjoin each other at one side thereof on the motherboard 130. As such, the lower signal line terminals 113b of the adjacent light emitting modules 110 may be disposed on the board signal line terminals 132a formed on the motherboard 130, respectively, to be electrically connected thereto through the first bonding layer 142. More particularly, as shown in FIG. 8, through the first bonding layer 142, the lower signal line terminals 113b of one light emitting module 110 may be electrically connected to the board signal line terminals 132a of the motherboard 130, and the lower signal line terminals 113b of another light emitting module 110 adjacent thereto may be electrically connected to the board signal line terminals 132a of the motherboard 130, thereby allowing electrical connection between the lower signal line terminals 113b of the adjacent light emitting modules 110.

As such, as shown in FIG. 7, the light emitting modules 110 may be disposed on the motherboard 130, and the lower signal line terminals 113b and the lower common line terminals 115b disposed on the lower surfaces of the light emitting modules 110 respectively adjoin the board signal line terminals 132a and the board common line terminals 134a of the motherboard 130 and be electrically connected thereto.

In this manner, as the multiple light emitting modules 110 are disposed adjacent to one another on the motherboard 130, the multiple light emitting modules 110 may be electrically connected to one another using the motherboard 130 having a similar size to the display device 100 in manufacture of a large display device 100, thereby allowing the multiple light emitting modules 110 to be driven at the same time.

Figure 9:
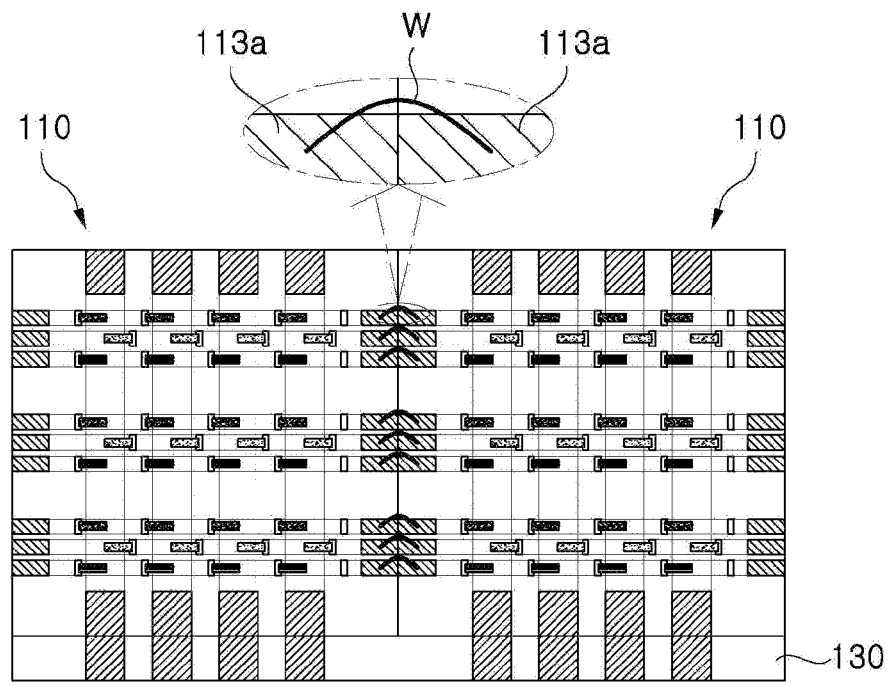
FIG. 9 is a view illustrating connection between light emitting modules of a display device according to a second exemplary embodiment.

FIG. 9 is a view illustrating connection between light emitting modules of a display device according to a second exemplary embodiment.

Unlike the display device according to the first exemplary embodiment, the display device according to the illustrated exemplary embodiment includes multiple upper signal line terminals 113a on upper surfaces of the light emitting modules 110. Although the multiple signal lines 113 and the multiple common lines 115 are exemplarily illustrated as being exposed on the upper surfaces of the light emitting modules 110, the inventive concepts are not limited thereto.

Referring to FIG. 9, electrical connection between adjacent light emitting modules 110 during manufacture of the display device 100 according to an exemplary embodiment will be described. As shown in the drawings, two or more light emitting modules 110 are disposed adjacent to each other, and the upper signal line terminals 113a of adjacent light emitting modules 110 may be electrically connected to each other by wires W.

In this case, all of the upper signal line terminals 113a of each of the light emitting modules 110 adjoining each other may be electrically connected to one another by the wires W. In addition, all of the upper common line terminals 115a of each of the light emitting modules 110 adjoining each other may be electrically connected to one another by the wires W. As such, adjacent light emitting modules 110 are electrically connected, thereby allowing electrical connection between the multiple light emitting modules 110 without using a separate connector.

Unlike the first exemplary embodiment, the motherboard 130 according to the illustrated exemplary embodiment serves to support the multiple light emitting modules 110, and may not be formed with the multiple board signal line terminals 132a or the multiple board common line terminals 134a. In addition, the lower signal line terminals 113b or the lower common line terminals 115b may not be formed on the lower surface of each of the light emitting modules 110.

According to the illustrated exemplary embodiment, the multiple light emitting modules 110 may be coupled to the upper surface of the motherboard 130 by a non-electrically conductive bonding layer.

Figure 10:
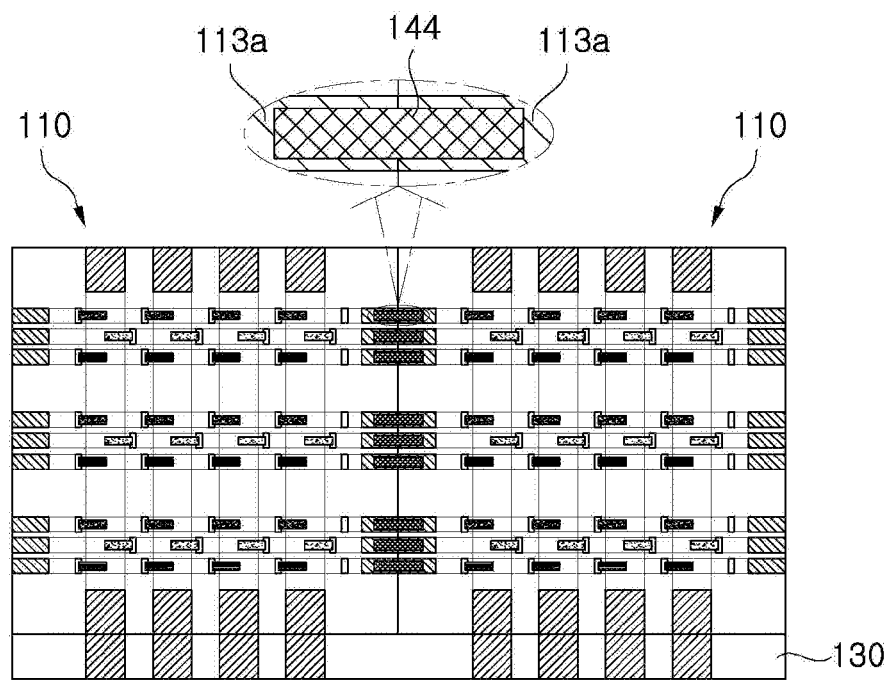
FIG. 10 is a view illustrating connection between light emitting modules of a display device according to a third exemplary embodiment.

FIG. 10 is a view illustrating connection between light emitting modules of a display device according to a third exemplary embodiment.

Referring to FIG. 10, electrical connection between adjacent light emitting modules 110 during manufacture of the display device 100 according to an exemplary embodiment will be described. As shown in the drawings, two or more light emitting modules 110 are disposed adjacent to each other, and the upper signal line terminals 113a of adjacent light emitting modules 110 may be electrically connected to each other by a second bonding layer 144. As in the second exemplary embodiment, the light emitting module 110 according to the illustrated exemplary embodiment includes multiple upper signal line terminals 113a formed on the upper surface thereof.

The second bonding layer 144 may include one of an anisotropic conductive film (ACF), anisotropic conductive pastes (ACP), self-assembly pastes (SAP/epoxy+Sn-Bi), eutectic, AuSn, AgSn, and In, and may be formed of solder pastes. The second bonding layer 144 may be formed to cover the upper signal line terminals 113a of the adjacent light emitting modules 110 adjoining each other by connecting upper surfaces of the upper signal line terminals 113a to each other, as shown in FIG. 10. In this manner, the upper signal line terminals 113a of the adjacent light emitting modules 110 may be electrically connected to each other by the second bonding layer 144 having electrical conductivity, thereby improving connection between the light emitting modules 110.

In addition, according to the illustrated exemplary embodiment, all of the upper signal line terminals 113a of all of the light emitting modules 110 adjoining each other may be electrically connected to one another by the second bonding layer 144. In addition, all of the upper common line terminals 115a of all of the light emitting modules 110 adjoining each other may be electrically connected to one another by the second bonding layer 144. As such, the adjacent light emitting modules 110 are electrically connected to each other, thereby enabling electrical connection between the multiple light emitting modules 110.

Further, as in the second exemplary embodiment, the motherboard 130 according to the third exemplary embodiment may serve only to support the multiple light emitting modules 110, and the lower signal line terminals 113b or the lower common line terminals 115b may not be formed on the lower surface of each of the light emitting modules 110. In addition, coupling between the motherboard 130 and the multiple light emitting modules 110 may be achieved using a non-electrically conductive bonding layer.

Figure 11:
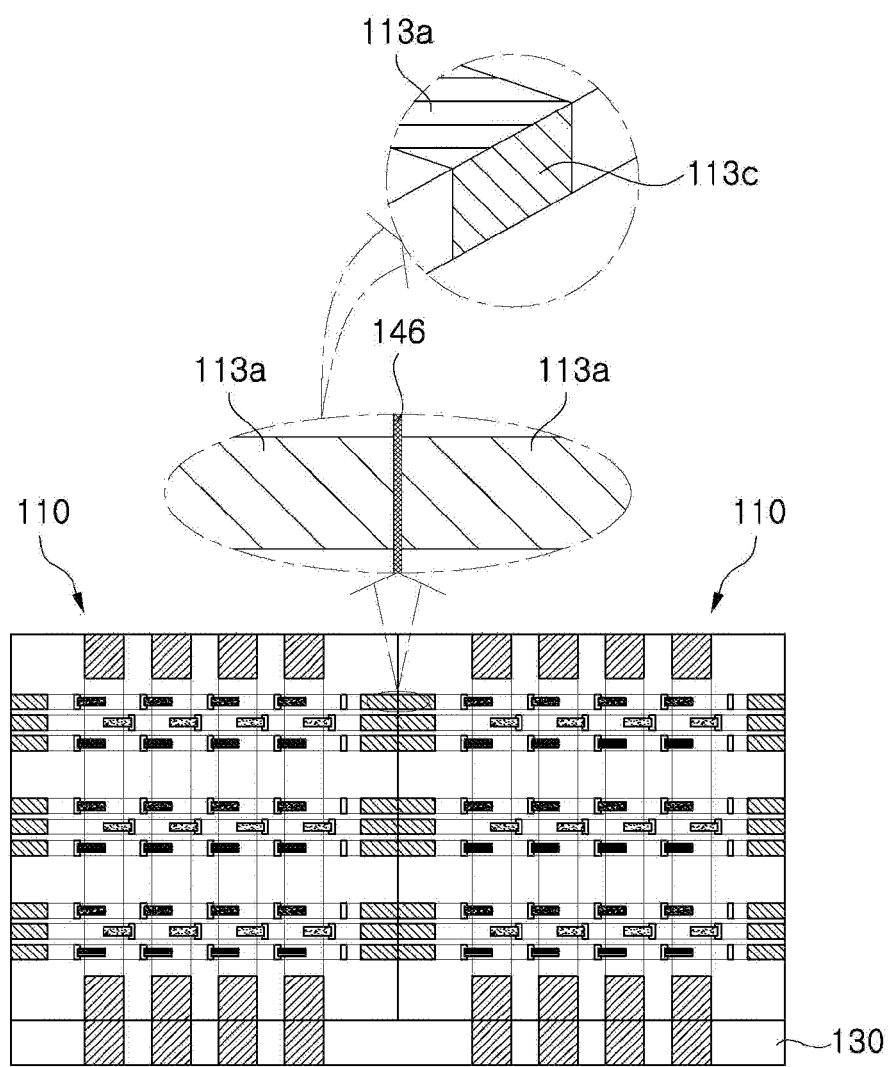
FIG. 11 is a view illustrating connection between light emitting modules of a display device according to a fourth exemplary embodiment.

FIG. 11 is a view illustrating connection between light emitting modules of a display device according to a fourth exemplary embodiment.

Referring to FIG. 11, electrical connection between adjacent light emitting modules 110 during manufacture of the display device 100 according to an exemplary embodiment will be described. As shown in the drawings, two or more light emitting modules 110 are disposed adjacent to each other, and the upper signal line terminals 113a of adjacent light emitting modules 110 may be electrically connected to each other by a third bonding layer 146 having electrical conductivity and interposed between the adjacent light emitting modules 110.

The third bonding layer 146 may include an anisotropic conductive film (ACF), anisotropic conductive pastes (ACP), self-assembly pastes (SAP/epoxy+Sn-Bi), eutectic, AuSn, AgSn, In, solder paste, and the like.

According to the illustrated exemplary embodiment, each of the light emitting modules 110 may be formed with grooves or via-holes at locations corresponding to the lower signal line terminals 113b, and the grooves or via-holes are filled with metal to form lateral signal line terminals 113c on a side surface of the light emitting module 110. In this manner, the lateral signal line terminals 113c are formed on the side surface of the light emitting module 110 to be electrically connected to the multiple lower signal line terminals 113b formed on the light emitting module 110. In addition, third common line terminals are formed on a side surface of the light emitting modules 110 to be electrically connected to the multiple upper common line terminals 115a formed on the light emitting module 110.

As such, the lateral signal line terminals 113c formed on the side surfaces of adjacent light emitting modules 110 may be disposed on the motherboard 130 while adjoining each other. In addition, the third bonding layer 146 having electrical conductivity is disposed between the adjacent light emitting modules 110 to couple the adjacent light emitting modules 110 to each other, while electrically connecting the lateral signal line terminals 113c adjoining each other to each other, and the third common line terminals adjoining each other to each other.

Although the light emitting module 110 according to the illustrated exemplary embodiment is exemplarily shown as including the multiple upper signal line terminals 113a on the upper surface thereof as in the second exemplary embodiment, the multiple upper signal line terminals may not be formed on the upper surface of the light emitting modules 110 as in the first exemplary embodiment.

Further, as in the second exemplary embodiment, the motherboard 130 according to the illustrated exemplary embodiment may serve only to support the multiple light emitting modules 110, and the lower signal line terminals 113b or the lower common line terminals 115b may not be formed on the lower surface of each of the light emitting modules 110. In addition, coupling between the motherboard 130 and the multiple light emitting modules 110 may be achieved using a non-electrically conductive bonding layer.

Figure 12:
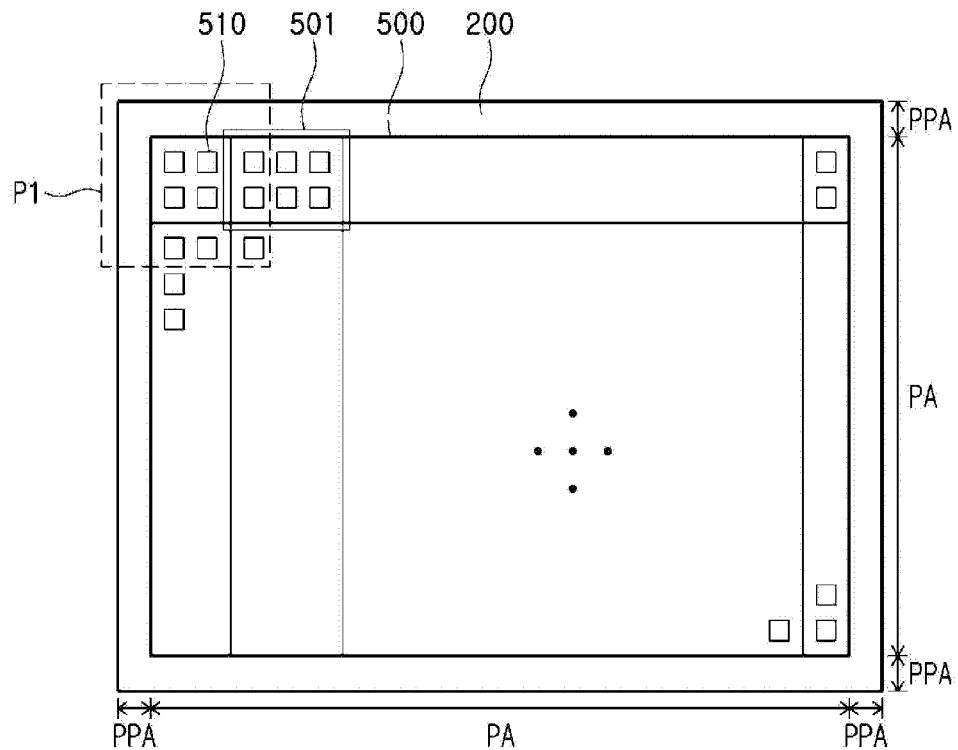
FIG. 12 is a plan view of a display device according to another exemplary embodiment.
Figure 13:
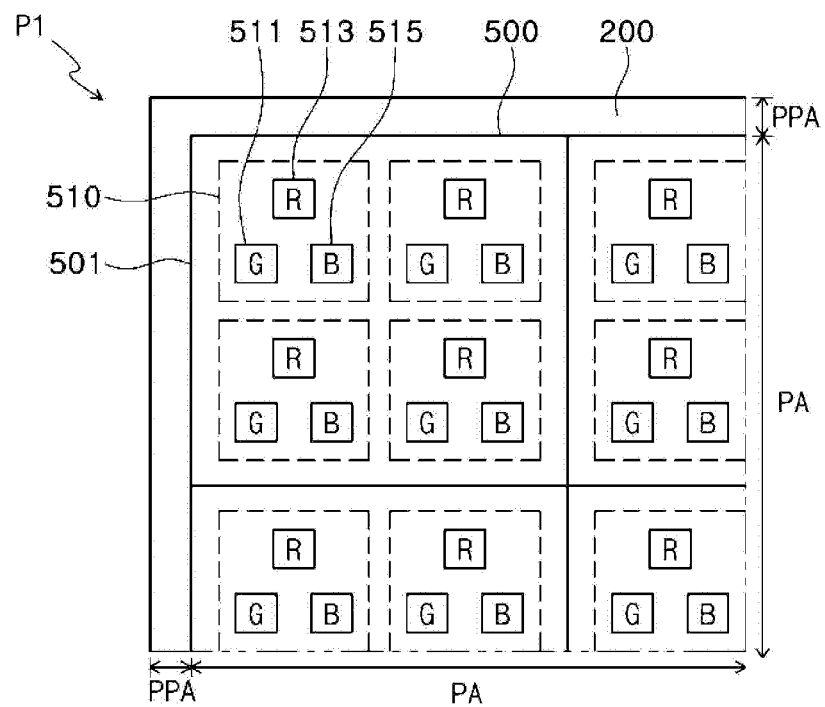
FIG. 13 is an enlarged plan view of portion P1 of FIG. 12.

FIG. 12 is a plan view of a display device according to another exemplary embodiment, and FIG. 13 is an enlarged plan view of portion P1 of FIG. 12.

Referring to FIG. 12 and FIG. 13, the display device according to the illustrated exemplary embodiment displays certain visual data, for example, text, video, photographs, two or three-dimensional images, and the like. The display device includes a display region PA, in which the images are displayed, and a peripheral region PPA disposed in at least one side of the display region PA. For example, the peripheral region PPA may be defined only at one side of the display region PA, or may be defined to surround the display region PA. In the display region PA, multiple pixels 510 are disposed to display an image.

The display device includes a display unit 500 and a printed circuit board 200 adapted to drive the display unit 500. The display unit 500 is disposed in the display region PA and the printed circuit board 200 is disposed in a region excluding the display unit 500, that is, in the peripheral region PPA or on the backside of the display unit 500.

The display unit 500 may have a shape corresponding to the shape of the display device. For example, as in the display device, the display unit 500 may be provided in various shapes, for example, a closed polygonal shape including linear sides, such as a rectangular shape, a circular shape, an elliptical shape, a semicircular or semi-elliptical shape including a linear side and a curved side, and the like. In the illustrated exemplary embodiment, the display unit 500 has a rectangular shape.

The display region PA may be divided into multiple regions, each of which is provided with pixel units 501. More particularly, the display unit 500 includes multiple pixel units 501. Each of the pixel units 501 is provided with at least one pixel 510 to display an image.

The pixel units 501 may have various shapes in plan view. In one exemplary embodiment, the pixel units 501 may have a rectangular shape, without being limited thereto. Alternatively, the pixel units may have a triangular shape, a pentagonal shape, and other shapes.

The pixel units 501 may have the same area or different areas. In the illustrated exemplary embodiment, the pixel units 501 have the same areas, but are not limited thereto. Alternatively, some of the pixel units 501 may have the same area and the other pixel units 501 may have different areas.

Each of the pixel units 501 may have a different number of pixels 510. For example, as shown in FIG. 12 and FIG. 13, one pixel unit 501 may include 2×2, that is, 4 pixels, and another pixel unit 501 may include 2×3, that is, 6 pixels. The number of pixels 510 of the pixel units 501 may be changed in various ways in consideration of the areas, shapes, and resolution of the pixel units 501.

The pixel units 501 are disposed in the display region PA to form the display unit 500. The pixel units 501 may be combined in a patch work shape to display overall images.

Each of the pixels 510 in each pixel unit 501 may be the minimum unit for displaying an image. Each of the pixels 510 may emit white light and/or a color of light. Each of the pixels 510 may include a single pixel emitting one color, or may include multiple sub-pixels to emit white light and/or a color of light through combination of different colors. In an exemplary embodiment, each of the pixels may include a red sub-pixel R, a green sub-pixel G, and a blue sub-pixel B. However, the inventive concepts are not limited thereto. For example, in some exemplary embodiments, each of the pixels 510 may include a cyan sub-pixel, a magenta sub-pixel, and a yellow sub-pixel. Hereinafter, the pixel 510 will exemplarily be described as including the red sub-pixel R, the green sub-pixel G, and the blue sub-pixel B.

In the display unit 500 including the pixel units 501, the pixels 510 and/or the sub-pixels included in each of the pixel units 501 are arranged in a matrix in the display region PA. As used herein, the expression "the pixels 510 and/or the sub-pixels are arranged in a matrix" may refer that the pixels and/or the sub-pixels are arranged accurately in lines along rows or columns, as well as that the pixels and/or the sub-pixels are generally arranged along the rows or the columns without being limited to particular locations thereof.

Figure 14:
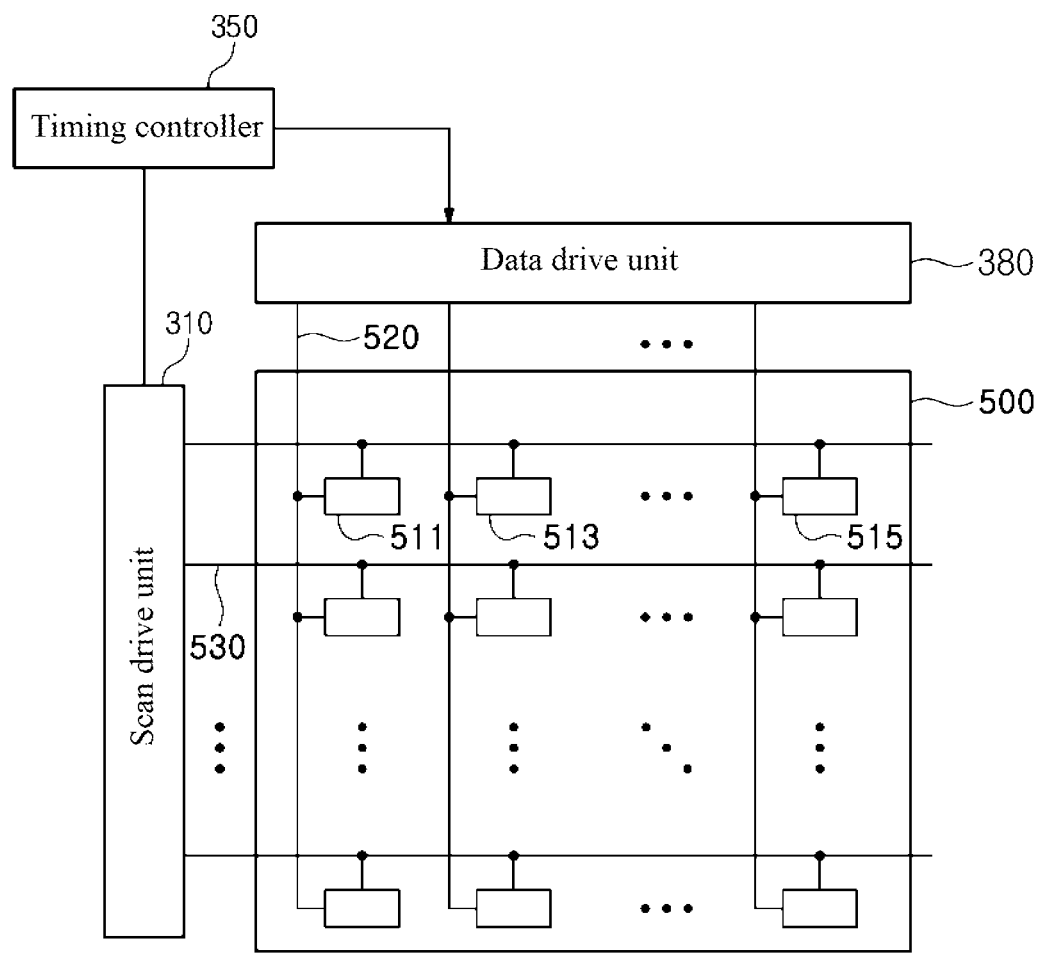
FIG. 14 is a structural view of a display device according to an exemplary embodiment.

FIG. 14 is a structural view of a display device according to an exemplary embodiment.

Referring to FIG. 14, the display device according to the illustrated exemplary embodiment includes a timing controller 350, a scan drive unit 310, a data drive unit 380, an interconnection part, and pixels. When each of the pixels includes multiple sub-pixels 511, 513, 515, each of the sub-pixels 511, 513, 515 is individually connected to the scan drive unit 310 and the data drive unit 380 through the interconnection part.

The timing controller 350 receives various control signals for driving the display unit 500 and image data from an external system, such as a system transmitting image data. Upon reception of the image data, the timing controller 350 rearranges the image data and transmits the rearranged image data to the data drive unit 380. In addition, the timing controller 350 generates scan control signals and data control signals for driving the scan drive unit 310 and the data drive unit 380, and transmits the scan control signals and the data control signals to the scan drive unit 310 and the data drive unit 380, respectively.

The scan drive unit 310 receives the scan control signals from the timing controller 350 and generates scan signals in response to the scan control signals.

The data drive unit 380 receives the data control signals and the image data from the timing controller 350 and generates data signals in response to the data control signals and the image data.

The interconnection part includes multiple signal interconnects. More specifically, the interconnection part includes first interconnects 530, which connect the scan drive unit 310 to the sub-pixels 511, 513, 515, and second interconnects 520, which connect the data drive unit 380 to the sub-pixels 511, 513, 515. In the illustrated exemplary embodiment, the first interconnects 530 may be scan interconnects and the second interconnects 520 may be data interconnects. As such, hereinafter, the first interconnects 530 will be referred to as the scan interconnects and the second interconnects 520 will be referred to as the data interconnects. The interconnection part further includes interconnects that connect the timing controller 350 to the scan drive unit 310, and connect the timing controller 350 to the data drive unit 380, or other components to deliver corresponding signals.

The scan interconnects 530 supply the scanning signals generated by the scan drive unit 310 to the sub-pixels 511, 513, 515. The data signals generated by the data drive unit 380 are output through the data interconnects 520. The data signals output through the data interconnects 520 are input to the sub-pixels 511, 513, 515 in a horizontal pixel line selected by the scan signals.

The sub-pixels 511, 513, 515 are connected to the scan interconnects 530 and the data interconnects 520. The sub-pixels 511, 513, 515 selectively emit light in response to the data signals input through the data interconnects 520 when the scan signals are supplied through the scan interconnects 530. For example, each of the sub-pixels 511, 513, 515 emits light with brightness corresponding to the received data signals during each frame duration. Upon reception of data signals corresponding to black brightness, the sub-pixels 511, 513, 515 display a black color through non-emission of light during the corresponding frame duration.

According to another exemplary embodiment, upon active type driving of the display unit 500, the display unit 500 may be driven by first and second pixel power sources in addition to the scan signals and the data signals, which will be described in more detail below.

According to exemplary embodiments, the pixels may be driven in a passive type driving method or an active type driving method.

Figure 15A:
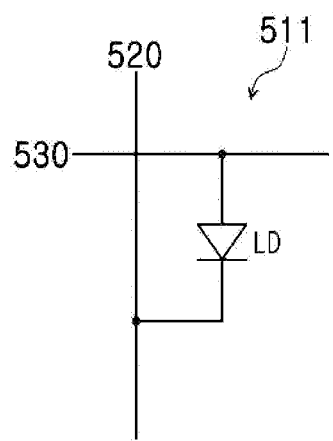
FIG. 15A is a circuit diagram of a pixel forming a passive type display device.

FIG. 15A is a circuit diagram of a pixel forming a passive type display device. Here, the pixel may be one of sub-pixels, for example, one of a red sub-pixel, a green sub-pixel, and a blue sub-pixel. In the illustrated exemplary embodiment, the pixel will exemplarily be described with reference to a first sub-pixel 511.

Referring to FIG. 15A, the first sub-pixel 511 includes a light emitting device LD connected between the scan interconnect 530 and the data interconnect 520. The light emitting device LD may be a light emitting diode including first and second terminals. The first and second terminals are connected to a first electrode (for example, anode) and a second electrode (for example, cathode) of the light emitting device, respectively. The first terminal may be connected to the scan interconnect 530 and the second terminal may be connected to the data interconnect 520, or vice versa.

When a voltage greater than or equal to a threshold voltage is applied between the first electrode and the second electrode, the light emitting device LD emits light with brightness corresponding to the voltage. More particularly, light emission of the first sub-pixel 511 may be controlled by regulating voltage of scan signals applied to the scan interconnect 530 and/or voltage of data signals applied to the data interconnect 520.

Although one light emitting device LD is illustrated as being connected between the scan interconnect 530 and the data interconnect 520 in FIG. 15A, the inventive concepts are not limited thereto. For example, in some exemplary embodiments, multiple light emitting devices LD may be connected in series or in parallel to each other between the scan interconnect 530 and the data interconnect 520.

Figure 15B:
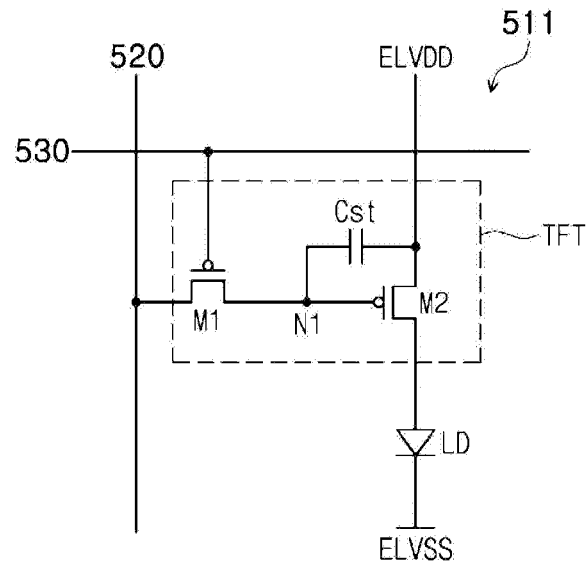
FIG. 15B is a circuit diagram of a pixel forming an active type display device.

FIG. 15B is a circuit diagram of the first sub-pixel 511 forming an active type display device. For the active type display device, the first sub-pixel 511 may be driven by first and second pixel power sources ELVDD, ELVSS in addition to the scan signal and the data signal.

Referring to FIG. 15B, the first sub-pixel 511 includes at least one light emitting device LD and a transistor unit connected thereto.

The first electrode of the light emitting device LD is connected to the first pixel power source ELVDD through the transistor unit, and the second electrode is connected to the second pixel power source ELVSS therethrough. The first pixel power source ELVDD and the second pixel power source ELVSS may have different potentials. For example, the second pixel power source ELVSS may have a lower potential than the first pixel power source ELVDD by a threshold voltage or more of the light emitting device. Each of the light emitting devices emits light with brightness corresponding to drive current controlled by the transistor unit.

According to an exemplary embodiment, the transistor unit includes first and second transistors T1, T2 and a storage capacitor Cst. The structure of the transistor unit is not limited to that shown in FIG. 15B.

A source of the first transistor T1 (switching transistor) is connected to the data interconnect 520 and a drain of the first transistor T1 is connected to a first node N1. In addition, a gate of the first transistor T1 is connected to the scan interconnect 530. In this manner, the first transistor T1 is turned on to electrically connect the data interconnect 520 to the first node N1 when a scan signal of a voltage allowing the first transistor T1 to be turned on is supplied through the scan interconnect 530. Here, a data signal of the corresponding frame is supplied to the first node N1 through the data interconnect 520. The storage capacitor Cst is charged by the data signal supplied to the first node N1.

A source of the second transistor T2 (drive transistor) is connected to the first pixel power source ELVDD and a drain of the second transistor T2 is connected to the first electrode of the light emitting device. In addition, a gate of the second transistor T2 is connected to the first node N1. In this manner, the second transistor T2 controls the quantity of drive current to be supplied to the light emitting device corresponding to the voltage of the first node N1.

One electrode of the storage capacitor Cst is connected to the first pixel power source ELVDD and the other electrode of the storage capacitor is connected to the first node N1. The storage capacitor Cst is charged with a voltage corresponding to the data signal supplied to the first node N1 and maintains the charged voltage until a data signal of another frame is supplied.

FIG. 15B exemplarily shows the transistor unit including two transistors. However, the inventive concepts are not limited thereto, and the structure of the transistor unit may be modified in various ways.

As described above, the display device according to an exemplary embodiment may be driven in an active type or a passive type. Hereinafter, the display device will exemplarily be described as being driven in a passive type.

Figure 16A:
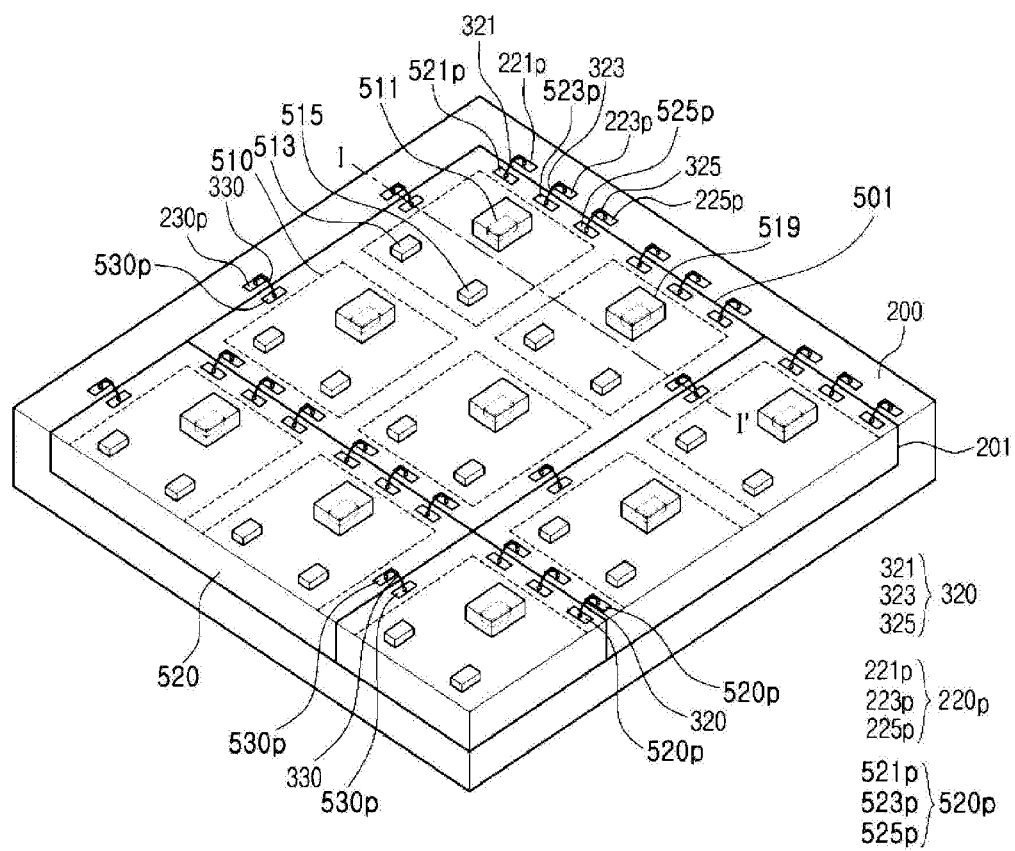
FIG. 16A is a perspective view of a display device according to yet another exemplary embodiment.
Figure 16B:
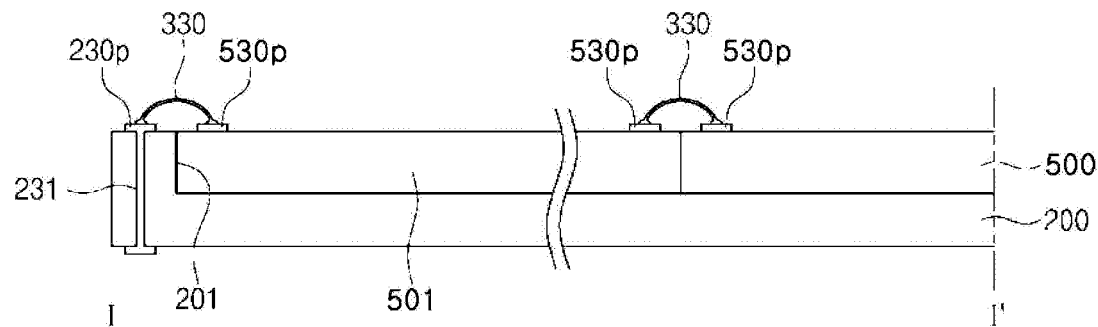
FIG. 16B is a cross-sectional view taken along line I-I' of FIG. 16A.

FIG. 16A is a perspective view of a display device according to yet another exemplary embodiment, and FIG. 16B is a cross-sectional view taken along line I-I' of FIG. 16A. A part of the display device shown in FIG. 16A corresponds to portion P1 of FIG. 12 and FIG. 13. For convenience of description, some components of the display device are not shown in FIG. 16A.

Referring to FIG. 16A and FIG. 16B, the display device according to the illustrated exemplary embodiment includes a display unit 500 and a printed circuit board 200 around the display unit 500.

The display unit 500 includes multiple pixel units 501. The pixel units 501 are separated from each other, and are arranged on the printed circuit board 200.

Each of the pixel units 501 is provided with at least one pixel 510, and each pixel 510 includes first to third sub-pixels. The first to third sub-pixels may be implemented by first to third light emitting devices 511, 513, 515 emitting light having different wavelengths. For example, the first to third light emitting devices 511, 513, 515 may be implemented by green, red, and blue light emitting diodes. However, for implementation of green light, red light and/or blue light, it is not necessary for the first to third sub-pixels to employ the green, red, and blue light emitting diodes, and the first to third sub-pixels may employ other light emitting diodes. For example, for implementation of red light, a blue or UV light emitting diode may be employed together with phosphors capable of emitting red light after absorption of blue or UV light, instead of the red light emitting diode. Likewise, for implementation of green light, the blue or UV light emitting diode may be employed together with phosphors capable of emitting green light after absorption of blue or UV light, instead of the green light emitting diode.

In the illustrated exemplary embodiment, the first sub-pixel is a green sub-pixel, the second sub-pixel is a red sub-pixel, and the third sub-pixel is a blue sub-pixel, and the first to third sub-pixels may be implemented by adopting the green, blue, and blue light emitting diodes as the first to third light emitting devices 511, 513, 515, respectively. According to another exemplary embodiment, for emission of red light, the blue light emitting diode may be used as the second light emitting device 513 together with phosphors 519 that emit red light after absorption of blue or UV light.

The printed circuit board 200 is provided with circuits including a timing controller, a scan driving unit, and a data drive unit to drive the display unit 500. The printed circuit board 200 is further provided with connection interconnects for connection between interconnects of the pixel units 501 in addition to the circuits mentioned above.

The printed circuit board 200 may be a double-sided printed circuit board 200 having interconnects on both surfaces thereof, in which the connection interconnects may include connection pads 230p disposed on an upper surface of the printed circuit board 200 and through-interconnects 231 formed through the printed circuit board 200 from the upper surface to a lower surface thereof. The circuits and the like may be disposed on the lower surface of the printed circuit board 200, and the interconnects of the display unit may be connected to the interconnects and the circuits on the lower surface of the printed circuit board 200 through the through-interconnects 231.

In the illustrated exemplary embodiment, the printed circuit board 200 is implemented by a plate-shaped board having a seating groove 201, into which the display unit 500 is inserted. The seating groove 201 may be provided in the form of a groove depressed from the upper surface of the printed circuit board 200. The printed circuit board 200 may have a larger area than the display unit 500, and the seating groove 201 may be disposed inside the printed circuit board 200 in plan view. The display unit 500 is inserted into the seating groove 201 of the printed circuit board 200 and overlaps the printed circuit board 200.

Connecting portions 320, 330 are disposed between adjacent pixel units 501, and between the adjacent pixel units 501 and the printed circuit board 200, to electrically connect the interconnects between the adjacent pixel units 501 to each other, and to electrically connect the interconnects between the adjacent pixel units 501 and the printed circuit board 200 to each other.

The connecting portions 320, 330 include a scan interconnect connecting portion adapted to connect the scan interconnects 530 between the adjacent pixel units 501, and between the adjacent pixel units 501 and the printed circuit board 200, and a data interconnect connecting portion 320 adapted to connect the data interconnects 520 between the adjacent pixel units 501, and between the adjacent pixel units 501 and the printed circuit board 200.

To this end, pads are provided to the pixel units 501 and the printed circuit board 200 to be connected to the connecting portions 320, 330. According to the illustrated exemplary embodiment, the pixel units 501 include scan interconnect pads 530p for connection of the scan interconnects 530, and data interconnect pads 520p for connection of the data interconnects 520. The printed circuit board 200 also includes scan interconnect pads 230p for connection of the scan interconnects 530, and data interconnect pads 220p for connection of the data interconnects 520.

Accordingly, for the scan interconnects 530, the scan interconnect pads 530p, 230p facing each other between the adjacent pixel units 501 and between the adjacent pixel units 501 and the printed circuit board 200 are connected through the scan interconnect connecting portion 330. For the data interconnects 520, the data interconnect pads 520p, 220p facing each other between the adjacent pixel units 501 and between the adjacent pixel units 501 and the printed circuit board 200 are connected through the data interconnect connecting portion 320.

In some exemplary embodiments, the scan interconnect connecting portion 330 and the data interconnect connecting portion 320 are provided in the form of bonding wires. As shown in the drawings, the bonding wires are disposed between two adjacent pads, such that one of the bonding wires contacts one of the two pads and the other contacts the other pad.

Here, the upper surface of the printed circuit board 200 may be coplanar with an upper surface of the display unit 500. In this manner, connection of the connecting portions may be facilitated.

Figure 17A:
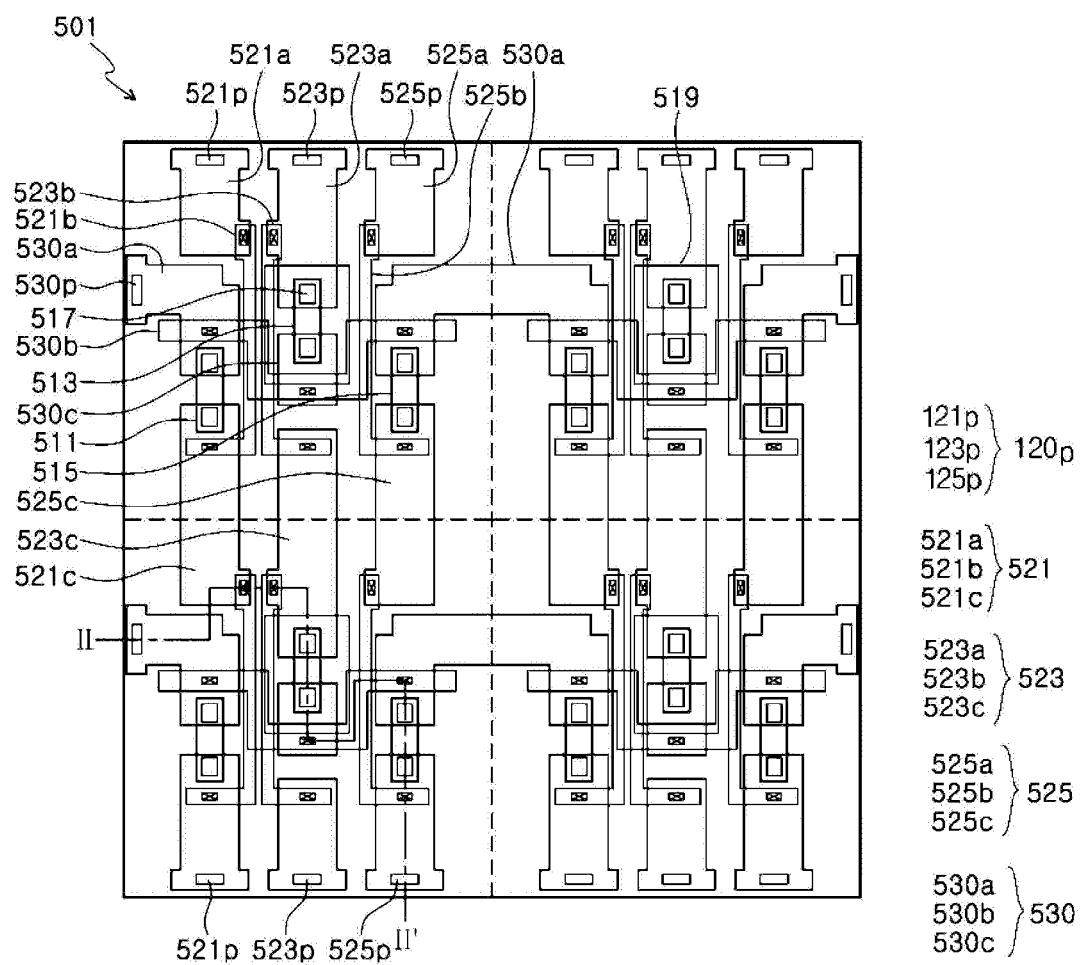
FIG. 17A is a plan view of a display device according to yet another exemplary embodiment.
Figure 17B:
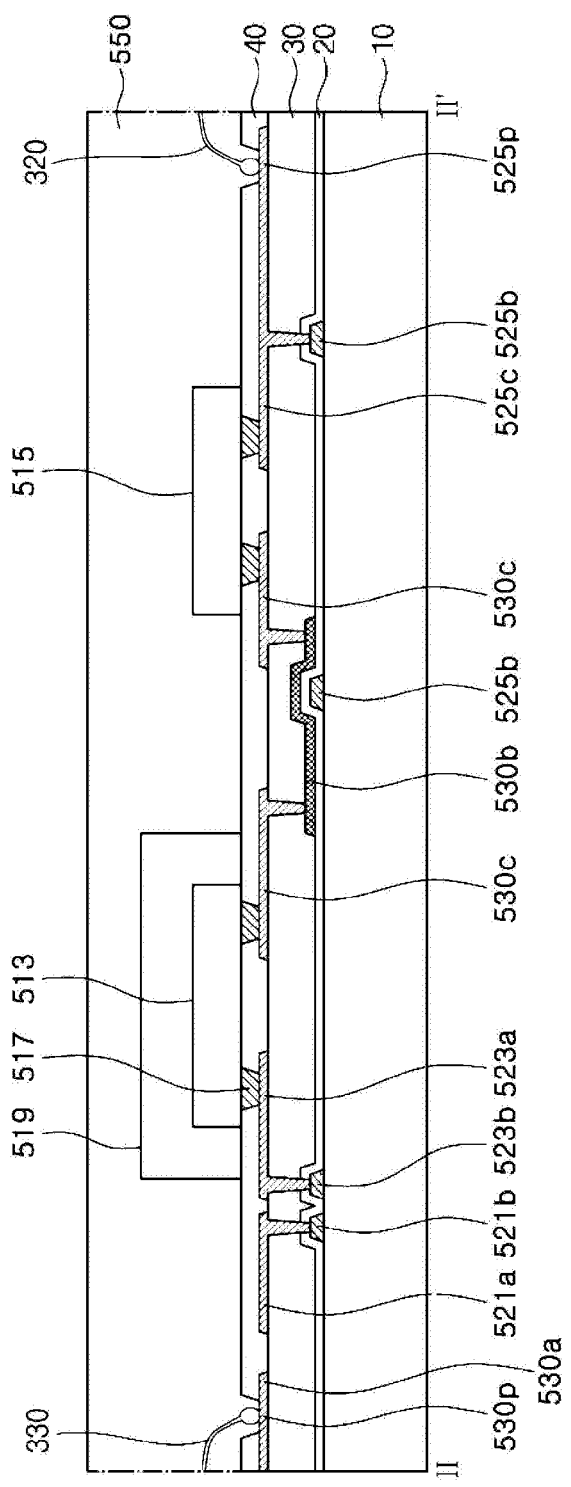
FIG. 17B is a cross-sectional view taken along line II-II' of FIG. 17A.

In some exemplary embodiments, the pixel units 501 may have various forms of pixels and interconnect structures. FIG. 17A is a plan view of a pixel unit 501 in the display device according to yet another exemplary embodiment, and FIG. 17B is a cross-sectional view taken along line II-II' of FIG. 17A. In the following description, connection between components in plan view will be first described, and then described in cross-sectional view with reference to FIG. 17A and FIG. 17B.

Referring to FIG. 17A and FIG. 17B, one pixel is provided with scan interconnects 530, data interconnects 520, and first to third light emitting devices 511, 513, 515.

In the illustrated exemplary embodiment, one pixel is provided with a scan interconnect 530 extending in a first direction (for example, a horizontal direction) and three data interconnects extending in a second direction (for example, a vertical direction). The three data interconnects correspond to the first to third light emitting devices 511, 513, 515, and will be referred to as first to third data interconnects 521, 523, 525, respectively.

The scan interconnect 530 include first to third sub-scan interconnects 530a, 530b, 530c. The scan interconnect 530 generally extends in the first direction and is provided with scan interconnect pads 530p at opposite ends of the pixel unit in the first direction thereof. Here, the scan interconnect pads 530p are not provided to each of the pixels, and are provided only to ends of the scan interconnect 530 adjacent to the periphery of the pixel unit 501. In particular, the scan interconnect pads 530p are not provided between adjacent pixels in the pixel unit 501.

The first data interconnect 521 include first to third sub-data interconnects 521a, 521b, 521c electrically connected to one another. The first data interconnect 521 generally extends in the second direction and is provided with first data interconnect pads 521p at opposite ends of the pixel unit 501 in the second direction thereof. Here, the first data interconnect pads 521p are not provided to each of the pixels and are provided only to ends of the first data interconnect 521 adjacent to the periphery of the pixel unit 501. In particular, the first data interconnect pads 521p are not provided between adjacent pixels in the pixel unit 501.

Likewise, the second data interconnect 523 include first to third sub-data interconnects 523a, 523b, 523c electrically connected to one another, and the third data interconnect 525 include first to third sub-data interconnects 525a, 525b, 525c electrically connected to one another. In addition, the second and third data interconnects 523, 525 generally extend in the second direction and are provided with second and third data interconnect pads 523p, 525p at the opposite ends of the pixel unit 501 in the second direction thereof, respectively.

The first light emitting device 511 is connected to the scan interconnect 530 and the first data interconnect 521, the second light emitting device 513 is connected to the scan interconnect 530 and the second data interconnect 523, and the third light emitting device 515 is connected to the scan interconnect 530 and the third data interconnect 525. The first to third light emitting devices 511, 513, 515 in the same row share the same scan interconnects 530.

More particularly, the scan interconnect 530 and the first data interconnect 521 are spaced apart from each other to face each other in plan view, and the first light emitting device 511 is disposed in a separation space therebetween. The first light emitting device 511 is disposed therein, such that one of the first and second terminals thereof overlaps the scan interconnect 530 and the other terminal of the first and second terminals overlaps the data interconnect 520. Likewise, the second light emitting device 513 is disposed in a separation space between the scan interconnect 530 and the second data interconnect 523 spaced apart from each other to face each other in plan view, and the third light emitting device 515 is disposed in a separation space between the scan interconnect 530 and the third data interconnect 525 spaced apart from each other to face each other in plan view.

Next, the pixel unit 501 will be described with reference to the cross-sectional view. Each of the pixel units 501 includes a base substrate 50. The base substrate 50 is provided to form the pixels on an upper surface thereof. The base substrate 50 is provided to each of the pixel units 501, and is separated from other base substrates for the pixel units 501.

The base substrate 50 may be formed of various insulating materials. For example, the base substrate 50 may be formed of glass, quartz, organic polymers, metal, and organic-inorganic composites. For the base substrate 50 formed of a conductive material, such as metal, an insulation layer is formed on the upper surface of the base substrate 50 to be used as an electrically insulating substrate. The base substrate 50 may be formed of a rigid material, without being limited thereto. Alternatively, the base substrate 50 may be formed of a flexible material. According to an exemplary embodiment, for a display device implemented by a bent or bendable display device, the base substrate 50 may be advantageously formed of a flexible material.

In one exemplary embodiment, a substrate formed of a material, such as glass, quartz, and metal, has higher heat resistance than an organic polymer substrate, and thus, has an advantage of enabling formation of various laminations thereon. A substrate formed of a transparent material, such as glass and quartz, is advantageous in manufacture of a front or rear light emissive display device. A substrate formed or an organic polymer or an organic-inorganic composite has relatively high flexibility, and may be advantageous in manufacture of a curved display device.

The second sub-data interconnects 521b, 523b, 525b are disposed on the base substrate 50. The second sub-data interconnects 521b, 523b, 525b may be formed of a conductive material, such as metals, metal oxides, and conductive polymers.

A first insulation layer 20 is formed on the second sub-data interconnects 521b, 523b, 525b. The first insulation layer 20 may be an organic insulation layer or an inorganic insulation layer. The insulation layer may include various kinds of organic polymers, and the inorganic insulation layer may include silicon nitride, silicon oxide, silicon oxynitride, and the like.

The second sub-scan interconnect 530b is disposed on the first insulation layer 20. The second sub-scan interconnect 530b may be formed of a conductive material, such as metal, metal oxides, conductive polymers, and the like.

A second insulation layer 30 is disposed on the second sub-scan interconnect 530b. The second insulation layer 30 may be an organic insulation layer or an inorganic insulation layer. The insulation layer may include various kinds of organic polymers, and the inorganic insulation layer may include silicon nitride, silicon oxide, silicon oxynitride, and the like.

The first and third sub-scan interconnects 530a, 530c and the first and third sub-data interconnects 521a, 523a, 525a, 521c, 523c, 525c are disposed on the second insulation layer 30.

The second insulation layer 30 is formed with contact holes that partially expose an upper surface of the second sub-scan interconnect 530b. The second sub-scan interconnect 530b is connected at one end thereof to the first sub-scan interconnect 530a and at the other end thereof to the third sub-scan interconnect 530c through the contact holes.

In addition, each of the first and second insulation layers 20, 30 is formed with contact holes that partially expose upper surfaces of the second sub-data interconnects 521b, 523b, 525b. The second sub-data interconnects 521b, 523b, 525b are connected at one end thereof to the first sub-data interconnects 521a, 523a, 525a and at the other end thereof to the third sub-data interconnects 521c, 523c, 525c through the contact holes.

A third insulation layer 40 is disposed on the first and third sub-scan interconnects 530a, 530c, the first sub-data interconnects 521a, 523a, 525a, and the third sub-data interconnects 521c, 523c, 525c. In an exemplary embodiment, the third insulation layer 40 may be a light blocking layer. The light blocking layer may prevent reflection or transmission of light emitted from the light emitting device, and may have a black color. The light blocking layer may be formed of a non-conductive insulation layer, for example, non-conductive carbon black or black organic polymers, such as black resist.

The third insulation layer 40 corresponds to a portion at which the scan interconnect 530 is spaced apart from the first to third data interconnects 521, 523, 525 to face one another in plan view, and is formed with through-holes that expose portions to which the first to third light emitting devices 511, 513, 515 are connected. Solders 516 may be disposed in the through-holes, such that the first to third light emitting devices 511, 513, 515 are connected to the scan interconnect 530 and the first to third data interconnects 521, 523, 525 through the solders 517.

In addition, the third insulation layer 40 is formed with through-holes that expose the scan interconnect pads 530p and the data interconnect pads 520p. The scan interconnect pads 530p and the data interconnect pads 520p exposed through the through-holes are connected to the upper surface of adjacent pixel units 501 or the adjacent printed circuit board 200 using the connecting portions 320, 330.

A phosphor 519 may be further disposed on the second light emitting device 513. The phosphor 519 absorbs light emitted from the second light emitting device 513 and emits light having a longer wavelength. As described above, according to the illustrated exemplary embodiment, the phosphor 519 may emit red light through absorption of blue light. The phosphor may be provided in the form of a mixture with a transparent or translucent binder, such as polydimethylsiloxane (PDMS), polyimide (PI), poly(methyl 2-methylpropenoate) (PMMA), ceramics, and the like.

Although not shown in the drawings, a color filter, for example, a red color filter, may be disposed on the phosphor 519. The color filter may improve purity of light by blocking blue or UV light that is not completely converted by the phosphor 519.

An encapsulation layer 550 is disposed on the first to third light emitting devices 511, 513, 515 and the phosphor 519. The encapsulation layer 550 covers the first to third light emitting devices 511, 513, 515, the phosphor 519, and the connecting portions of the scan interconnect pads 530p or the data interconnect pads 520p.

The encapsulation layer 550 may be formed of a transparent insulation material. The material for the encapsulation layer 550 may be an organic polymer material, more particularly, an epoxy resin, polysiloxane or photo solder-resist. For example, the polysiloxane may include polydimethylsiloxane (PDMS). Alternatively, the material for the encapsulation layer may include hydrogen silsesquioxane (HSSQ), methylsilsesquioxane (MSSQ), polyimide, divinyl siloxane bis-benzocyclobutane (DVS-BCS), perfluorocyclobutane (PFCB), and polyarylene ether (PAE), without being limited thereto.

As described above, although each of the pixel units may include the scan interconnect, the data interconnects, and the light emitting devices therein, the inventive concepts are not limited thereto, and the scan interconnect, the data interconnects, and the light emitting devices may be changed in various ways. For example, connection relationships or interlayer locations of the scan interconnects and/or the data interconnects, the stacked structure of the insulation layers, and the structure of the light emitting device may be different from those of the above described exemplary embodiments.

Figure 18:
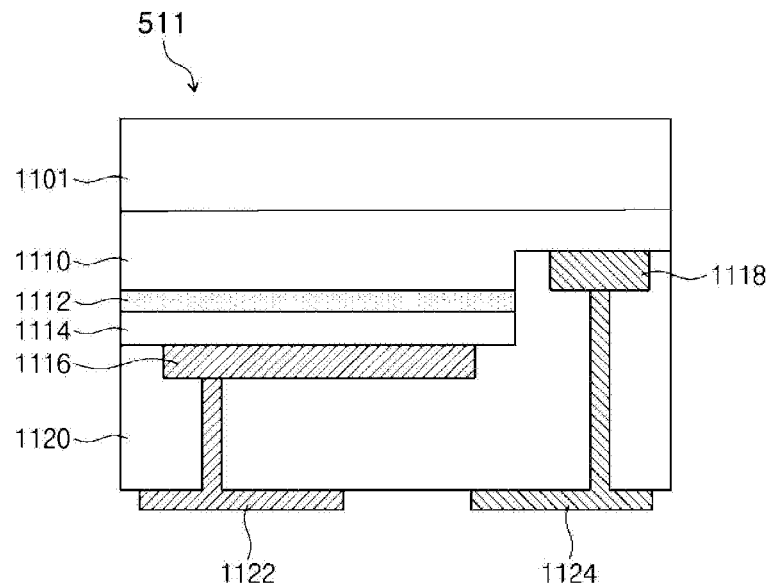
FIG. 18 is a cross-sectional view of a light emitting device according to an exemplary embodiment.

In an exemplary embodiment, the first to third light emitting devices 511, 513, 515 may be flip-chip type light emitting diodes, and FIG. 18 is a cross-sectional view of a light emitting device according to an exemplary embodiment. The light emitting device shown in FIG. 18 may be one of the first to third light emitting devices 511, 513, 515, and the following description will exemplarily be given with reference to the first light emitting device 511.

Referring to FIG. 18, the first light emitting device 511 includes a substrate 1101, a first conductivity type semiconductor layer 1110, an active layer 1112, a second conductivity type semiconductor layer 1114, a first contact layer 1116, a second contact layer 1118, an insulation layer 1120, a first terminal 1122, and a second terminal 1124.

The substrate 1101 is a growth substrate for growth of III-V based nitride semiconductor layers thereon, and may include, for example, a sapphire substrate, more particularly, a patterned sapphire substrate. The substrate may be an insulation substrate, without being limited thereto. The substrate 1101 may be removed by laser lift-off or polishing.

The first conductivity type semiconductor layer 1110, the active layer 1112, and the second conductivity type semiconductor layer 1114 are formed on the substrate 1101. The first conductivity type and the second conductivity type have opposite polarities. When the first conductivity type is n-type, the second conductivity type is p-type, and when the first conductivity type is p-type, the second conductivity type is n-type. In the illustrated exemplary embodiment, an n-type semiconductor layer, the active layer 1112, and a p-type semiconductor layer are sequentially stacked on the substrate 1101.

The n-type semiconductor layer 1110, the active layer 1112, and the p-type semiconductor layer 1114 may be formed of III-V based nitride semiconductors, for example, nitride semiconductors, such as (Al, Ga, In)N. The n-type semiconductor layer 1110, the active layer 1112, and the p-type semiconductor layer 1114 may be grown on the substrate 1101 in a chamber by a method well-known in the art, such as metal organic chemical vapor deposition (MOCVD). The n-type semiconductor layer 1110 includes n-type dopants, for example, Si, Ge, and Sn, and the p-type semiconductor layer 1114 includes p-type dopants, for example, Mg, Sr, and Ba. In an exemplary embodiment, the n-type semiconductor layer 1110 may include GaN or AlGaN including Si as dopants, and the p-type semiconductor layer 1114 may include GaN or AlGaN including Mg as dopants. Although each of the n-type semiconductor layer 1110 and the p-type semiconductor layer 1114 is illustrated as a single layer in the drawings, each of these semiconductor layers may be formed as multiple layers and may include a super-lattice layer. The active layer 1112 may include a single quantum well structure or a multi-quantum well structure, and the composition of the nitride semiconductor for the active layer 1112 may be adjusted to emit light in a desired wavelength band. For example, the active layer 1112 may emit blue or UV light.

The first contact layer 1116 is disposed in a region of the first conductivity type semiconductor layer 1110, in which the active layer 1112 and the second conductivity type semiconductor layer 1114 are not formed, and the second contact layer 1118 is disposed on the second conductivity type semiconductor layer 1114.

The first and/or second contact layer 1116, 1118 may be formed as a single or multiple metal layers. The first and/or second contact layer 1116, 1118 may include Al, Ti, Cr, Ni, Au, or alloys thereof.

The insulation layer 1120 is formed on the first and second contact layers 1116, 1118, and the first terminal 1122 and the second terminal 1124 are disposed on the insulation layer 1120 to be connected to the first contact layer 1116 and the second contact layer 1118 through the contact holes, respectively.

The first terminal 1122 may be connected to one of the scan interconnect and the data interconnect described above, and the second terminal 1124 may be connected to the other interconnect.

The first and/or second terminal(s) 1122, 1124 may be formed as a single or multiple metal layers. The first and/or second terminal(s) 1122, 1124 may include Al, Ti, Cr, Ni, Au, or alloys thereof.

Although the light emitting device according to the illustrated exemplary embodiment is briefly described above with reference to the drawing, the light emitting device may further include additional layers having other functions in addition to the layers described above. For example, the light emitting device may further include various layers, such as a reflective layer adapted to reflect light, an additional insulation layer adapted to insulate a certain component, an anti-solder diffusion layer adapted to prevent diffusion of solder, and the like.

Furthermore, in some exemplary embodiments, a mesa may be formed in various shapes and the locations or shapes of the first and second contact electrodes or the first and second terminals may be changed in various ways in formation of a flip-chip type light emitting device.

With the structure described above, the display device may be formed to have various shapes and various areas using multiple pixel units.

A typical display device is manufactured by forming individual light emitting device packages, mounting the light emitting device packages on a circuit board via solders to form light emitting modules, and connecting the light emitting modules to a drive circuit through connects. In this case, connection of the light emitting modules through the connectors requires use of structures, such as frames.

However, the display device according to exemplary embodiments can be manufactured simply by forming multiple pixel units on a circuit board and connecting the pixel units to the circuit board. In this case, since the pixel units are seated on the printed circuit board, the display device does not require a separate frame.

In particular, according to the exemplary embodiments, since the pixel unit may be formed to have various areas and various numbers of pixels, the display device can be easily manufactured by assembling the multiple pixel units in various sequences to correspond to the size and shape of a final display device. In addition, the pixel units may be disposed to have different resolutions corresponding to regions of the display device, thereby reducing manufacturing costs. Furthermore, even in use of a rigid base substrate, a display device having a generally curved shape can be manufactured through regulation of the size of the pixel units. Furthermore, in use of a flexible base substrate, a display device having a curved shape can be manufactured regardless of the size of the pixel units.

The display device according to the exemplary embodiments may be used as various kinds of display devices depending upon the sizes of individual pixels and pixel units, particularly as a large display device, such as a signboard.

The display device according to the exemplary embodiments includes multiple pixel units connected to one another, and allows easy repair when any one of the pixel units operates abnormally. For example, when there is a defective pixel unit in the display device, the defective pixel unit is removed from the display device and a separate pixel unit corresponding to the defective pixel unit is assembled to the display device, thereby resolving a problem of operation failure.

The display device according to the exemplary embodiments may be modified in various ways. For example, the display unit, the connecting portions, and the printed circuit board 200 may be modified in various shapes different from those of the above exemplary embodiments. FIG. 19A to FIG. 19E are cross-sectional views of the display device according to exemplary embodiments. FIG. 19A to FIG. 19E are cross-sectional view taken along line I-I' of FIG. 16A.

Figure 19A:
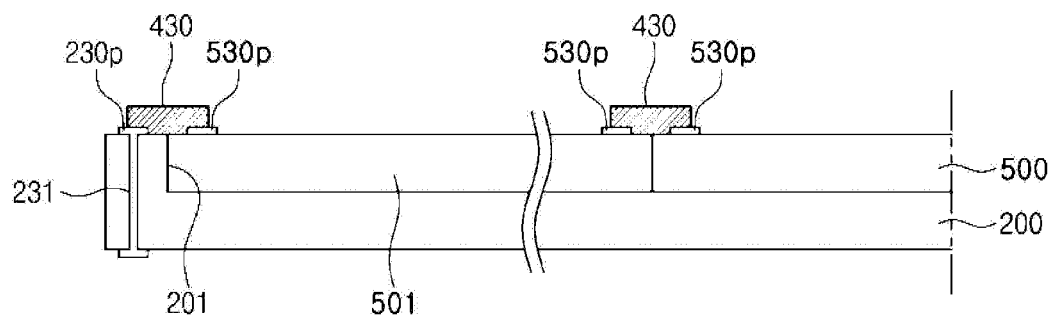
FIGS. 19A 19B, 19C, 19D, and 19E are cross-sectional views of a display device according to exemplary embodiments.

Referring to FIG. 16A and FIG. 19A, the connecting portions are provided in a different form instead of the bonding wire.

In the illustrated exemplary embodiment, a connecting portion 430 may be formed of a conductive resin or a conductive paste, such as solder pastes, silver pastes, and the like.

Figure 19B:
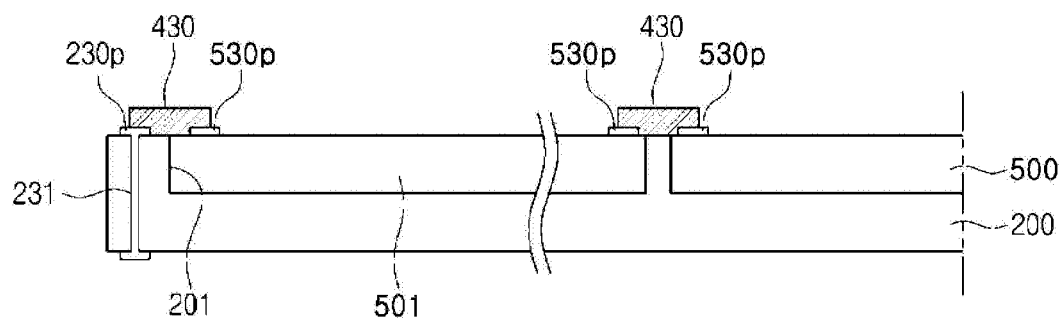

Referring to FIG. 19B, the seating groove 201 formed on the printed circuit board 200 to receive the pixel unit 501 therein may be provided in various numbers and shapes. Although the seating groove 201 is provided singularly corresponding to a display region, and the display units 501 are disposed in one seating groove 201 in the above described exemplary embodiment, the number of seating grooves 201 may be changed. According to the illustrated exemplary embodiment, the printed circuit board 200 on which the display unit is seated may include the seating grooves 201 corresponding to the respective pixel units 501. For the structure in which the multiple seating grooves 201 are provided corresponding to the display unit 500, it is possible to stably secure bonding strength between the display unit 500 and the printed circuit board 200.

Figure 19C:
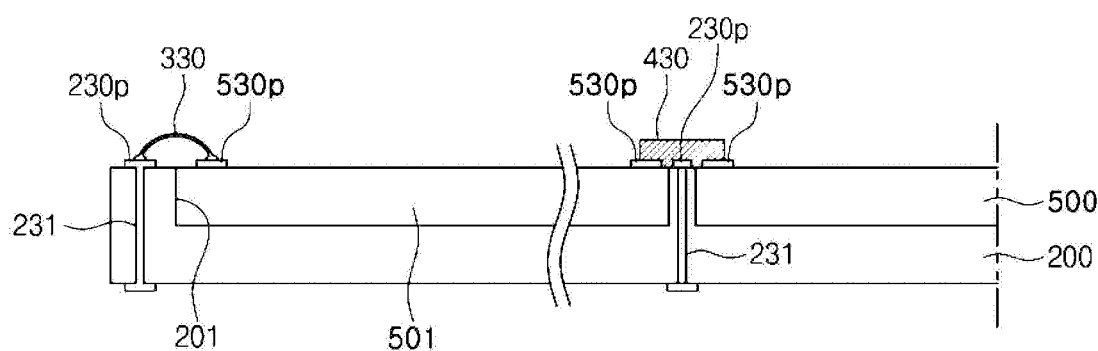

Referring to FIG. 19C, the printed circuit board 200 may further include additional pads 230p and through-interconnects 231 between the pixel unit 501 and the pixel unit 501 in addition to the pads 230p disposed along the outer periphery of the display device. Referring to FIG. 19C, the additional pads 230 may be formed between the two adjacent pixel unit 501 disposed on the printed circuit board 200, and may be electrically connected to the interconnection part on the lower surface of the printed circuit board 200 through the through-electrodes 231. In addition, the pads 530p of the two pixel units 501 may be electrically connected to each other through the connecting portion 430, such as a conductive paste. In this manner, the printed circuit board 200 is formed with multiple through-electrodes 231, and the pixel units 501 are electrically connected to the pads 530p therethrough, whereby concentration of the interconnects can be relieved in the peripheral region while reducing a delay of signals applied to the pixel units 501 or voltage drop, thereby realizing stable transfer of the signals.

Furthermore, according to some exemplary embodiments, the connecting portions may be implemented through combination in various ways, as needed. Referring to FIG. 19C, the connecting portion 330 between the printed circuit board 200 and the pixel unit 501 in the peripheral region may be implemented by a bonding wire, and the connecting portion 430 between the pixel unit 501 and the pixel unit 501 may be implemented by a conductive paste. In this manner, the connecting portions may be selected in consideration of the structure of a component or manufacturing complexity.

Figure 19D:
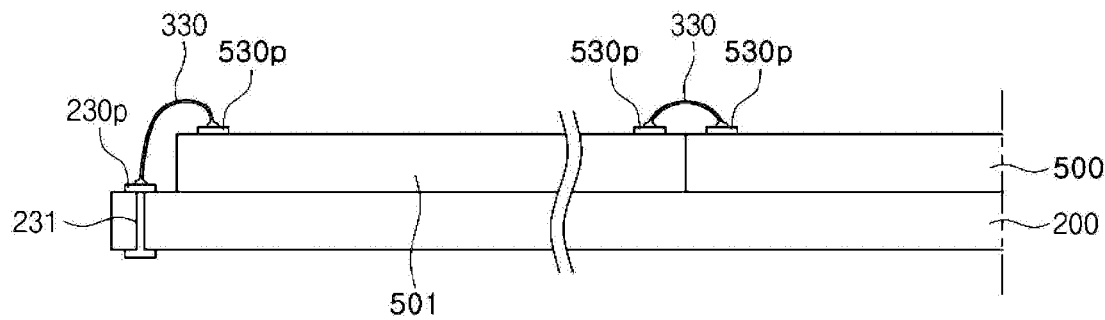

Referring to FIG. 19D, the printed circuit board 200 on which the pixel units 501 are mounted may be provided without having the seating grooves. In the illustrated exemplary embodiment, the printed circuit board 200 has a plate shape and the display unit 500 is disposed on the flat printed circuit board 200. In this case, the display unit 500 has a smaller area than the printed circuit board 200, and the pads 230 are disposed on the upper surface of the printed circuit board 200 where the display unit 500 does not overlap the printed circuit board 200. The connecting portion 330 may be implemented by a bonding wire, which may be connected at one end thereof to the pad 530p of the display unit 500 and at the other end thereof to the pad of the printed circuit board 200. In the illustrated exemplary embodiment, the process of forming a seating portion on the printed circuit board 200 is omitted, thereby simplifying manufacture of the display device.

Figure 19E:
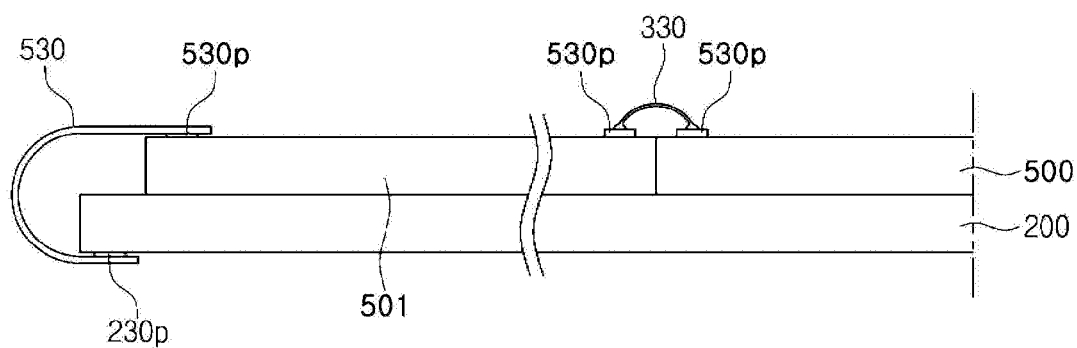

Referring to FIG. 19E, a connecting portion 530 adapted to connect the pixel unit 501 to the printed circuit board 200 may be implemented by a flexible circuit board (or tape carrier package) instead of the bonding wire or the conductive paste. In this case, the flexible circuit board may be connected at one end thereof to the pad 530p of the display unit 500 and at the other end thereof to a pad 230p formed on a front or lower surface of the printed circuit board 200. The flexible circuit board may be connected to the pad of the display unit 500 and/or the pad of the printed circuit board 200 via an anisotropic conductive film interposed therebetween or by connectors. The flexible circuit board may be provided with a circuit, such as a driver IC and the like, and can reduce the thickness or size of the printed circuit board 200.

In the above exemplary embodiments, the display unit 500 is disposed on the printed circuit board 200 to overlap the printed circuit board 200. However, the inventive concepts are not limited thereto. In a structure allowing the pixel units 501 of the display unit 500 to be stably secured, in which a separate support substrate may be further provided, as needed, the printed circuit board 200 can be minimized or omitted.

Figure 20:
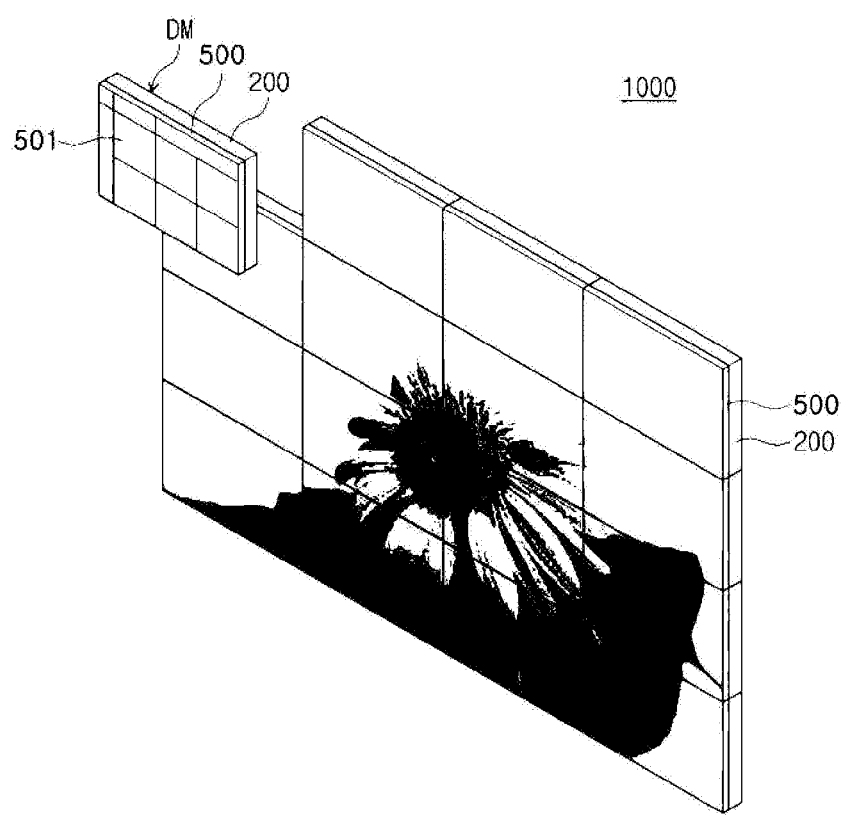
FIG. 20 is a perspective view of a display device according to yet another embodiment of the present disclosure.

Although a large display device can be implemented by the display device according to the above exemplary embodiments, it is possible to implement a display device having a larger area than atypical display device by assembling multiple display modules each implemented by the display device according to the exemplary embodiments. FIG. 20 is a perspective view of a large multi-module display device according to one embodiment of the present disclosure.

Referring to FIG. 20, the multi-module display device 1000 may include multiple display modules DM. In FIG. 20, 4×4 display modules DM may form one multi-module display device. The display modules DM may have at least one of the structures of the exemplary embodiments described above. For example, each of the display modules DM includes a display unit 500 and a printed circuit board 200, and may include multiple display units 501 having different areas, as in a display module MD shown in the first row and the first column of FIG. 20.

According to an exemplary embodiment, each or at least some of the multiple display modules DM may be independently driven. Alternatively, at least some display modules DM may be dependently driven in association with the other display modules DM. The multiple display modules DM are driven in association with one another, thereby displaying a single image thereon.

Although the multiple display modules DM are illustrated as having the same size in the illustrated exemplary embodiment, the inventive concepts are not limited thereto. Alternatively, at least one display module DM may have a different size than the other display modules DM. In addition, at least one display module DM may have a different number of pixels, and thus, have a different resolution than the other display modules DM. In addition, when there is no need for the same resolution in every region of the display device, the multi-module display device may be manufactured by arranging the display modules DM having different resolutions.

The display device having the above structure may be manufactured by the following method. FIG. 21A to FIG. 21E are cross-sectional views illustrating a method for manufacturing a display device according to an exemplary embodiment. Hereinafter, some components of the display device may not be shown for convenience of description.

First, referring to FIG. 21A, a base mother substrate 50m is prepared and an interconnection part including scan interconnects and data interconnects is formed on the base mother substrate 50m.

More particularly, the interconnection part used for multiple pixel units is formed on the base mother substrate 50m. In particular, the scan interconnects, the data interconnects, and the first to third insulation layers are formed on the base mother substrate 50m.

The base mother substrate 50m may have imaginary cutting lines IL, along which the base mother substrate 50m can be divided into multiple base substrates for the multiple pixel units, by cutting. When regions corresponding to the pixel units are referred to as pixel unit regions, the imaginary cutting lines IL are disposed along peripheries of the regions for the pixel units 501.

Upper surfaces of some scan interconnects and some data interconnects are exposed for electrical connection to light emitting devices, and upper surfaces of the other scan interconnects and the other data interconnects correspond to pads, and are exposed for electrical connection to adjacent pixel units and the printed circuit board. In FIG. 21A, SLP indicates a pad of the scan interconnects and the data interconnects, and SL indicates a portion to which a light emitting device will be provided.

In an exemplary embodiment, the scan interconnects, the data interconnects, and the first to third insulation layers can be easily formed by sputtering, deposition, coating, molding, photolithography, and the like. In particular, the scan interconnects and the data interconnects for multiple pixels and pixel units may be formed through a minimal process using a large base mother substrate 50m.

For an active type display device according to an exemplary embodiment, transistors may be formed together with the interconnection part. The interconnection part and the transistors can be easily formed on the base mother substrate 50m by sputtering, deposition, coating, molding, photolithography, and the like. In particular, when the base mother substrate 50m is formed of a heat resistant material, a high temperature process may be employed in formation of the interconnection part and the transistor. Further, when photolithography is used in the process of forming the scan interconnects, the data interconnects, and the first to third insulation layers 20, 30 40, it is possible to form the transistors and the interconnects having a small line width.

Figure 21B:
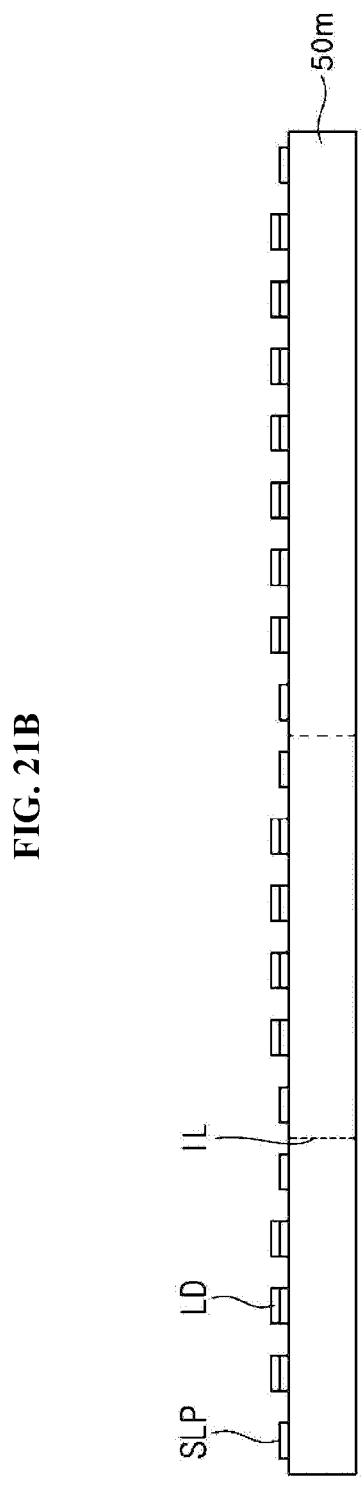

Referring to FIG. 21B, light emitting devices LD are formed on the base mother substrate 50m having the interconnection part thereon. The light emitting devices LD are not disposed on the pad SLP, and are disposed to contact the corresponding scan interconnects and the corresponding data interconnects. Although not shown in the drawings, solders may be provided to portions of the scan interconnects and the data interconnects to which the light emitting devices LD are attached.

The light emitting devices LD may be formed on the base mother substrate 50m by a transfer process. More particularly, the light emitting devices LD may be formed on a separate substrate and then transferred to the base mother substrate 50m. In this case, the same kind of light emitting device LD may be transferred to the base mother substrate 50m through a single process.

After transfer of the light emitting devices LD, a process of forming a phosphor and a color filter may be selectively performed before formation of an encapsulation layer. As described in the above exemplary embodiments, in implementation of a red pixel using a blue or UV light emitting device and a phosphor, the phosphor may be formed on the light emitting device corresponding to the red pixel.

Next, referring to FIG. 21C, the base mother substrate 50m having the light emitting devices formed thereon is cut along cutting lines CLN by a cutting blade BL, and the cut portions may form the pixel units 501, respectively. The base mother substrate 50m may be cut in various ways, for example, a laser, scribing, and the like.

Figure 21D:
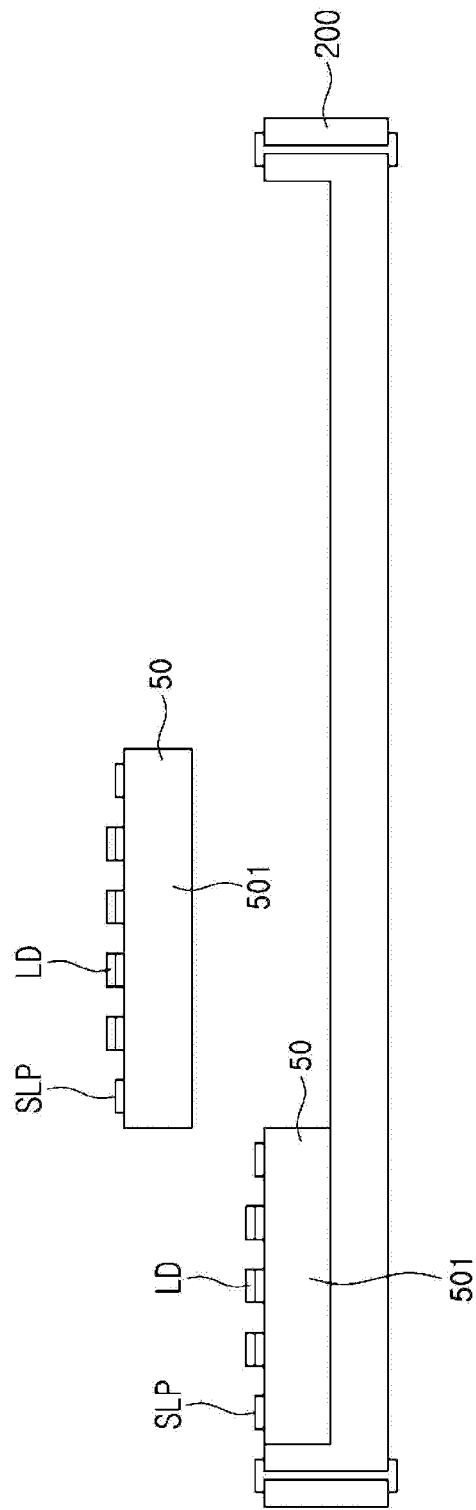

Then, referring to FIG. 21D, a printed circuit board 200 having seating grooves is prepared, and pixel units 501 are disposed on the seating grooves to be secured thereto. Although not shown in the drawings, a bonding agent may be disposed between the printed circuit board 200 and the pixel units 501 and between adjacent pixel units 501, such that the pixel units 501 can be stably secured to the printed circuit board 200 by the bonding agent. The bonding agent may include, for example, an epoxy-based bonding agent or a silicon-based bonding agent. However, the inventive concepts are not limited thereto, and the bonding agent may be selected from any bonding agents capable of securing the pixel units 501 to the printed circuit board 200.

Figure 21E:
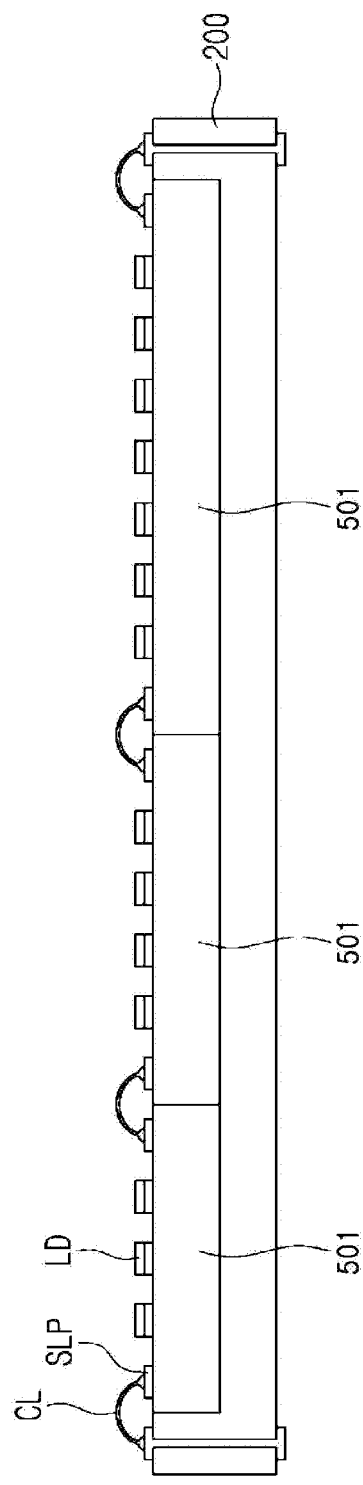

Then, referring to FIG. 21E, adjacent pixel units 501 may be connected to each other and the printed circuit board 200 may be connected to the pixel units 501 through connecting portions CL. The connecting portions CL may electrically connect the adjacent pixel units 501 to each other, and may electrically connect the printed circuit board 200 to the pixel units 501. The connecting portions CL may employ various methods as described above. In the illustrated exemplary embodiment, as the connecting portions CL, bonding wires are used to connect the adjacent pixel units 501 to each other, and to connect the printed circuit board 200 to the pixel units 501.

Then, although not shown in the drawings, the encapsulation layer may be formed on the pixel units 501 and the connecting portions Cl. The encapsulation layer serves to protect the light emitting devices, the phosphor, and the wire in each of the pixel units 501, and may be formed through deposition and molding.

As described above, according to the illustrated exemplary embodiment, after simultaneous formation of the interconnection part and/or the transistors corresponding to multiple pixel units on the base mother substrate, multiple pixel units having the same or different areas can be formed at the same time by cutting the base mother substrate. In this manner, display devices having various areas and various shapes can be manufactured by connecting the multiple pixel units through the connecting portions.

Next, a light emitting apparatus according to yet other exemplary embodiments will be described.

As used herein, the light emitting apparatus may refer to a display device and/or a lighting apparatus, which include light emitting devices. In the light emitting apparatus according to exemplary embodiments, when light emitting devices of a pixel unit are used as pixels, the light emitting apparatus may be used as a display device. The display device includes TVs, a tablet display device, an e-book display device, a computer monitor, a kiosk, a digital camera, a game console, or a large outdoor/indoor electronic scoreboard.

The lighting apparatus includes a backlight unit used in the display device, and may include indoor/outdoor lighting lamps, street lamps, vehicular lamps, and the like.

The light emitting apparatus according to an exemplary embodiment may include micro-light emitting devices. The micro-light emitting devices may have a width or a length of about 1 micrometer to about 800 micrometer, about 1 micrometer to about 500 micrometer, or about 10 micrometer to about 300 micrometer. However, the inventive concepts are not limited to a particular width or length of the micro-light emitting devices, and the micro-light emitting devices may have a smaller or greater size, as needed.

Figure 22:
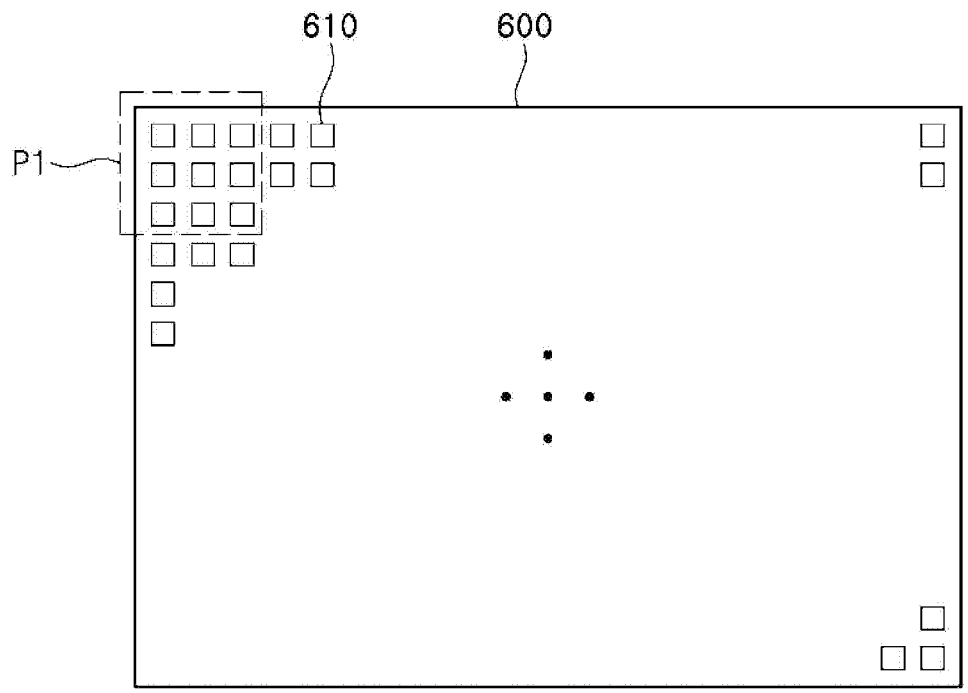
FIG. 22 is a plan view of a display device according to an exemplary embodiment.
Figure 23:
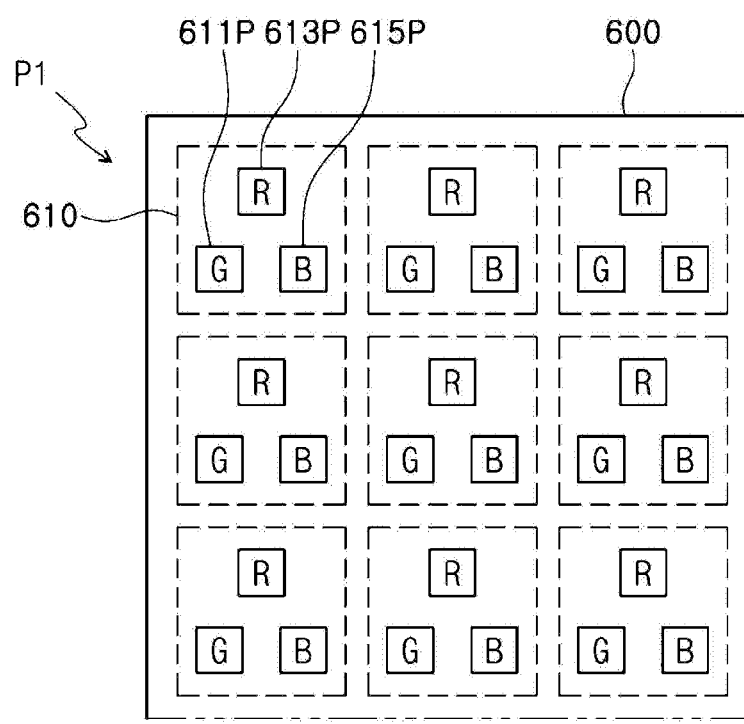
FIG. 23 is an enlarged plan view of portion P1 of FIG. 22.

FIG. 22 is a plan view of a display device according to an exemplary embodiment, and FIG. 23 is an enlarged plan view of portion P1 of FIG. 22.

Referring to FIG. 22 and FIG. 23, the display device 600 according to the illustrated exemplary embodiment displays certain visual data, for example, text, video, photographs, two or three-dimensional images, and the like.

The display device 600 may be provided in various shapes, for example, a closed polygonal shape including linear sides, such as a rectangular shape, a circular shape, an elliptical shape, a semicircular or semi-elliptical shape including a linear side and a curved side, and the like. In the illustrated exemplary embodiment, the display device has a rectangular shape.

The display device 600 includes multiple pixel units 610, which display images. Each of the pixel units 610 may be the minimum unit for displaying an image. Each of the pixel units 610 may emit white light and/or a colored light. Each of the pixel units 610 may include one pixel emitting one color, or may include multiple pixels to emit white light and/or a colored light through combination of different colors. For example, each of the pixel units 610 may include first to third pixels 611P, 613P, 615P.

In an exemplary embodiment, each of the pixel unit 610 may include a green pixel G, a red pixel R, and a blue pixel B, and the first to third pixels 611P, 613P, 615P may correspond to the green pixel G, the red pixel R, and the blue pixel B, respectively. However, the inventive concepts are not limited thereto. For example, in some exemplary embodiments, each of the pixel units 610 may include a cyan pixel, a magenta pixel, a yellow pixel, and the like. Hereinafter, each of the pixel units will be described as including the green pixel G, the red pixel R, and the blue pixel B according to an exemplary embodiment.

The pixel units 610 and/or the pixels 611P, 613P, 615P are arranged in a matrix. As used herein, the phrase "pixel units 610 and/or the pixels 611P, 613P, 615P are arranged in a matrix" means not only that the pixel units 610 and/or the pixels 611P, 613P, 615P are arranged accurately in lines along rows or columns, but also that the pixel units 610 and/or the pixels 611P, 613P, 615P are generally arranged in lines along the rows or the columns without being limited to particular locations thereof, such as being arranged in a zigzag shape.

Figure 24:
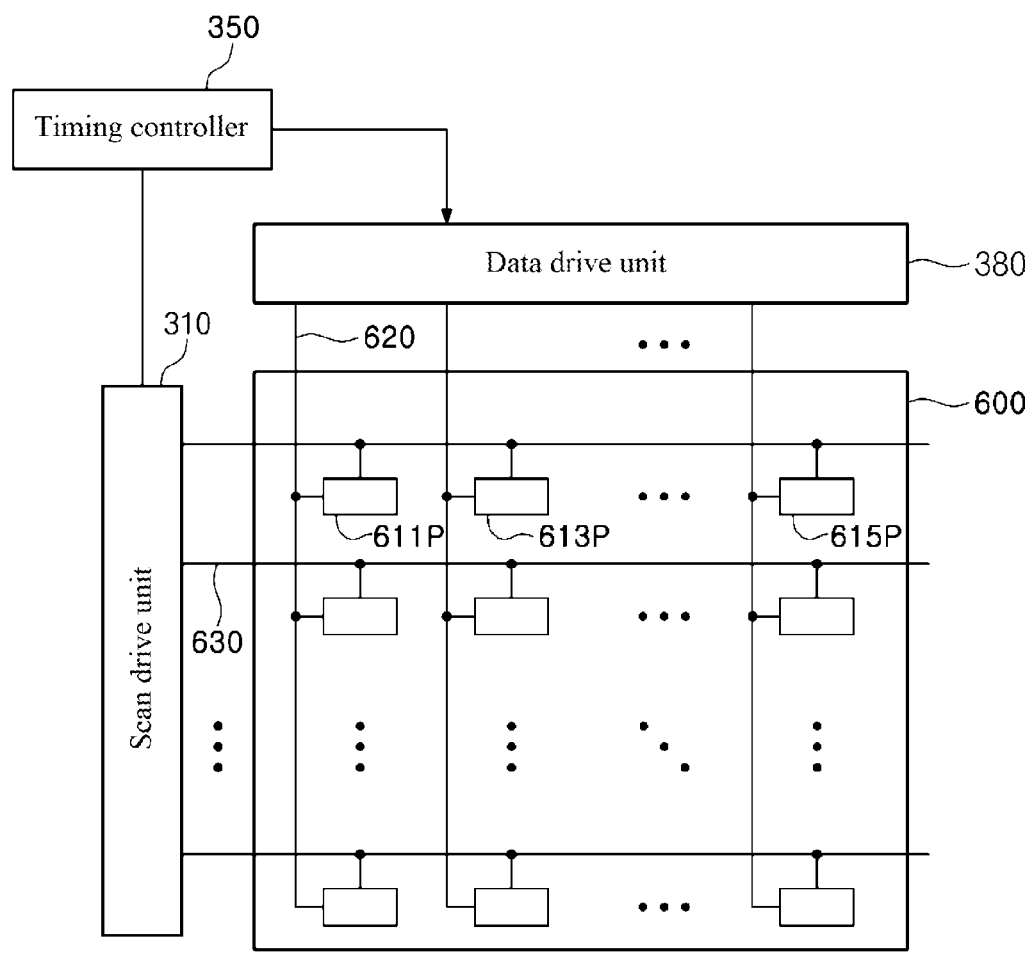
FIG. 24 is a structural view of a display device according to an exemplary embodiment.

FIG. 24 is a structural view of a display device according to an exemplary embodiment.

Referring to FIG. 24, the display device 600 according to the illustrated exemplary embodiment includes a timing controller 350, a scan drive unit 310, a data drive unit 380, an interconnection part, and pixel units. When each of the pixel units includes multiple pixels 611P, 613P, 615P, each of the pixels 611P, 613P, 615P is connected to the scan drive unit 310, the data drive unit 380, and the like, through an individual interconnection part.

The timing controller 350 receives various control signals for driving the display device and image data from an external system, such as a system transmitting image data. Upon reception of the image data, the timing controller 350 rearranges the image data and transmits the rearranged image data to the data drive unit 380. In addition, the timing controller 350 generates scan control signals and data control signals for driving the scan drive unit 310 and the data drive unit 380, and transmits the scan control signals and the data control signals to the scan drive unit 310 and the data drive unit 380, respectively.

The scan drive unit 310 receives the scan control signals from the timing controller 350 and generates scan signals in response to the scan control signals.

The data drive unit 380 receives the data control signals and the image data from the timing controller 350 and generates data signals in response to the data control signals and the image data.

The interconnection part includes multiple signal interconnects. More particularly, the interconnection part includes first interconnects 630, which connect the scan drive unit 310 to the pixels 611P, 613P, 615P, and second interconnects 620, which connect the data drive unit 380 to the pixels 611P, 613P, 615P. In the illustrated exemplary embodiment, the first interconnects 630 may be scan interconnects and the second interconnects 620 may be data interconnects. As such, the first interconnects 630 will be referred to as scan interconnects, and the second interconnects 520 will be referred to as data interconnects. The interconnection part further includes interconnects that connect the timing controller 350 to the scan drive unit 310 and connect the timing controller 350 to the data drive unit 380 or other components to deliver corresponding signals.

The scan interconnects 630 supply the scanning signals generated by the scan drive unit 310 to the pixels 611P, 613P, 615P. The data signals generated by the data drive unit 380 are output through the data interconnects 620. The data signals output through the data interconnects 620 are input to the pixels 611P, 613P, 615P in a horizontal pixel unit line selected by the scan signals.

The pixels 611P, 613P, 615P are connected to the scan interconnects 630 and the data interconnects 620. The pixels 611P, 613P, 615P selectively emit light in response to the data signals input through the data interconnects 620 when the scan signals are supplied through the scan interconnects 630. For example, each of the pixels 611P, 613P, 615P emits light with brightness corresponding to the received data signals during each frame duration. Upon reception of data signals corresponding to black brightness, the pixels 611P, 613P, 615P display a black color through non-emission of light during the corresponding frame duration.

The pixels may be driven in a passive type driving method or an active type driving method. Upon active driving of the display device, the display device may be driven by first and second pixel power sources in addition to the scan signals and the data signals.

Figure 25A:
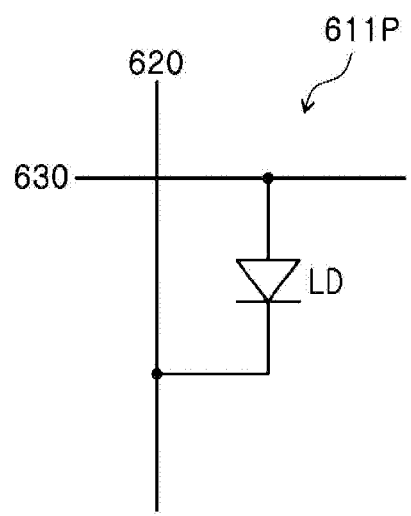
FIG. 25A is a circuit diagram of a pixel unit forming a passive type display device.

FIG. 25A is a circuit diagram of a pixel forming a passive type display device. The pixel may be one of pixels, for example, one of a red pixel, a green pixel, and a blue pixel. In the illustrated exemplary embodiment, the pixel will be described with reference to the first pixel 611P.

Referring to FIG. 25A, the first pixel 611P includes a light emitting device LD connected between the scan interconnect 630 and the data interconnect 620. The light emitting device LD may be a light emitting diode including first and second terminals. The first and second terminals are connected to a first electrode (for example, anode) and a second electrode (for example, cathode) of the light emitting device, respectively. The first terminal may be connected to the scan interconnect 630 and the second terminal may be connected to the data interconnect 620, or vice versa.

When a voltage greater than or equal to a threshold voltage is applied between the first electrode and the second electrode, the light emitting device LD emits light with brightness corresponding to the voltage. In particular, light emission of the first pixel 611P may be controlled by regulating voltage of scan signals applied to the scan interconnect 630 and/or voltage of data signals applied to the data interconnect 620.

Although one light emitting device LD is illustrated as being connected between the scan interconnect 630 and the data interconnect 620 in the illustrated exemplary embodiment, the inventive concepts are not limited thereto. For example, in some exemplary embodiments, multiple light emitting devices LD may be connected in series or in parallel to each other between the scan interconnect 630 and the data interconnect 620.

Figure 25B:
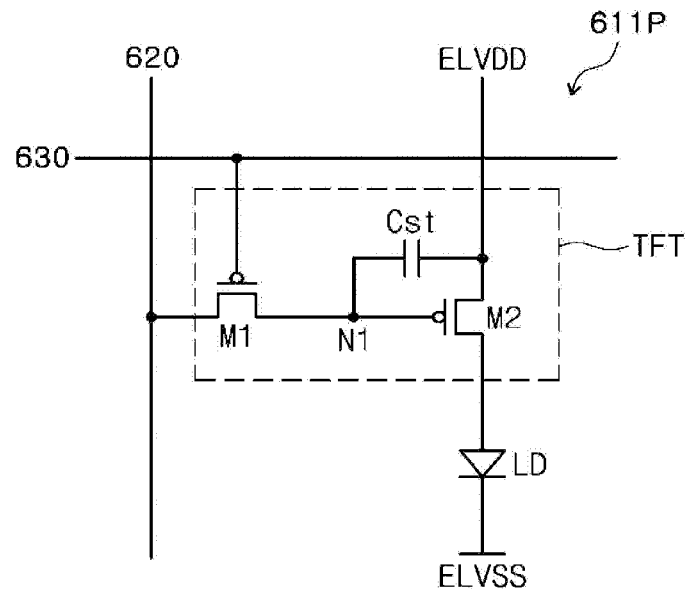
FIG. 25B is a circuit diagram of a first pixel forming an active type display device.

FIG. 25B is a circuit diagram of the first pixel 611P forming an active type display device. For the active type display device, the first pixel 611P may be driven by first and second pixel power sources ELVDD, ELVSS in addition to the scan signal and the data signal.

Referring to FIG. 25B, the first pixel 611P includes at least one light emitting device LD and a transistor unit TFT connected thereto.

The first electrode of the light emitting device LD is connected to the first pixel power source ELVDD through the transistor unit TFT, and the second electrode is connected to the second pixel power source ELVSS therethrough. The first pixel power source ELVDD and the second pixel power source ELVSS may have different potentials. For example, the second pixel power source ELVSS may have a lower potential than the first pixel power source ELVDD by a threshold voltage or more of the light emitting device. Each of the light emitting devices emits light with brightness corresponding to drive current controlled by the transistor unit TFT.

According to an exemplary embodiment, the transistor unit includes first and second transistors T1, T2 and a storage capacitor Cst. However, the structure of the transistor unit is not limited to that shown in FIG. 25B.

A source of the first transistor T1 (e.g., switching transistor) is connected to the data interconnect 620, and a drain of the first transistor T1 is connected to a first node N1. In addition, a gate of the first transistor T1 is connected to the scan interconnect 630. In this manner, the first transistor is turned on to electrically connect the data interconnect 620 to the first node N1 when a scan signal of a voltage allowing the first transistor T1 to be turned on is supplied through the scan interconnect 630. Here, a data signal of the corresponding frame is supplied to the first node N1 through the data interconnect 620. The storage capacitor Cst is charged by the data signal supplied to the first node N1.

A source of the second transistor T2 (e.g., driving transistor) is connected to the first pixel power source ELVDD, and a drain of the second transistor T2 is connected to the first electrode of the light emitting device. In addition, a gate of the second transistor T2 is connected to the first node N1. In this manner, the second transistor T2 controls the amount of drive current to be supplied to the light emitting device corresponding to the voltage of the first node N1.

One electrode of the storage capacitor Cst is connected to the first pixel power source ELVDD and the other electrode of the storage capacitor is connected to the first node N1. The storage capacitor Cst is charged with a voltage corresponding to the data signal supplied to the first node N1, and maintains the charged voltage until a data signal of another frame is supplied.

FIG. 25B exemplarily shows that the transistor unit includes two transistors. However, the inventive concepts are not limited thereto, and the structure of the transistor unit may be modified in various ways. For example, the transistor unit may include more transistors or capacitors. In addition, although the detailed structures of the first and second transistors, the storage capacitor, and the interconnects are not shown in FIG. 25B, the first and second transistors, the storage capacitor, and the interconnects may be provided in various forms so as to implement circuits according to exemplary embodiments.

Figure 26:
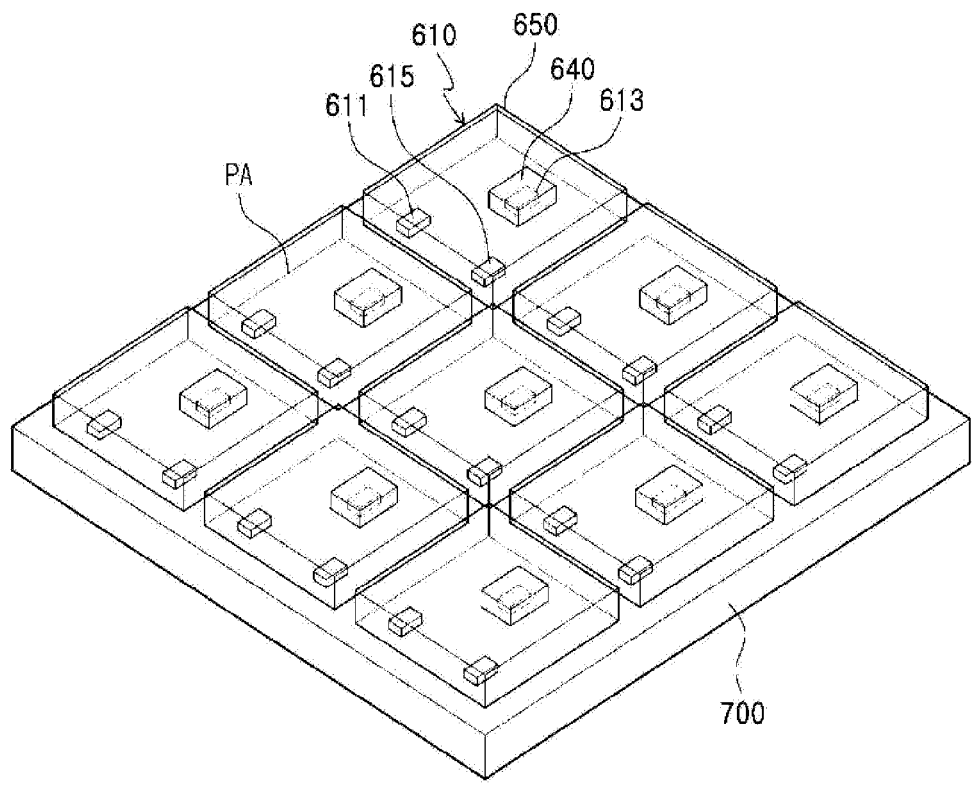
FIG. 26 is a perspective view of a display device according to yet another exemplary embodiment corresponding to FIG. 23.
Figure 27A:
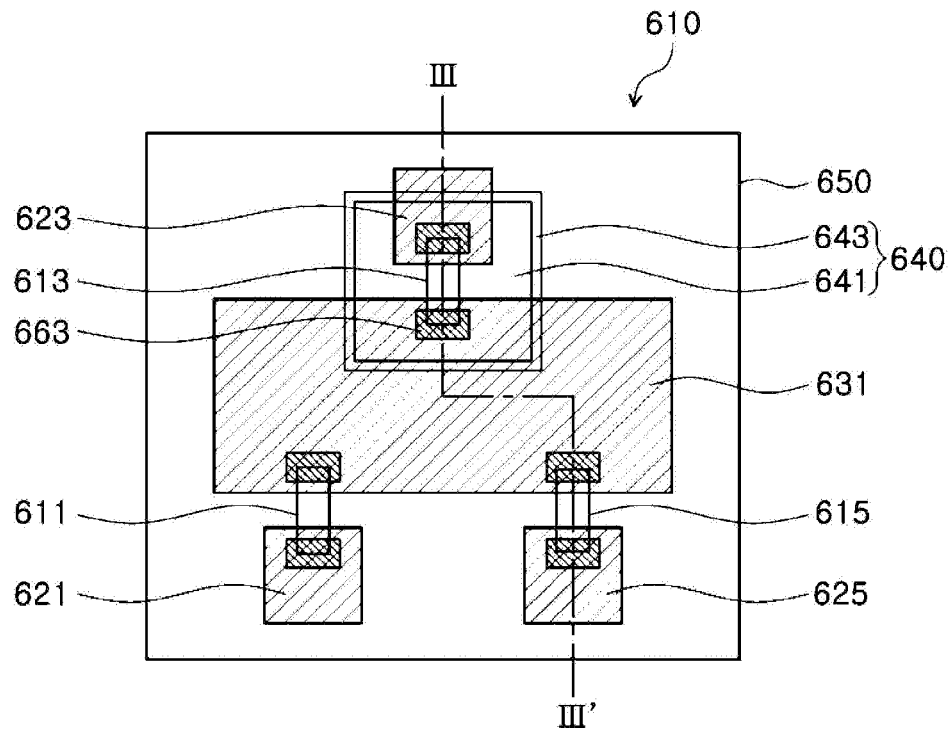
FIG. 27A is a plan view of one pixel of the display device shown in FIG. 26.

FIG. 26 is a perspective view of a display device according to yet another exemplary embodiment corresponding to FIG. 23. FIG. 27A is a plan view of one pixel unit of the display device shown in FIG. 26, and FIG. 27B is a cross-sectional view taken along line III-III' of FIG. 27A.

Figure 27B:
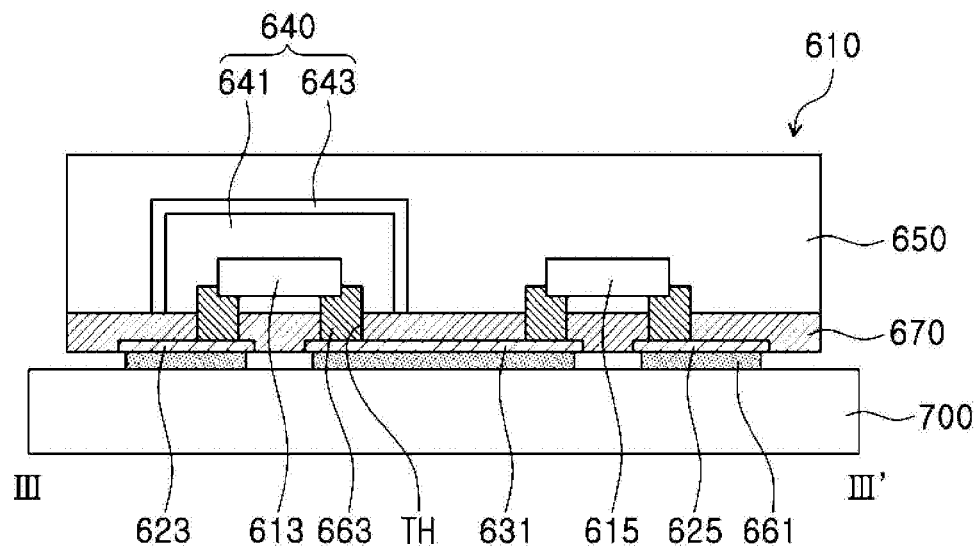
FIG. 27B is a cross-sectional view taken along line of FIG. 27A.

Referring to FIG. 26, FIG. 27A, and FIG. 27B, the display device according to the illustrated exemplary embodiment includes a base substrate 700 and pixel units 610 mounted on the base substrate 700.

The base substrate 700 may include an interconnection part to supply power and signals to the pixel units 610.

Although not shown in the drawings, transistor units and/or an interconnection part including scan interconnects and data interconnects connected to the pixel units are formed on the base substrate 700.

In the illustrated exemplary embodiment, the base substrate 700 may be a printed circuit board. When the base substrate 700 is implemented by the printed circuit board, not only the interconnection part connected to the pixel units 610, but also circuits, such as a timing controller, a scan drive unit, a data drive unit, and the like, may be mounted on the printed circuit board.

The printed circuit board may be a double-sided printed circuit board having the interconnection part formed on both surfaces thereof. The interconnection part may include connection pads disposed on an upper surface of the printed circuit board, and through-interconnects formed through the printed circuit board from the upper surface to the lower surface thereof so as to be connected to the pixel units 610. The circuits and the like may be disposed on the lower surface of the printed circuit board 200, and the interconnects of the pixel units 610 may be connected to the interconnects and the circuits on the lower surface of the printed circuit board through the connection pads and the through-interconnects.

In some exemplary embodiments, the base substrate 700 may be implemented by other members allowing the pixel units 610 to be mounted thereon, rather than the printed circuit board. For example, the base substrate 700 may be an insulation substrate, such as a glass, quartz or plastic substrate, which has the interconnection part thereon. In this case, the circuits, such as a timing controller, a scan drive unit, a data drive unit, and the like, may be directly formed on the insulation substrate or may be formed on a separate printed circuit board to be connected to the interconnection part on the insulation substrate.

The base substrate 700 may be formed of a rigid material, without being limited thereto. Alternatively, the base substrate 700 may be formed of a flexible material. According to an exemplary embodiment, for a display device implemented by a bent or bendable display device, the base substrate 700 may be advantageously formed of a flexible material. According to another exemplary embodiment, the base substrate 700 formed of a transparent material, such as glass and quartz, has higher flexibility than an organic polymer substrate, and thus, advantageously allows various laminations on the upper surface thereof and facilitates manufacture of a front or rear light emissive display device. The base substrate 700 formed of an organic polymer or an organic-inorganic composite has relatively high flexibility, and may be advantageous in manufacture of a curved display device.

One or more pixel units 610 are mounted on the base substrate 700 with a first conductive bonding layer 661 interposed therebetween. In the display device, the pixel units 610 are separated from each other to form minimum units to be mounted on the base substrate 700, provided in the form of packages, and mounted in a pixel region PA of the base substrate 700.

Each of the pixel units 610 may be provided with at least one pixel each including first to third pixels. The first to third the pixels 611P, 613P, 615P may be implemented by first to third light emitting devices 611, 613, 615 emitting light having different wavelengths. In particular, when light components emitted from the first to third the pixels 611P, 613P, 615P are referred to as first to third light components, respectively, the first to third light components may have different wavelength bands. In the illustrated exemplary embodiment, the first to third light components may have green, red, and blue wavelength bands, respectively, as described above, and the first to third light emitting devices 611, 613, 615 may be implemented by green, red, and blue light emitting diodes.

However, in some exemplary embodiments, the first to third light components may implement green light, red light, and blue light without having the green, red, and blue wavelength bands. For example, even when the first to third light components have the same wavelength band, a final color of light output can be controlled using a color converter 640 adapted to convert some of the first to third light components into light having a different wavelength band from the first to third light components. The color converter 640 includes a color conversion layer 641 that converts light having a certain wavelength into light having a different wavelength.

In particular, for implementation of green light, red light and/or blue light, it is not necessary for the first to third the pixels 611P, 613P, 615P to employ the green, red and/or blue light emitting diodes, and the first to third the pixels 611P, 613P, 615P may employ other light emitting diodes. For example, for implementation of red light, a blue or UV light emitting diode may be employed together with a color conversion layer 641 that emits red light after absorption of blue or UV light, instead of the red light emitting diode. Likewise, for implementation of green light, the blue or UV light emitting diode may be employed together with a color conversion layer 641 that emits green light after absorption of blue or UV light.

The color conversion layer 641 may selectively employ any material capable of converting light having a certain wavelength into light having a different wavelength. For example, the color conversion layer 641 may include at least one of phosphors, nano-structures, such as quantum dots, organic materials capable of converting a color, and combinations thereof. The color conversion layer 641 may include a color filter layer 643 to improve purity of a color finally emitted therefrom.

In the illustrated exemplary embodiment, the first to third light emitting devices 611, 613, 615 may be implemented by adopting green, blue, and blue light emitting diodes. In this case, in order to emit red light, a blue light emitting diode may be used as the second light emitting device 613 and the color conversion layer 641 may include phosphors to emit red light after absorption of blue light.

Each pixel unit 610 is provided with connection electrodes, for example, first to fourth connection electrodes 621, 623, 625, 631, which are connected to the interconnection part of the base substrate 700, that is, the scan interconnects and the data interconnects. The first to fourth connection electrodes 621, 623, 625, 631 are electrically connected to the interconnection part on the base substrate 700 with the first conductive bonding layer 661 interposed therebetween.

The first conductive bonding layer 661 is provided for electrical connection, and may be formed of a conductive resin or a conductive paste, such as solder pastes, silver pastes, and the like. However, the first conductive bonding layer 661 is not limited thereto.

The first to fourth connection electrodes 621, 623, 625, 631 include a fourth connection electrode 631 extending in one direction, such as in the longitudinal direction, in one pixel region, and first to third connection electrodes 621, 623, 625 spaced apart from the fourth connection electrode 631. The fourth connection electrode 631 is connected to the scan interconnect of the base substrate 700. The first to third connection electrodes 621, 623, 625 are provided corresponding to the number of light emitting devices, that is, three in the illustrated exemplary embodiment, and are connected to the data interconnects of the base substrate 700.

A light non-transmitting layer 670 is disposed on the first to fourth connection electrodes 621, 623, 625, 631.

The light non-transmitting layer 670 is an insulation layer formed of a non-conductive material, and does not allow transmission of light therethrough. In an exemplary embodiment, the light non-transmitting layer 670 may be formed of a light absorption material. The light non-transmitting layer 670 may exhibit black and may be formed of, for example, a black matrix material used in a display device. In the illustrated exemplary embodiment, the light non-transmitting layer 670 may be formed of a black photo-sensitive resist. The light non-transmitting layer 670 formed of the black photo-sensitive resist facilitates patterning process using photolithography. However, the light non-transmitting layer 670 is not limited thereto, and may be formed of various materials.

A second conductive bonding layer 663 is disposed on the light non-transmitting layer 670. The light non-transmitting layer 670 is partially removed to form multiple through-holes TH, which expose at least part of the connection electrodes. The through-holes TH are formed to electrically connect the first to third light emitting devices 611, 613, 615 to the first to fourth connection electrodes 621, 623, 625, 631 through the second conductive bonding layer 663. To this end, the through-holes TH are formed in regions of the second conductive bonding layer 663 corresponding to regions to which the first to third light emitting devices 611, 613, 615 are to be attached.

The second conductive bonding layer 663 is provided to multiple through-holes TH formed in the light non-transmitting layer 670. The second conductive bonding layer 663 may be formed to have an upper surface placed above the upper surface of the light non-transmitting layer 670 in order to allow the light emitting devices to be easily attached thereto.

The second conductive bonding layer 663 is provided for electrical connection, and may be formed of a conductive resin or a conductive paste, such as solder pastes, silver pastes, and the like. However, the material for the second conductive bonding layer 663 is not limited thereto.

The first to third light emitting devices 611, 613, 615 are disposed on the second conductive bonding layer 663. Each of the first to third light emitting devices 611, 613, 615 may be a light emitting diode having a first terminal and a second terminal. Although the second light emitting device 613 and the third light emitting device 615 are illustrated as having the same size, the first to third light emitting devices 611, 613, 615 may have the same size or different sizes. In particular, at least one of the first to third light emitting devices 611, 613, 615 may have a different height than the other light emitting devices. The heights of the first to third light emitting devices 611, 613, 615 may be changed depending upon the materials for the first to third light emitting devices 611, 613, 615 or optical characteristics thereof. For example, the first light emitting device 611 emitting green light may have a greater height than the third light emitting device 615 emitting blue light. The internal structures of the first and third light emitting devices 611, 615 will be described in more detail below.

The color converter 640 is disposed on the second light emitting device 613. The color converter 640 may include the color conversion layer 641 and the color filter layer 643.

The color conversion layer 641 absorbs light emitted from the second light emitting device 613 and emits light having a different wavelength from light emitted from the second light emitting device 613, as described above. In particular, the color conversion layer 641 absorbs light having a relatively short wavelength and emits light having a longer wavelength than the absorbed light. As described above, according to the illustrated exemplary embodiment, a phosphor may be used as the color conversion layer 641. The phosphor may emit red light through absorption of blue light. The phosphor may be provided in the form of a mixture with a transparent or translucent binder, such as polydimethylsiloxane (PDMS), polyimide (PI), poly(methyl 2-methylpropenoate) (PMMA), ceramics, and the like.

The color filter layer 643, for example, a red color filter layer, may be disposed on the color conversion layer 641. The color filter layer 643 serves to improve purity of light by blocking blue or UV light that is not completely converted by the phosphor 641. Further, the color filter layer 643 prevents light emitted from the second light emitting device 613 from being mixed with light emitted from the first and third light emitting devices 611, 615 by blocking light emitted from the first and third light emitting devices.

Although the color filter layer 643 may be omitted, the presence of the color filter layer 643 can realize a color having higher purity.

An encapsulation layer 650 may be disposed on the first to third light emitting devices 611, 613, 615 and the color filter layer 643. The encapsulation layer 650 covers the first to third light emitting devices 611, 613, 615, the color conversion layer 641, and the color filter layer 643.

The encapsulation layer 650 may be formed of a transparent insulation material. The material for the encapsulation layer 650 may be an organic polymer material, particularly, an epoxy resin, polysiloxane or photoresist. For example, the polysiloxane may include polydimethylsiloxane (PDMS). Alternatively, the material for the encapsulation layer 650 may include hydrogen silsesquioxane (HSSQ), methylsilsesquioxane (MSSQ), polyimide, divinyl siloxane bis-benzocyclobutane (DVS-BCS), perfluorocyclobutane (PFCB), and polyarylene ether (PAE), without being limited thereto.

Figure 28:
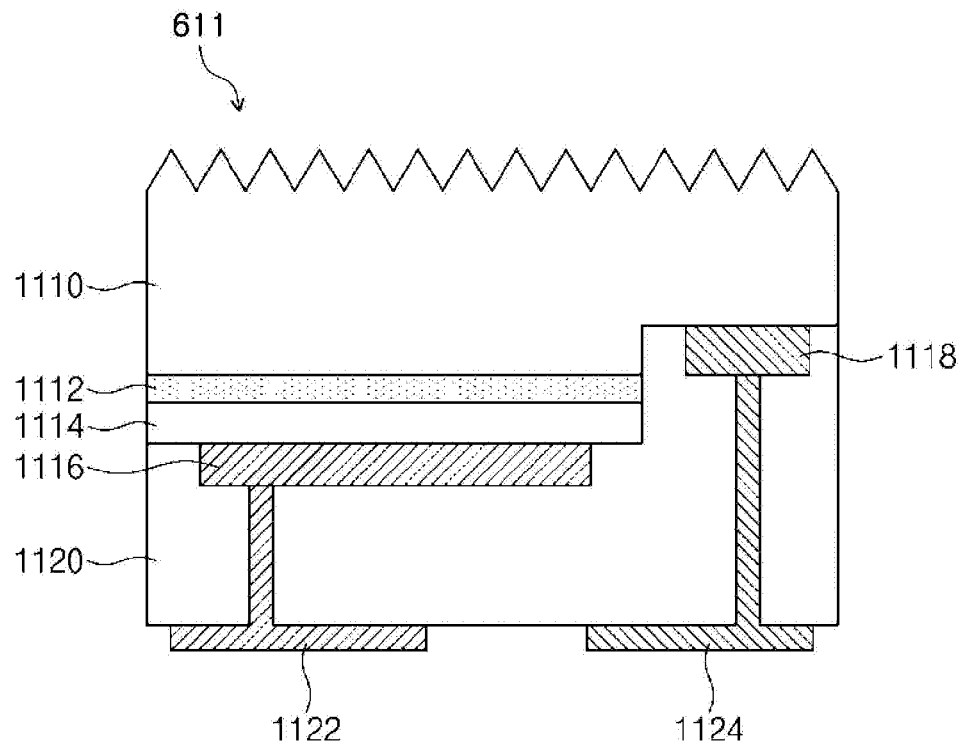
FIG. 28 is a cross-sectional view of a light emitting device according to another exemplary embodiment.

In an exemplary embodiment, the first to third light emitting devices 611, 613, 615 may employ flip-chip type light emitting diodes. FIG. 28 is a schematic cross-sectional view of a light emitting device according to an exemplary embodiment. The light emitting device shown in FIG. 28 may be one of the first to third light emitting devices 611, 613, 615, and the following description will be given with reference to the first light emitting device 611.

Referring to FIG. 28, the first light emitting device 611 includes a first conductivity type semiconductor layer 1110, an active layer 1112, a second conductivity type semiconductor layer 1114, a first contact layer 1116, a second contact layer 1118, an insulation layer 1120, a first terminal 1122, and a second terminal 1124.

As described with reference to FIG. 18, the first conductivity type semiconductor layer 1110, the active layer 1112, and the second conductivity type semiconductor layer 1114 are grown on the substrate 1101. The substrate 1101 is a growth substrate for growth of III-V based nitride semiconductor layers, and may include, for example, a sapphire substrate, more particularly, a patterned sapphire substrate. The substrate 1101 may be an insulation substrate, without being limited thereto.

Semiconductor layers are formed on the substrate 1101. In an exemplary embodiment, for a light emitting device emitting green light, the semiconductor layers may include indium gallium nitride (InGaN), gallium nitride (GaN), gallium phosphide (GaP), aluminum gallium indium phosphide (AlGaInP), and aluminum gallium phosphide (AlGaP). In another exemplary embodiment, for a light emitting device emitting red light, the semiconductor layers may include aluminum gallium arsenide (AlGaAs), gallium arsenide phosphide (GaAsP), aluminum gallium indium phosphide (AlGaInP), and gallium phosphide (GaP). In a further exemplary embodiment, for a light emitting device emitting blue light, the semiconductor layers may include gallium nitride (GaN), indium gallium nitride (InGaN), and zinc selenide (ZnSe).

The substrate 1101 may be removed from the semiconductor layers 1110, 1112, 1114 by laser lift-off or polishing.

As described above, the semiconductor layers include the first conductivity type semiconductor layer 1110, the active layer 1112, and the second conductivity type semiconductor layer 1114. The first conductivity type and the second conductivity type have opposite polarities. When the first conductivity type is n-type, the second conductivity type is p-type, and when the first conductivity type is p-type, the second conductivity type is n-type. In the illustrated exemplary embodiment, an n-type semiconductor layer 1110, the active layer 1112 and a p-type semiconductor layer 1114 are sequentially stacked on the substrate 1101.

The n-type semiconductor layer 1110, the active layer 1112, and the p-type semiconductor layer 1114 may be formed of III-V based nitride semiconductors, for example, nitride semiconductors, such as (Al, Ga, In)N. The n-type semiconductor layer 1110, the active layer 1112, and the p-type semiconductor layer 1114 may be grown on the substrate 1101 in a chamber by a method well-known in the art, such as metal organic chemical vapor deposition (MOCVD). The n-type semiconductor layer 1110 includes n-type dopants, for example, Si, Ge, and Sn, and the p-type semiconductor layer 1114 includes p-type dopants, for example, Mg, Sr, and Ba. In an exemplary embodiment, the n-type semiconductor layer 1110 may include GaN or AlGaN including Si as dopants, and the p-type semiconductor layer 1114 may include GaN or AlGaN including Mg as dopants.

Although each of the n-type semiconductor layer 1110 and the p-type semiconductor layer 1114 is illustrated as a single layer in the drawings, each of these semiconductor layers may be formed as multiple layers and may include a super-lattice layer. The active layer 1112 may include a single quantum well structure or a multi-quantum well structure, and the composition of the nitride semiconductor for the active layer 1112 may be adjusted to emit light in a desired wavelength band. For example, the active layer 1112 may emit blue or UV light.

The first contact layer 1116 is disposed in a region of the first conductivity type semiconductor layer 1110 in which the active layer 1112 and the second conductivity type semiconductor layer 1114 are not formed, and the second contact layer 1118 is disposed on the second conductivity type semiconductor layer 1114

The first and/or second contact layer 1116, 1118 may be formed as a single or multiple metal layers. A material for the first and/or second contact layer 1116, 1118 may include Al, Ti, Cr, Ni, Au, or alloys thereof.

The insulation layer 1120 is formed on the first and second contact layers 1116, 1118, and the first terminal 1122 and the second terminal 1124 are disposed on the insulation layer 1120 to be connected to the first contact layer 1116 and the second contact layer 1118 through the contact holes, respectively.

The first terminal 1122 is connected to one of a first connection electrode 621 and a second connection electrode 623 through a second conductive bonding layer 663, and the second terminal 1124 is connected to the other connection electrode through a second conductive bonding layer 663.

The first and/or second terminal(s) 1122, 1124 may be formed as a single or multiple metal layers. The first and/or second terminal(s) 1122, 1124 may include Al, Ti, Cr, Ni, Au, or alloys thereof.

Multiple protrusions may be formed on a rear surface of the first conductivity type semiconductor layer 1110, in particular, a surface of the first conductivity type semiconductor layer 1110 opposite to the active layer 1112, to improve light extraction efficiency. The protrusions may have various shapes, such as a polygonal pyramid shape, a semi-spherical shape, a random surface having roughness thereon, and the like.

Although the light emitting device according to the illustrated exemplary embodiment is briefly described above with reference to the drawing, the light emitting device may further include additional layers having other functions in addition to the layers described above. For example, the light emitting device may further include various layers, such as a reflective layer adapted to reflect light, an additional insulation layer adapted to insulate a certain component, an anti-solder diffusion layer adapted to prevent diffusion of solder, and the like.

Furthermore, a mesa may be formed in various shapes and the locations or shapes of the first and second contact electrodes 1116, 1118 or the first and second terminals 1122, 1124 may be changed in various ways in formation of a flip-chip type light emitting device.

The display device according to an exemplary embodiment has improved color purity and color reproducibility.

In general, upon formation of a pixel by mounting light emitting devices on a substrate, the light emitting devices are mounted on a transparent insulation layer formed on the substrate. When the insulation layer formed on the substrate is transparent, the transparent insulation layer is used as a waveguide, thereby causing a problem of propagation of light from one pixel to another pixel adjacent thereto. For example, when red light is emitted from a red light emitting device, a fraction of light traveling to a side of the red light emitting device can enter the transparent insulation layer through an interface of the transparent insulation layer. A fraction of the light having entered the transparent insulation layer may be output to an adjacent pixel, for example, a green pixel region, through reflection and refraction in the transparent insulation layer. In this case, the region provided with the green light emitting device can emit a mixed color through emission of the red light propagated through the transparent insulation layer together with the green light, or can emit a different color through interference of light, instead of emitting only the green light. As such, purity of the red light and color reproducibility may be deteriorated.

However, according to an exemplary embodiment, the light non-transmitting layer 670 is provided to each of the pixel regions, thereby preventing the insulation layer from being used as a waveguide. In particular, the light non-transmitting layer 670 may be formed to have a black color that absorbs light. As such, when light emitted from an adjacent light emitting device travels to a side or a lower portion, light is absorbed by the light non-transmitting layer 670, thereby preventing light from traveling to adjacent pixels. Accordingly, the display device according to an exemplary embodiment prevents color mixing or light interference between adjacent pixels, and has improved final color purity and color reproducibility.

Furthermore, since the display device according to an exemplary embodiment has an increased area represented by black, a contrast ratio between a black region and a bright region illuminated with light emitted from each of the light emitting devices may be increased, thereby improving characteristics of the display device.

In addition, according to an exemplary embodiment, the color filter layer is further provided in addition to the phosphor used as the color conversion layer, thereby ensuring further improvement in color purity and color reproducibility. As such, light not completely converted by the color conversion layer or light traveling from an adjacent pixel despite the light non-transmitting layer 670 can be blocked again by the color filter layer.

Furthermore, with the structure described above, the display device allows the multiple pixel units to be easily mounted on the base substrate, and thus, can be easily manufactured to have various shapes and various areas.

According to an exemplary embodiment, various modifications of the display device can be made, which will be described in more detail below.

Figure 29:
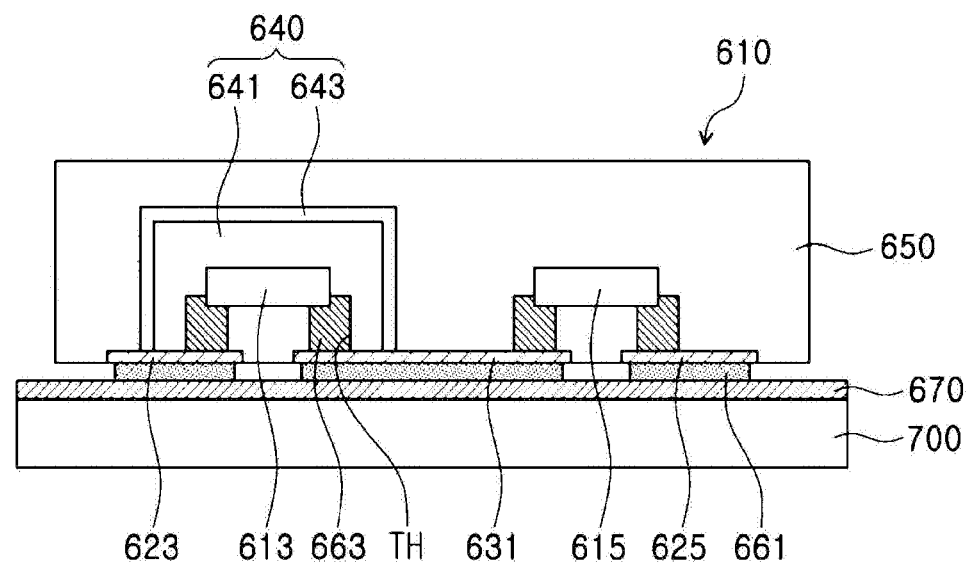
FIG. 29 is a cross-sectional view taken along line of FIG. 27A according to another exemplary embodiment.

FIG. 29 is a cross-sectional view taken along line of FIG. 27A according to another exemplary embodiment. The following description will focus on different features of this embodiment from those of the above embodiments and, for details of the components not described herein, refer to the above embodiments.

Referring to the above exemplary embodiments and FIG. 29, the light non-transmitting layer 670 according to the illustrated exemplary embodiment is formed on the base substrate 700, instead of being formed on the pixel unit 610.

More specifically, the display device includes the base substrate 700 and the pixel unit 610.

The base substrate 700 includes an interconnection part to supply power and signals to the pixel unit 610, and the light non-transmitting layer 670 is formed on the upper surface of the base substrate 700. Although not shown in the drawings, the light non-transmitting layer 670 may be formed with multiple through-holes, through which the interconnection part of the base substrate 700 is connected to a first conductive bonding layer 661. The through-holes may be provided with a separate conductive bonding layer or metal interconnects.

The pixel unit 610 is disposed on the base substrate 700 with the first conductive bonding layer 661 interposed therebetween.

The pixel unit 610 has a similar structure to that of the above exemplary embodiment, except for the light non-transmitting layer 670. More particularly, the first conductive bonding layer 661 is provided with first to fourth connection electrodes 621, 623, 625, 631 connected to the interconnection part of the base substrate 700, and a second conductive bonding layer 663 is disposed on the first to fourth connection electrodes 621, 623, 625, 631. First to third light emitting devices 611, 613, 615 are disposed on the second conductive bonding layer 663, and the first and second terminals of each of the first to third light emitting devices 611, 613, 615 are electrically connected to the first to fourth connection electrode 621, 623, 625, 631. A color conversion layer 641 and a color filter layer 643 may be selectively disposed on the first to third light emitting devices 611, 613, 615. An encapsulation layer 650 is disposed on the first to third light emitting devices 611, 613, 615.

As in the above described exemplary embodiment, the display device according to the illustrated exemplary embodiment can minimize color mixing or interference due to propagation of light emitted from one pixel to another pixel adjacent thereto.

Figure 30:
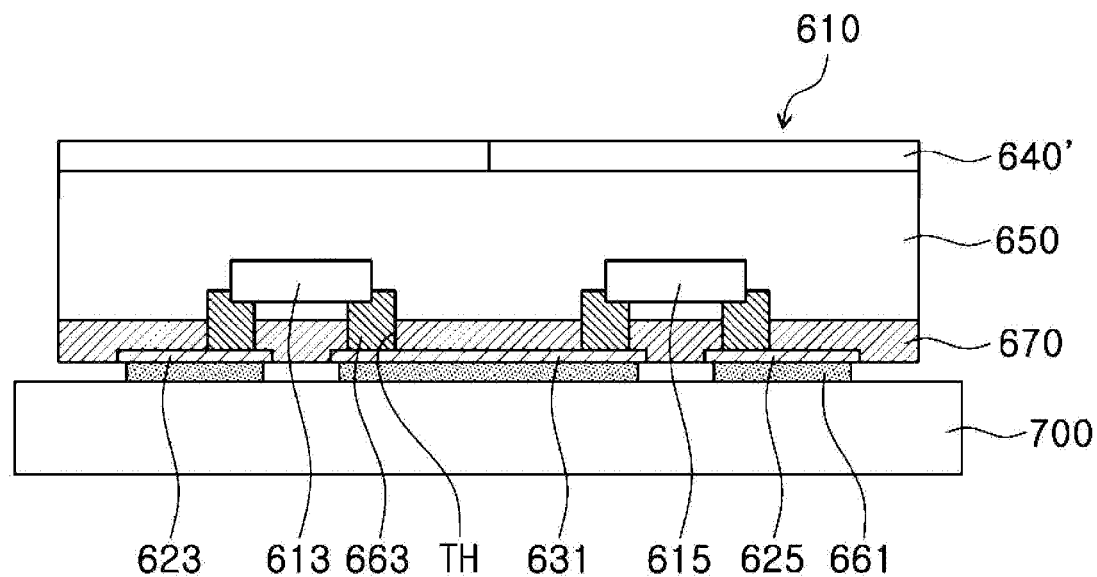
FIG. 30 is a cross-sectional view taken along line of FIG. 27A according to yet another exemplary embodiment.

FIG. 30 is a cross-sectional view taken along line of FIG. 27A according to yet another exemplary embodiment.

Referring to the above exemplary embodiments and FIG. 30, the location of the color converter 640 is different from that of the above exemplary embodiments. According to the illustrated exemplary embodiment, the color converter 640 is disposed on the encapsulation layer 650.

More specifically, the display device includes a base substrate 700 and a pixel unit 610 disposed on the base substrate 700.

The pixel unit 610 has a similar structure to that of the above exemplary embodiment shown in FIG. 27B, except for the color converter 640. More particularly, instead of the color converter 640, the encapsulation layer 650 is disposed on the first to third light emitting devices 611, 613, 615. The color converter 640 is disposed on the encapsulation layer 650.

According to the illustrated exemplary embodiment, the color converter 640 may include at least one of a phosphor-containing color conversion layer, a color filter, and a double layer including the color conversion layer and the color filter. In addition, although the color converter 640 is illustrated as being formed on the encapsulation layer 650 to cover the entirety of the encapsulation layer 650 in the illustrated exemplary embodiment, the inventive concepts are not limited thereto. For example, in some exemplary embodiments, the color converter 640 may be disposed on some of the first to third light emitting devices 611, 613, 615.

A light emitting apparatus according to an exemplary embodiment may be used as a lighting apparatus, and, in this case, the light emitting devices may not be used as pixels. When the light emitting apparatus is used as the lighting apparatus, particularly as a backlight unit for a display device, multiple light emitting devices may be connected in parallel or in series, and may be driven simultaneously.

Figure 31A:
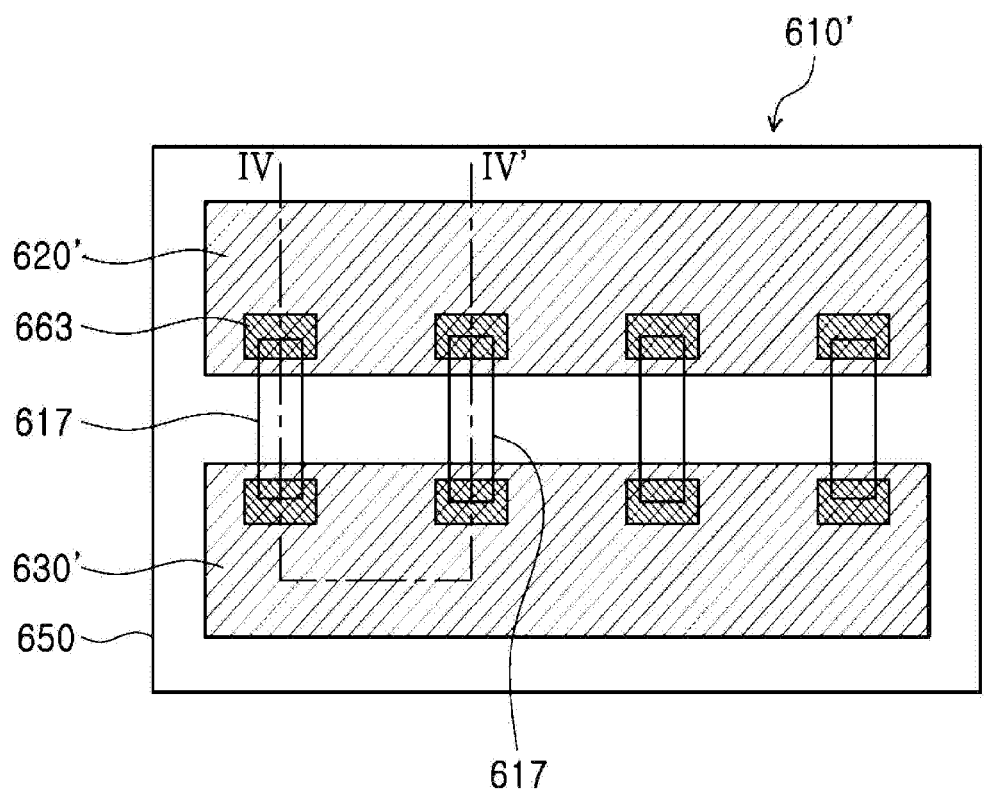
FIG. 31A is a view of a lighting apparatus according to an exemplary embodiment.
Figure 31B:
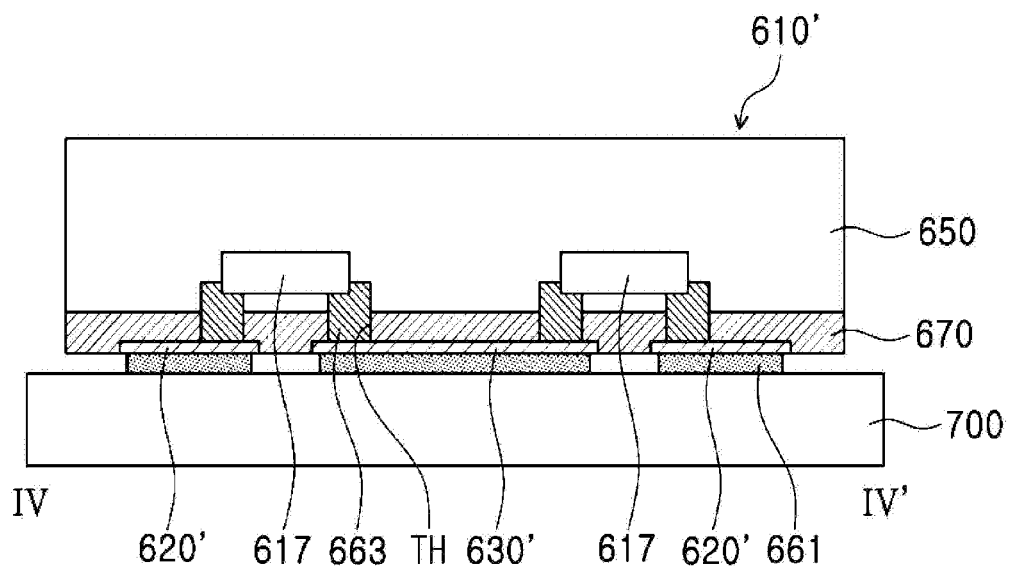
FIG. 31B is a cross-sectional view taken along line IV-IV' of FIG. 31A.
Figure 32:
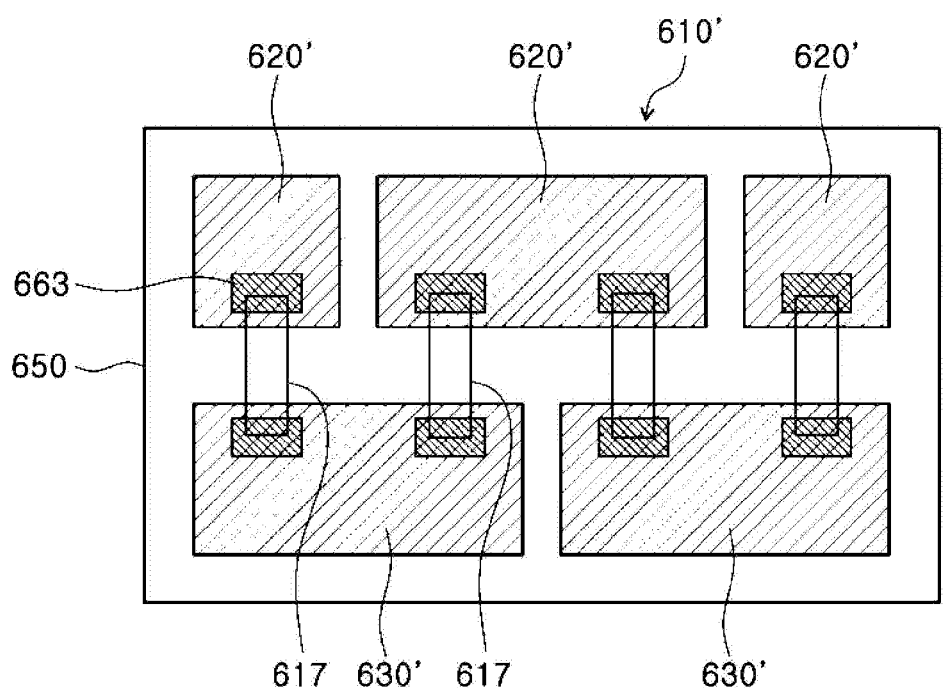
FIG. 32 is a view of a lighting apparatus according to another exemplary embodiment.

FIG. 31A shows a lighting unit, which includes the light emitting devices connected in parallel, as the light emitting apparatus according to an exemplary embodiment, and FIG. 31B is a cross-sectional view taken along line IV-IV' of FIG. 31A. FIG. 32 shows a lighting unit, which includes the light emitting devices connected in series, as the light emitting apparatus according to another exemplary embodiment.

Referring to the above exemplary embodiments, and FIG. 31A and FIG. 31B, the lighting apparatus includes a base substrate 700 and a lighting unit 610' mounted on the base substrate 700.

The base substrate 700 includes an interconnection part to supply power and signals to the lighting unit 610'.

The lighting unit 610' is disposed on the base substrate 700 with a first conductive bonding layer 661 interposed therebetween. According to the illustrated exemplary embodiment, the lighting unit 610' includes multiple light emitting devices connected in parallel to one another.

The lighting unit 610' according to the illustrated exemplary embodiment has a similar structure as the pixel unit of the display device described above. More particularly, a first conductive bonding layer 661 is provided with first and second connection electrodes 620', 630', which are connected to scan interconnects and data interconnects on the base substrate 700, respectively, and a light non-transmitting layer 670 is disposed on the first and second connection electrodes 620', 630'. The light non-transmitting layer 670 may be formed of a non-conductive reflective material to maximize efficacy of light emitted from the light emitting devices. The non-conductive reflective material may include a mixture of inorganic fillers having a small particle diameter and a polymer resin. In an exemplary embodiment, the inorganic fillers may include barium sulfate, calcium sulfate, magnesium sulfate, barium carbonate, calcium carbonate, magnesium chloride, aluminum hydroxide, magnesium hydroxide, calcium hydroxide, titanium dioxide, alumina, silica, talc, and zeolite, without being limited thereto.

The first and second connection electrodes 620', 630' are spaced apart from each other and extend in one direction. The light non-transmitting layer 670 has through-holes TH, and a second conductive bonding layer 663 is disposed on the first and second connection electrodes 620', 630' in the through-holes TH. The light emitting devices are disposed on the second conductive bonding layer 663. Each of the light emitting devices has one end, for example, a first terminal, overlapping the first connection electrode 620' to be connected to the first connection electrode 620' through the second conductive bonding layer 663. Each of the light emitting devices has the other end, for example, a second terminal, overlapping the second connection electrode 630' so as to be connected to the second connection electrode 630' through the second conductive bonding layer 663. As such, the light emitting devices are connected in parallel to one another between the first and second connection electrodes 620', 630'.

An encapsulation layer 650 is disposed on the light emitting devices.

Although a separate color converter 640 is not shown in the illustrated exemplary embodiment, the lighting unit may further include the color converter 640 as in the exemplary embodiments described above, when there is a need for change of wavelengths of light emitted from the light emitting devices.

According to the illustrated exemplary embodiment, the lighting unit employs a light reflective layer as the light non-transmitting layer 670, thereby improving efficacy of light emitted from the light emitting devices. Accordingly, when the lighting unit according to the illustrated exemplary embodiment is applied to a backlight unit of a display device, the backlight unit may not require a separate reflective sheet.

FIG. 32 shows a lighting unit including light emitting devices connected in series. Since there is no significant difference between the lighting unit shown in FIG. 32 and the lighting unit shown in FIG. 31A, except for the shape of the connection electrodes and connection relationships of both ends thereof, to which the first terminal and the second terminal of the light emitting devices are provided, repeated descriptions of the lighting unit will be omitted.

The light emitting apparatus having the structure described above may be manufactured by forming connection electrodes on an initial substrate, forming a light non-transmitting layer on the connection electrodes, forming light emitting devices on the light non-transmitting layer to be connected to the connection electrodes, forming an encapsulation layer on the light emitting devices, disposing a support substrate on the encapsulation layer, removing the initial substrate, connecting the connection electrodes to an interconnection part of a circuit board, and removing the support substrate.

According to an exemplary embodiment, the lighting apparatus can be manufactured by substantially the same method as the display device, despite slight structural difference between the display device and the lighting apparatus. Thus, a method for manufacturing a display device will exemplarily be described below.

FIG. 33A to FIG. 44 illustrate a method for manufacturing a display device according to an exemplary embodiment, in which FIG. 33A, FIG. 34A, FIG. 35A, FIG. 36A, FIG. 37A and FIG. 38A are plan views and FIG. 33B, FIG. 34B, FIG. 35B, FIG. 36B, FIG. 37B, FIG. 38B, and FIG. 39 to FIG. 44 are cross-sectional views. Hereinafter, repeated descriptions of several components already described above will be omitted to avoid redundancy.

Figure 33A:
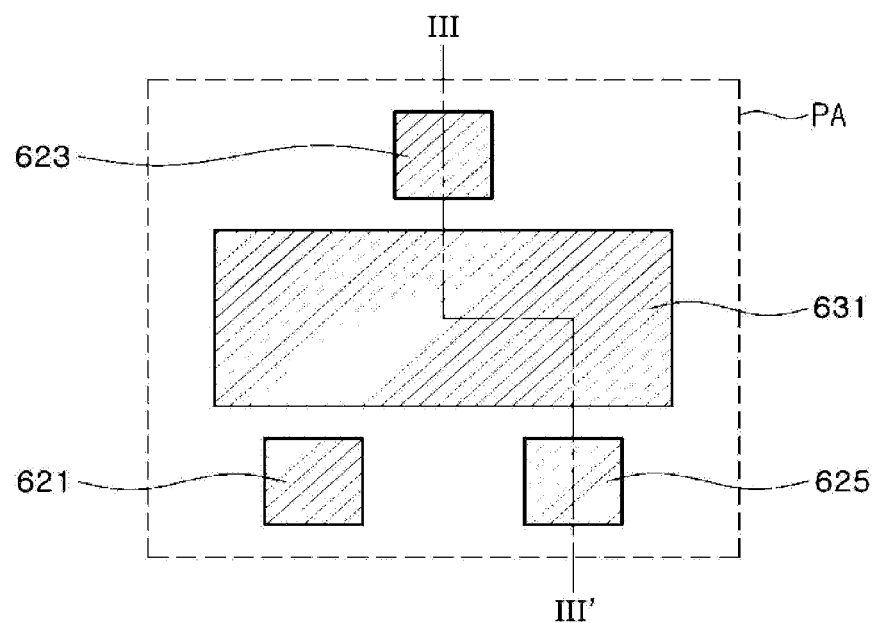
FIGS. 33A, 33B, 34A, 34B, 35A, 35B, 36A, 36B, 37A, 37B, 38A, 38B, 39, 40, 41, 42, 43, and 44 illustrate a method for manufacturing a display device according to an exemplary embodiment.
Figure 33B:
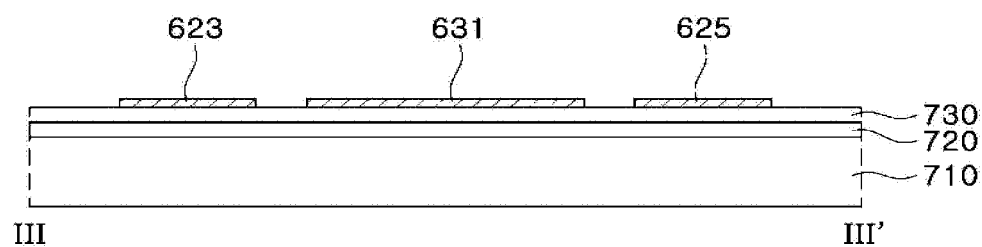

Referring to FIG. 33A and FIG. 33B, first to fourth connection electrodes 621, 623, 625, 631 are formed on an initial substrate 710.

Figure 42:
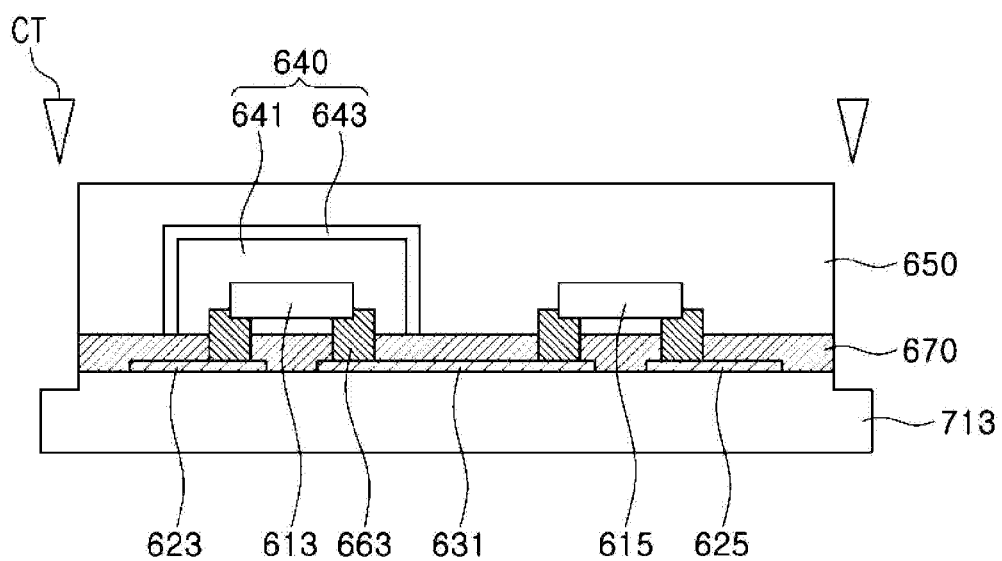

The initial substrate 710 is a temporary substrate for formation of pixel units on an upper surface thereof, and will be removed after completion of the manufacturing process. In addition, although one pixel unit is illustrated in the drawings illustrating a method for manufacturing a display device, multiple pixel units may be simultaneously formed on the initial substrate 710 using a large initial substrate 710 and may be divided into individual pixel units through cutting, as shown in FIG. 42.

At least one insulation layer may be interposed between the initial substrate 710 and the first to fourth connection electrodes 621, 623, 625, 631 to facilitate removal of the initial substrate 710. In an exemplary embodiment, the insulation layer may have a bilayer structure including first and second insulation layers 720, 730. The first insulation layer 720 and/or the second insulation layer 730 may be formed of a material allowing the initial substrate 710 to be easily removed through a laser lift-off process. For example, the first insulation layer 720 may be formed of indium tin oxide (ITO), GaN, and the like, and the second insulation layer 730 may be formed of silicon oxide, silicon nitride, silicon oxynitride, and the like. However, the first and/or the second insulation layer 720, 730 are not limited thereto.

The first to fourth connection electrodes 621, 623, 625, 631 can be easily formed by sputtering, deposition, coating, molding, photolithography, and the like.

Figure 34A:
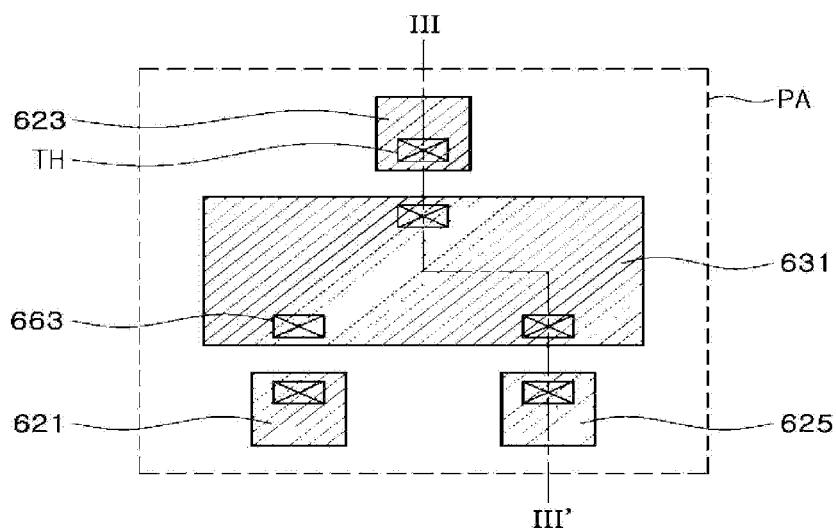
Figure 34B:
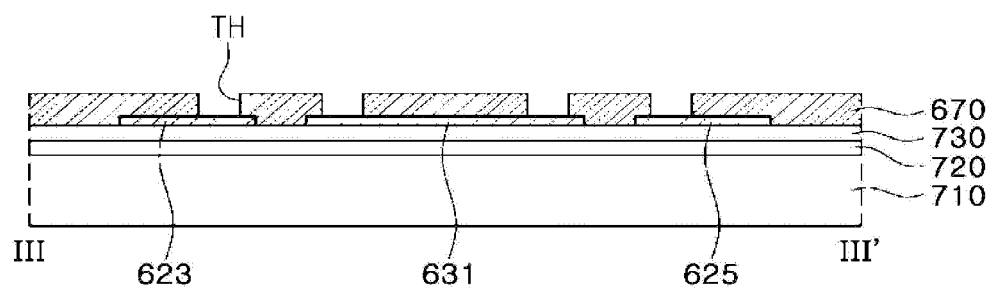

Referring to FIG. 34A and FIG. 34B, a light non-transmitting layer 670 is formed on an upper surface of the initial substrate 710 on which the connection electrodes 621, 623, 625, 631 are formed. The light non-transmitting layer 670 may be formed with through-holes TH, which expose at least some of the connection electrodes 621, 623, 625, 631, by patterning. The process of forming the through-holes TH in the light non-transmitting layer 670 may be carried out by imprinting or photolithography. In an exemplary embodiment, the light non-transmitting layer 670 may be formed of a black photosensitive resist, which allows easy patterning of the light non-transmitting layer 670 using photolithography after deposition.

Although the through-holes TH may be formed to expose some of the first to fourth connection electrodes 621, 623, 625, 631 in the illustrated exemplary embodiment, the through-holes TH may be formed to expose all of the first to fourth connection electrodes 621, 623, 625, 631 in other exemplary embodiments. The area and shape of the through-holes TH may be changed depending on the light emitting devices to be mounted on the substrate.

Figure 35A:
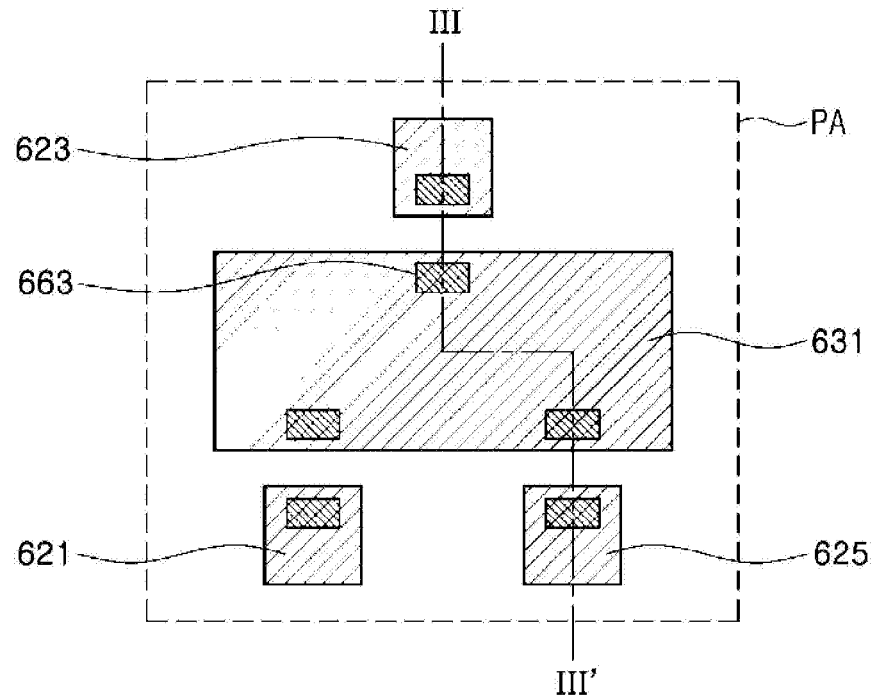
Figure 35B:
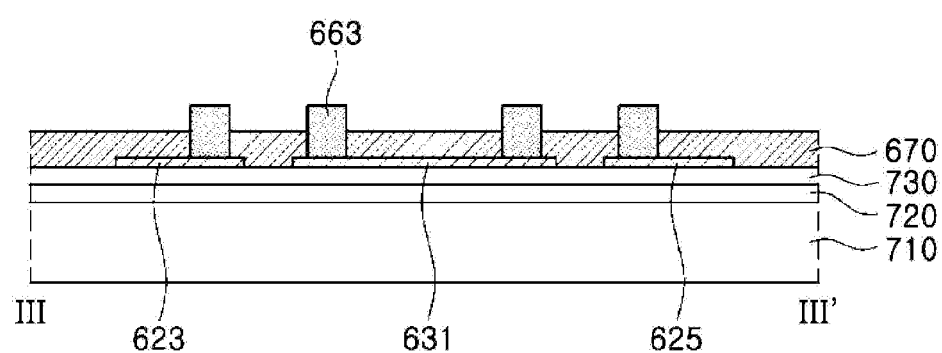

Referring to FIG. 35A and FIG. 35B, a second conductive bonding layer 663 is provided to the through-holes TH. The second conductive bonding layer 663 may be formed of a conductive resin or a conductive paste, such as solder pastes, silver pastes, and the like. The second conductive bonding layer 663 may be formed to a sufficient height, such that first and second terminals of each of the light emitting devices can be easily connected to an upper surface thereof.

Figure 36A:
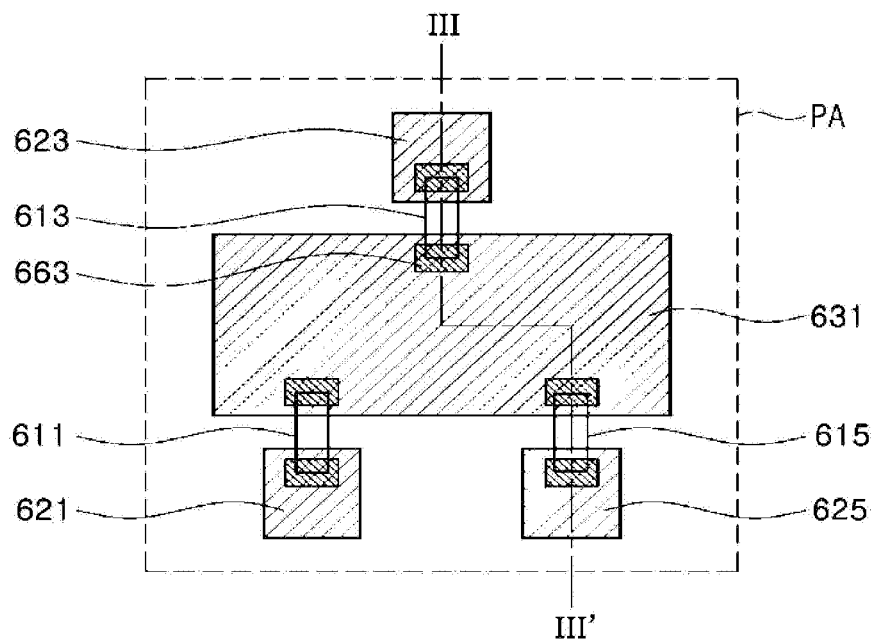
Figure 36B:
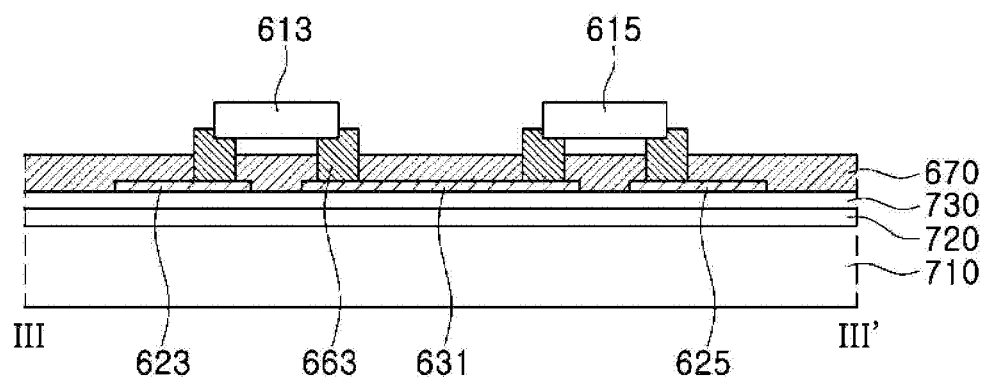

Referring to FIG. 36A and FIG. 36B, first to third light emitting devices 611, 613, 615 are mounted on the initial substrate 710, to which the second conductive bonding layer 663 is provided. Each of the first to third light emitting devices 611, 613, 615 is disposed on the second conductive bonding layer 663, such that the first terminal and the second terminal of the light emitting device correspond to the corresponding connection electrodes. Then, the second conductive bonding layer 663 may be cured.

Figure 37A:
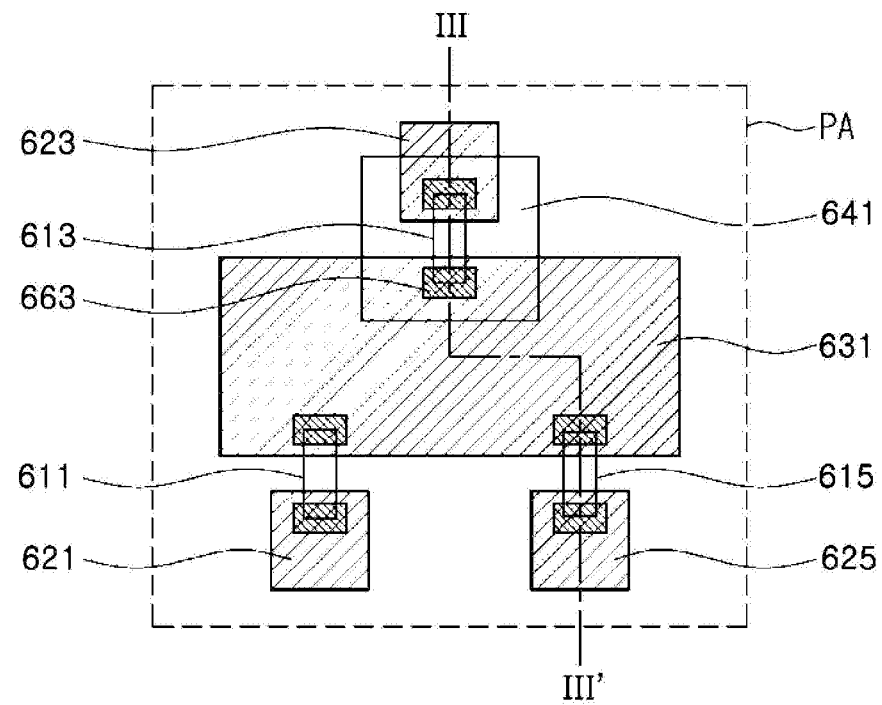
Figure 37B:
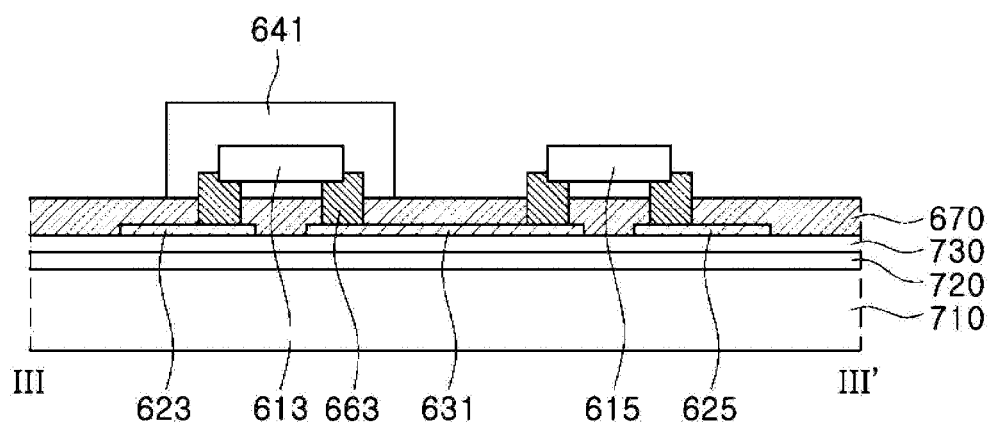

Referring to FIG. 37A and FIG. 37B, a color conversion layer 641 is formed on the initial substrate 710, on which the first to third light emitting devices 611, 613, 615 are disposed. The color conversion layer 641 may be formed by various methods, for example, a lift-off process using photolithography.

Figure 38A:
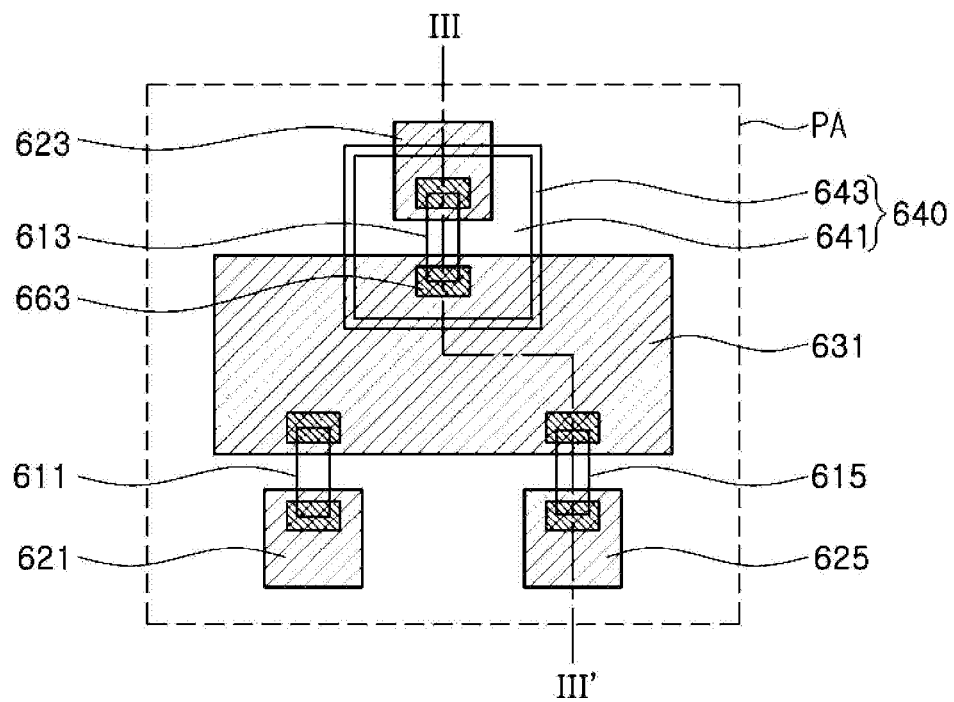
Figure 38B:
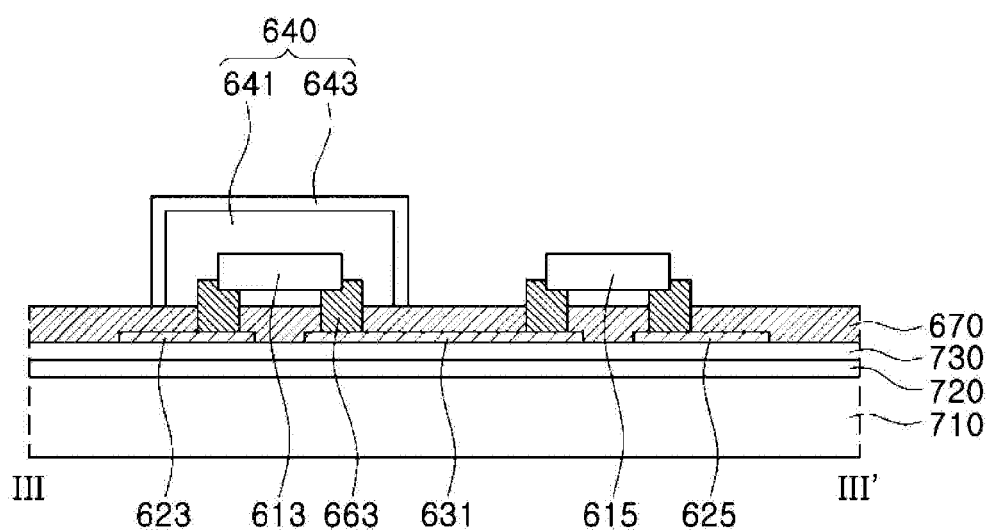

Referring to FIG. 38A and FIG. 38B, a color filter layer 643 may be formed on the color conversion layer 641. The color filter layer 643 may be formed by photolithography.

In an exemplary embodiment, the process of forming the color conversion layer 641 or the color filter layer 643 is selective, and thus can be omitted, as needed.

Figure 39:
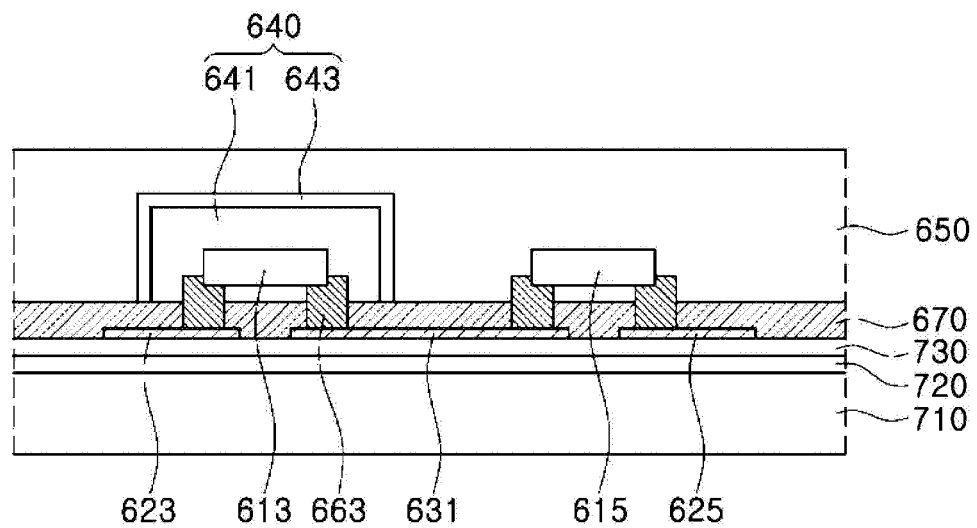

Referring to FIG. 39, an encapsulation layer 650 is formed on the initial substrate 710 on which the color converter 640 is formed. The encapsulation layer 650 may be formed by deposition and/or molding.

Figure 40:
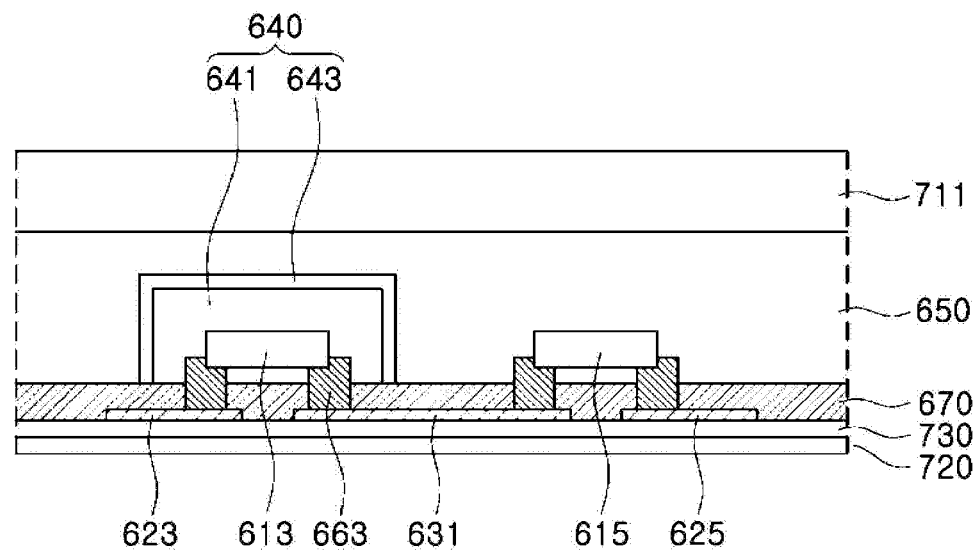

Referring to FIG. 40, the initial substrate 710 is removed. Before removal of the initial substrate 710, a first support substrate 711 is disposed on the encapsulation layer 650 to support and transfer of the formed structure, and then the initial substrate 710 is removed from the formed structure supported by the first support substrate 711.

The initial substrate 710 may be removed by a laser lift-off process, without being limited thereto. After removal of the initial substrate 710, the first and second insulation layers 720, 730 may be retained under the first to fourth connection electrodes 621, 623, 625, 631.

Figure 41:
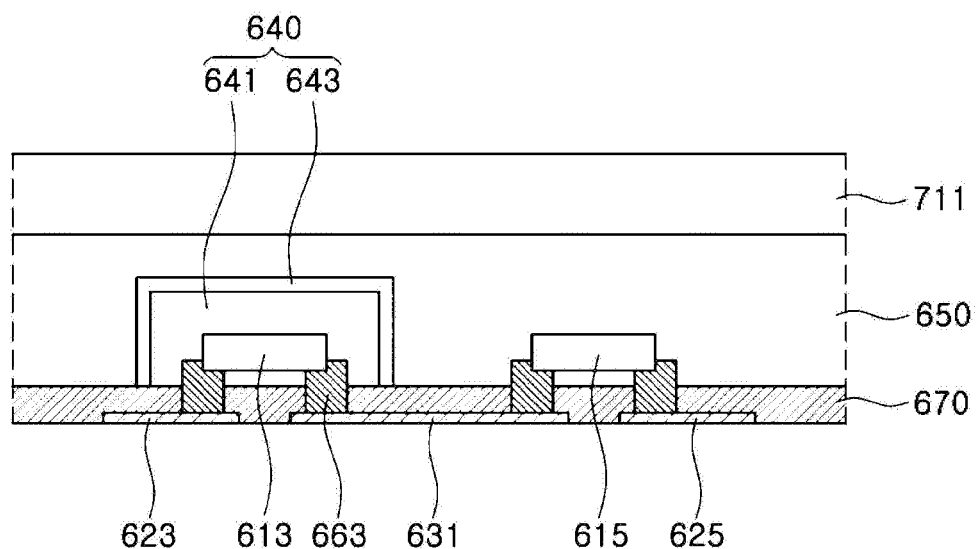

Referring to FIG. 41, with the formed structure supported by the first support substrate 711, the first and second insulation layers 720, 730 are removed from the first to fourth connection electrodes 621, 623, 625, 631. Although the first and second insulation layers 720, 730 can be removed by various methods, the first and second insulation layers 720, 730 may be removed by polishing according to the illustrated exemplary embodiment. As the first and second insulation layers 720, 730 are removed, the first to fourth connection electrodes 621, 623, 625, 631 are exposed.

Referring to FIG. 42, a second support substrate 713 is provided to the exposed lower surfaces of the first to fourth connection electrodes 621, 623, 625, 631, and the first support substrate 711 is removed. Then, the formed structure is cut to form one pixel unit.

In this case, cutting may be performed with the formed structure supported by the first support substrate 711. Alternatively, cutting may be performed after preparing a separate support substrate 713 as shown in the drawing, and transferring the formed structure to the separate second support substrate 713. In the process of cutting the formed structure, various cutters CT, for example, a laser, a blade, and the like, may be used. In some exemplary embodiments, cutting may be performed by etching.

In an exemplary embodiment, the formed structure may be cut corresponding to one pixel unit. In this case, the one pixel unit may include the first to third light emitting devices 611, 613, 615. However, according to some exemplary embodiments, the formed structure may be cut to include at least two pixel units.

Figure 43:
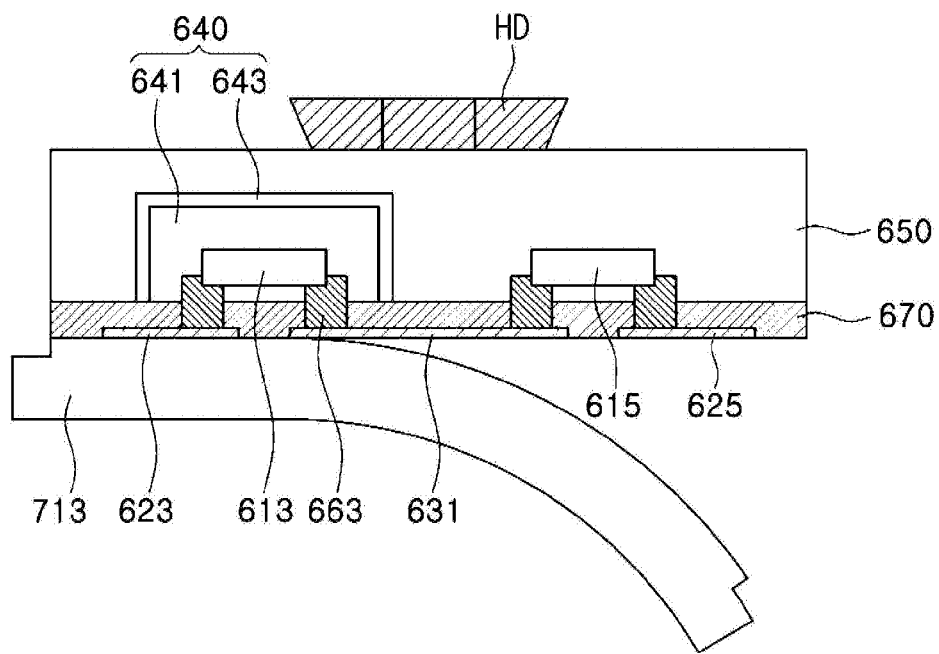

Referring to FIG. 43, the pixel unit formed by cutting is picked up by a device capable of moving the pixel unit, for example, a pick-up holder HD, and the second support substrate 713 is removed therefrom.

Figure 44:
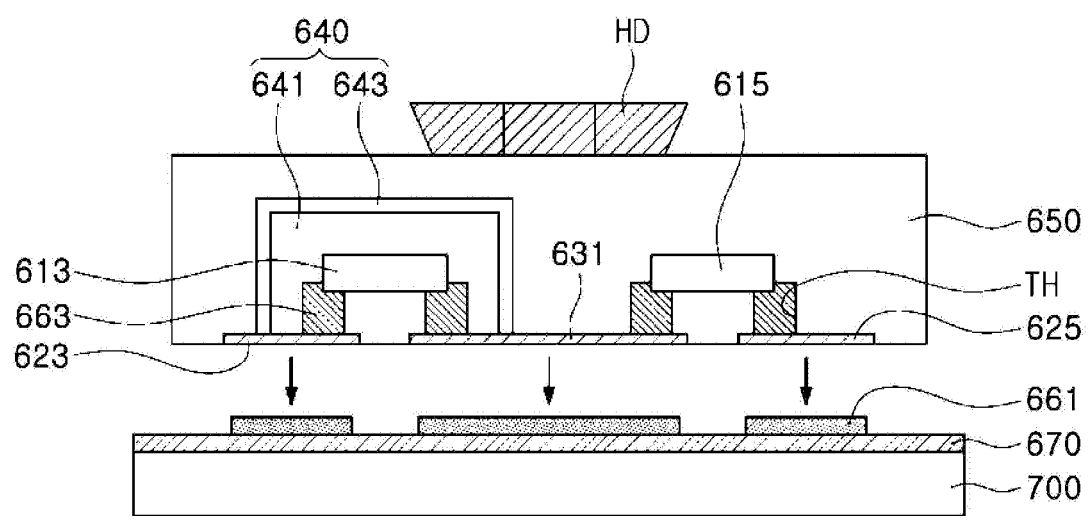

Referring to FIG. 44, the pixel unit picked up by the pick-up holder HD is seated on the base substrate 700 having the interconnection part and the second conductive bonding layer 663 formed thereon, thereby forming a final display device.

As described above, multiple pixel units are simultaneously formed and disposed on the base substrate to be connected to one another thereon, thereby enabling manufacture of display devices having various areas and various shapes. In this case, the light non-transmitting layer can be formed in formation of the pixel units, thereby facilitating manufacture of a display device having improved color purity and color reproducibility.

Figure 45A:
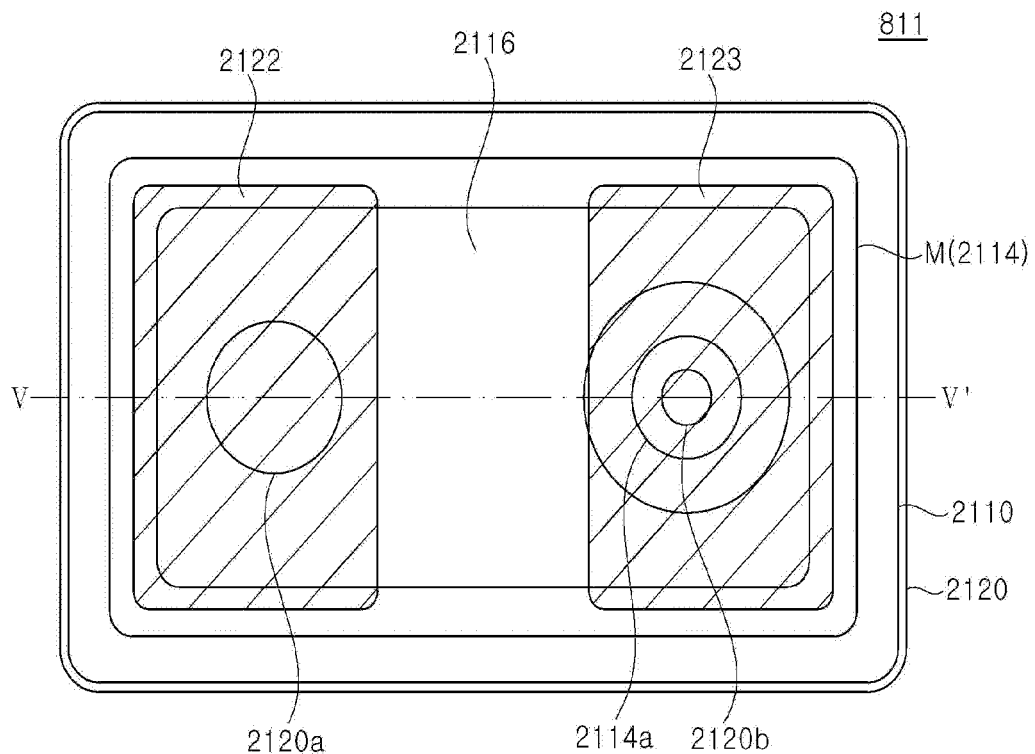
FIG. 45A is a schematic plan view of a light emitting device according to yet another exemplary embodiment.
Figure 45B:
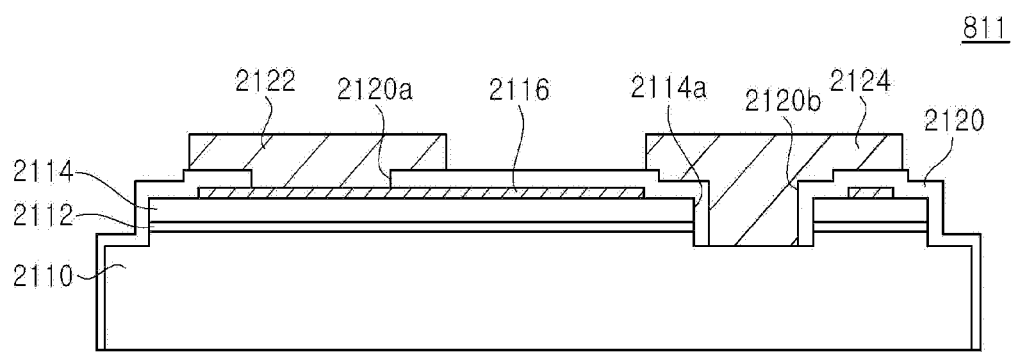
FIG. 45B is a schematic cross-sectional view taken along line V-V' of FIG. 45A.

FIG. 45A is a schematic plan view of a light emitting device 811 according to yet another exemplary embodiment, and FIG. 45B is a schematic cross-sectional view taken along line V-V' of FIG. 45A. Although the following description is given with reference to a first light emitting device 811 among the light emitting devices used in pixels P, the same may be also applicable to other light emitting devices, for example, second and third light emitting devices 813, 815.

Referring to FIG. 45A and FIG. 45B, the first light emitting device 811 may include a first conductivity type semiconductor layer 2110, an active layer 2112, a second conductivity type semiconductor layer 2114, an ohmic contact layer 2116, an insulation layer 2120, a first terminal 2122, and a second terminal 2124.

The first conductivity type semiconductor layer 2110, the active layer 2112, and the second conductivity type semiconductor layer 2114 may be grown on the substrate. The substrate may be selected from among various growth substrates, such as a gallium nitride substrate, a GaAs substrate, a Si substrate, and a sapphire substrate, more particularly, a patterned sapphire substrate, which can be used for growth of semiconductor layers. The growth substrate may be separated from the semiconductor layers by mechanical polishing, laser lift-off, chemical lift-off, and the like. However, the inventive concepts are not limited thereto. For example, in some exemplary embodiments, a portion of the substrate may be retained to form at least a portion of the first conductivity type semiconductor layer 2110.

In an exemplary embodiment, for a light emitting device emitting green light, the semiconductor layers may include indium gallium nitride (InGaN), gallium nitride (GaN), gallium phosphide (GaP), aluminum gallium indium phosphide (AlGaInP), and aluminum gallium phosphide (AlGaP). In another exemplary embodiment, for a light emitting device emitting red light, the semiconductor layers may include aluminum gallium arsenide (AlGaAs), gallium arsenide phosphide (GaAsP), aluminum gallium indium phosphide (AlGaInP), and gallium phosphide (GaP). In a further exemplary embodiment, for a light emitting device emitting blue light, the semiconductor layers may include gallium nitride (GaN), indium gallium nitride (InGaN), and zinc selenide (ZnSe).

As described above, the semiconductor layers include the first conductivity type semiconductor layer 2110, the active layer 2112, and the second conductivity type semiconductor layer 2114. The first conductivity type and the second conductivity type have opposite polarities. When the first conductivity type is n-type, the second conductivity type is p-type, and when the first conductivity type is p-type, the second conductivity type is n-type.

The first conductivity type semiconductor layer 2110, the active layer 2112, and the second conductivity type semiconductor layer 2114 may be grown on the substrate in a chamber by a method well-known in the art, such as metal organic chemical vapor deposition (MOCVD). In addition, the first conductivity type semiconductor layer 2110 includes n-type dopants, for example, Si, Ge, and Sn, and the second conductivity type semiconductor layer 2114 includes p-type dopants, for example, Mg, Sr, and Ba. In an exemplary embodiment, the first conductivity type semiconductor layer 2110 may include GaN or AlGaN including Si as dopants, and the second conductivity type semiconductor layer 2114 may include GaN or AlGaN including Mg as dopants.

Although the first conductivity type semiconductor layer 2110 and the second conductivity type semiconductor layer 2114 are illustrated as a single layer in the drawings, each of these semiconductor layers may be formed as multiple layers and may include a super-lattice layer. The active layer 2112 may include a single quantum well structure or a multi-quantum well structure, and the composition of the nitride semiconductor for the active layer 2112 may be adjusted to emit light in a desired wavelength band. For example, the active layer 1112 may emit blue light, green light, red light, or UV light.

The second conductivity type semiconductor layer 2114 and the active layer 2112 may be disposed in a mesa M structure on the first conductivity type semiconductor layer 2110. The mesa M may include the second conductivity type semiconductor layer 2114 and the active layer 2112, and may also include a portion of the first conductivity type semiconductor layer 2110, as shown in FIG. 45B. The mesa M may be placed in some regions of the first conductivity type semiconductor layer 2110, and an upper surface of the first conductivity type semiconductor layer 2110 may be exposed around the mesa M.

In addition, the mesa M may have a through-hole 2114a that exposes the first conductivity type semiconductor layer 2110. The through-hole 2114a may be disposed close to one edge of the mesa M, without being limited thereto. Alternatively, the through-hole 2114 may be disposed at a center of the mesa M.

The ohmic contact layer 2116 is disposed on the second conductivity type semiconductor layer 2114 to form ohmic contact with the second conductivity type semiconductor layer 2114. The ohmic contact layer 2116 may be formed as a single layer or multiple layers, and may be a transparent conductive oxide layer or a metal layer. The transparent conductive oxide layer may be formed of, for example, ITO or ZnO, and the metal layer may be formed of, for example, metal, such as Al, Ti, Cr, Ni, and Au, or alloys thereof.

The insulation layer 2120 covers the mesa M and the ohmic contact layer 2116. Further, the insulation layer 2120 may cover the upper and side surfaces of the first conductivity type semiconductor layer 2110 exposed around the mesa M. On the other hand, the insulation layer 2120 may include an opening 2120a, which exposes the ohmic contact layer 2116, and an opening 2129b disposed in the through-hole 2114a to expose the first conductivity type semiconductor layer 2110. The insulation layer 2120 may be formed as a single layer or multiple layers of silicon oxide or silicon nitride. Further, the insulation layer 2120 may include an insulation reflector, such as a distributed Bragg reflector.

The first terminal 2122 and the second terminal 2124 are disposed on the insulation layer 2120. The first terminal 2122 may be electrically connected to the ohmic contact layer 2116 through the opening 2120a, and the second terminal 2124 may be electrically connected to the first conductivity type semiconductor layer 2110 through the opening 2020b.

The first and/or second terminal(s) 2122, 2124 may be formed as a single metal layer or multiple metal layers. The first and/or second terminal(s) 2122, 2124 may be formed of metal, such as Al, Ti, Cr, Ni, Au, and the like, or alloys thereof.

Although the light emitting device according to the illustrated exemplary embodiment is briefly described above with reference to the drawings, the light emitting device may further include additional layers having other functions in addition to the layers described above. For example, the light emitting device may further include various layers, such as a reflective layer adapted to reflect light, an additional insulation layer adapted to insulate a certain component, an anti-solder diffusion layer adapted to prevent diffusion of solder, and the like.

Furthermore, the mesa may be formed in various shapes, and the locations or shapes of the first and second terminals 2122, 2124 may be changed in various ways in formation of a flip-chip type light emitting device. In addition, in some exemplary embodiments, the ohmic contact layer 2116 may be omitted, and in this case, the first terminal 2122 may be formed to directly contact the second conductivity type semiconductor layer 2114. Further, as in the light emitting devices 511, 611 described above, a second contact layer is formed on the first conductivity type semiconductor layer 2110 and the second terminal 2124 may be connected to the second contact layer.

Figure 46A:
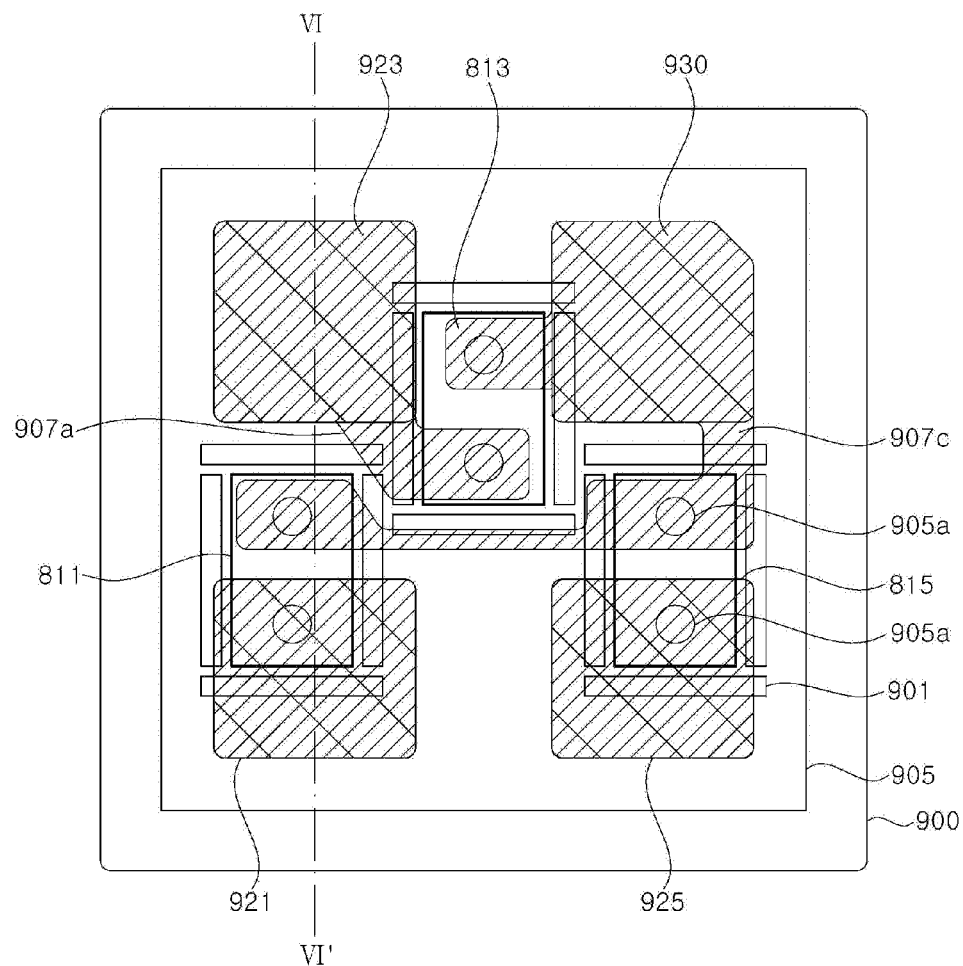
FIG. 46A is a schematic plan view of a pixel region according to yet another exemplary embodiment.
Figure 46B:
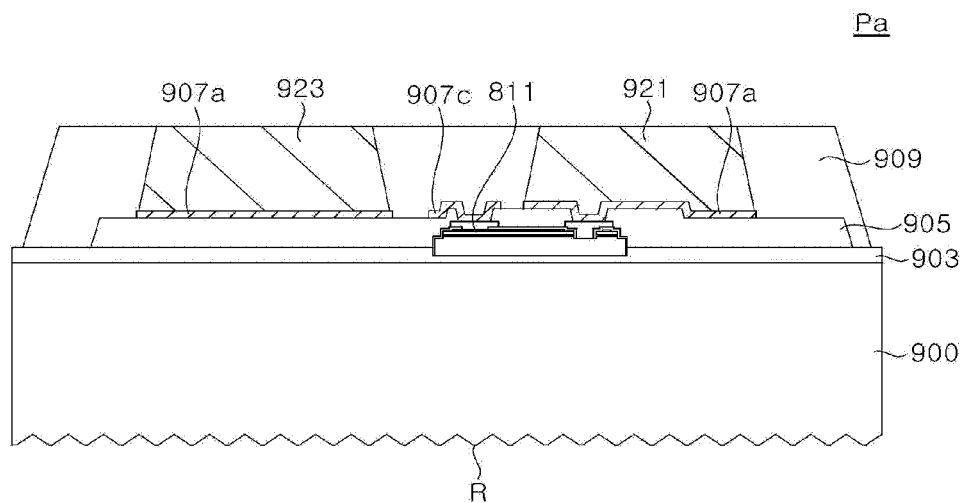
FIG. 46B is a schematic cross-sectional view taken along line VI-VI' of FIG. 46A.

FIG. 46A is a schematic plan view of a pixel region Pa according to yet another exemplary embodiment, and FIG. 46B is a schematic cross-sectional view taken along line VI-VI' of FIG. 46A. Here, the pixel region Pa indicates a region of a light emitting module or a pixel unit, in which at least one pixel P is disposed.

Referring to FIG. 46A and FIG. 46B, the pixel region Pa may include a base substrate 900, first to third light emitting devices 811, 813, 815, alignment markers 901, a bonding layer 903, a step regulation layer 905, connection layers 907a, 907b, 907c, bumps 921, 923, 925, 930, and a protective layer 909.

In the above exemplary embodiments, the base substrate 105 includes the signal lines 113 and the common lines 115. On the other hand, the base substrate 900 according to the illustrated exemplary embodiment does not include circuits. The base substrate 900 is a light transmitting substrate, such as a glass substrate, quartz, and a sapphire substrate.

Although one pixel region Pa is illustrated in the drawings, multiple pixels P may be formed on the base substrate 900 and details of this structure will be described below.

The base substrate 900 is disposed on a light exit surface of the display device, and light emitted from the light emitting devices 811, 813, 815 is discharged through the base substrate 900. The base substrate 900 may include roughness on the light exit surface to improve efficiency in light emission while emitting more uniform light. The base substrate 900 may have a thickness of, for example, 50 μm to 500 μm.

The bonding layer 903 is attached to the base substrate 900. The bonding layer 903 may be formed on the overall upper surface of the base substrate 900 to attach the light emitting devices 811, 813, 815 thereto.

The bonding layer 903 is a light transmitting layer, and thus, allows light emitted from the light emitting devices 811, 813, 815 to pass therethrough. The bonding layer 903 may include light diffusers, such as $SiO_2$, $TiO_2$, ZnO, and the like, to diffuse light. The light diffusers prevent the light emitting devices 811, 813, 815 from being observed at a side of the light exit surface. Further, the bonding layer 903 may include a light absorption material, such as carbon black. The light absorption material prevents light generated from the light emitting devices 811, 813, 815 from leaking from regions between the base substrate 900 and the light emitting devices 811, 813, 815 towards a lateral side, and improves contrast of the display device.

The alignment markers 901 mark locations for disposition of the first to third light emitting devices 811, 813, 815. The alignment markers 901 may be formed on the base substrate 900 or the bonding layer 903.

The first to third light emitting devices 811, 813, 815 are disposed in regions marked by the alignment markers 901, respectively. The first to third light emitting devices 811, 813, 815 may be, for example, a green light emitting device, a red light emitting device, and a blue light emitting device, respectively. In the illustrated exemplary embodiment, the first to third light emitting devices 811, 813, 815 are disposed in a triangular shape, without being limited thereto.

Alternatively, the first to third light emitting devices 811, 813, 815 may be linearly disposed.

Although the first to third light emitting devices 811, 813, 815 may be the same as those described with reference to FIG. 45A and FIG. 45B, the inventive concepts are not limited thereto, and various light emitting devices such as horizontal or flip-chip type light emitting devices may be used.

The step regulation layer 905 covers the first to third light emitting devices 811, 813, 815. The step regulation layer 905 has openings 905*a* that expose first and second terminals 2122, 2124 of the light emitting devices. The step regulation layer 905 may be formed to secure a uniform height of bumps to be formed thereon. The step regulation layer 905 may be formed of, for example, polyimide.

The connection layers 907*a*, 907*c* are formed on the step regulation layer 905. The connection layers 907*a*, 907*c* are connected to the first and second terminals 2122, 2124 of the first to third light emitting devices 811, 813, 815 through the openings 905*a* of the step regulation layer 905.

For example, the connection layers 907*a* are electrically connected to the first conductivity type semiconductor layer of the second light emitting device 813, and the connection layer 907*c* is electrically commonly connected to the second conductivity type semiconductor layers of the first to third light emitting devices 811, 813, 815. The connection layers 907*a*, 907*c* may be formed together on the step regulation layer 905 and may include, for example, Au.

The bumps 921, 923, 925, 930 are formed on the connection layers 907*a*. For example, a first bump 921 may be electrically connected to the first conductivity type semiconductor layer of the first light emitting device 811 through the connection layer 907*a*, a second bump 923 may be electrically connected to the first conductivity type semiconductor layer of the second light emitting device 813 through the connection layer 907*a*, and a third bump 925 may be electrically connected to the first conductivity type semiconductor layer of the third light emitting device through the connection layer 907*a*. A fourth bump 930 may be commonly connected to the second conductivity type semiconductor layers of the first to third light emitting devices 811, 813, 815 through the connection layer 907*c*. The bumps 921, 923, 925, 930 may be formed of, for example, solders.

The protective layer 909 may cover side surfaces of the bumps 921, 923, 925, 930 and the step regulation layer 905. In addition, the protective layer 909 may cover the bonding layer 903 exposed around the step regulation layer 905. The protective layer 909 may be formed of, for example, a photosensitive solder resist (PSR). Accordingly, after the protective layer 909 is subjected to patterning through photolithography and development, the bumps 921, 923, 925, 930 may be formed using the solders. The protective layer 909 may be formed of a white reflective material or a light absorption material, such as a black epoxy resin, to prevent light leakage.

Figure 47A:
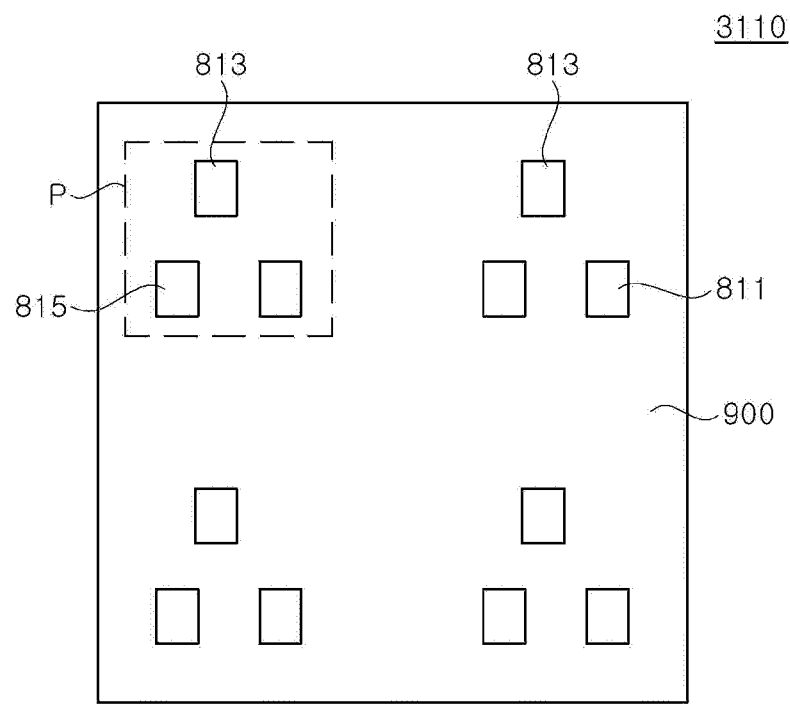
FIGS. 47A, 47B, and 47C are a schematic plan view, a rear view, and a cross-sectional view of a light emitting module according to yet another exemplary embodiment, respectively.
Figure 47B:
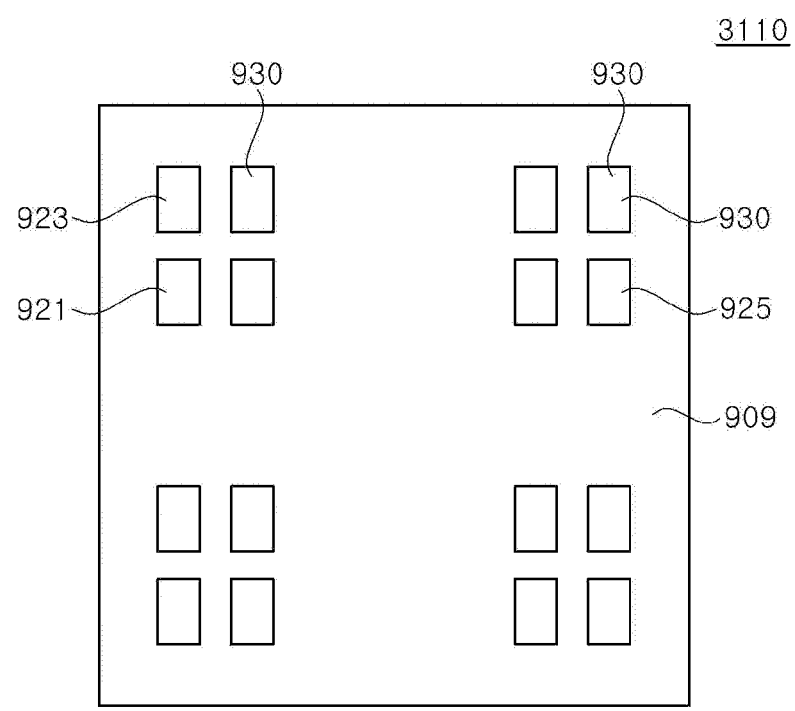
Figure 47C:
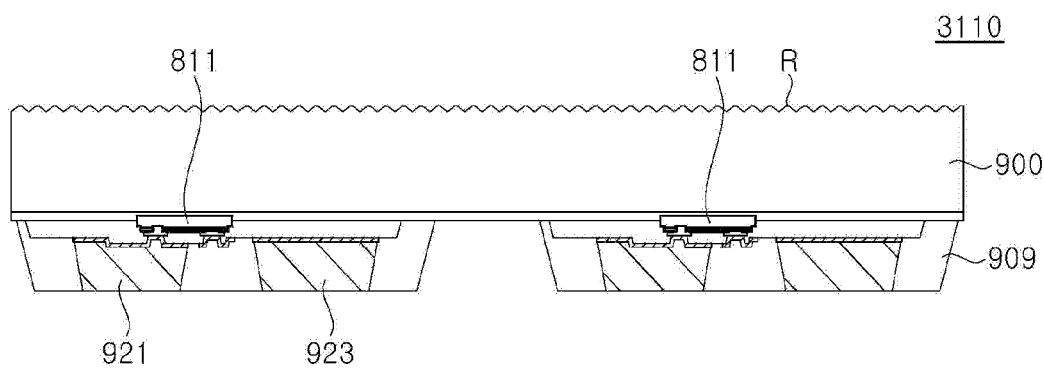

FIG. 47A, FIG. 47B, and FIG. 47C are a schematic plan view, a rear view and a cross-sectional view of a light emitting module 3110 according to yet another exemplary embodiment, respectively. In the illustrated exemplary embodiment, the light emitting module includes multiple pixels P on one base substrate 900.

Referring to FIG. 47A, FIG. 47B and FIG. 47C, the light emitting module 3110 includes multiple pixels P on the one base substrate 900. As described with reference to FIG. 46A and FIG. 46B, each of the pixels includes first to third light emitting devices 811, 813, 815, that is, first to third sub-pixels, and the bumps 921, 923, 925, 930.

The base substrate 900 is disposed at a light exit surface side of the light emitting module, and is disposed above the first to third light emitting devices 811, 813, 815, as shown in FIG. 47A. As described above, the first to third light emitting devices 811, 813, 815 may be attached to the base substrate 900 via a bonding layer 903. The bonding layer 903 may be disposed as a continuous layer on the base substrate 900, and may include the light diffusers and/or the light absorption material, as described above.

Each of the pixel regions Pa is the same as the pixel region described with reference to FIG. 46A and FIG. 46B, and thus, repeated descriptions thereof will be omitted to avoid redundancy. On the other hand, the protective layer 909 may be divided into pixel units without being limited thereto. Alternatively, the protective layer 909 may be continuously formed over the multiple pixel regions.

In the illustrated exemplary embodiment, the light emitting module 3110 includes four pixels P, but is not limited thereto. For example, in some exemplary embodiments, the light emitting module 3110 may include various numbers of pixels.

Figure 48A:
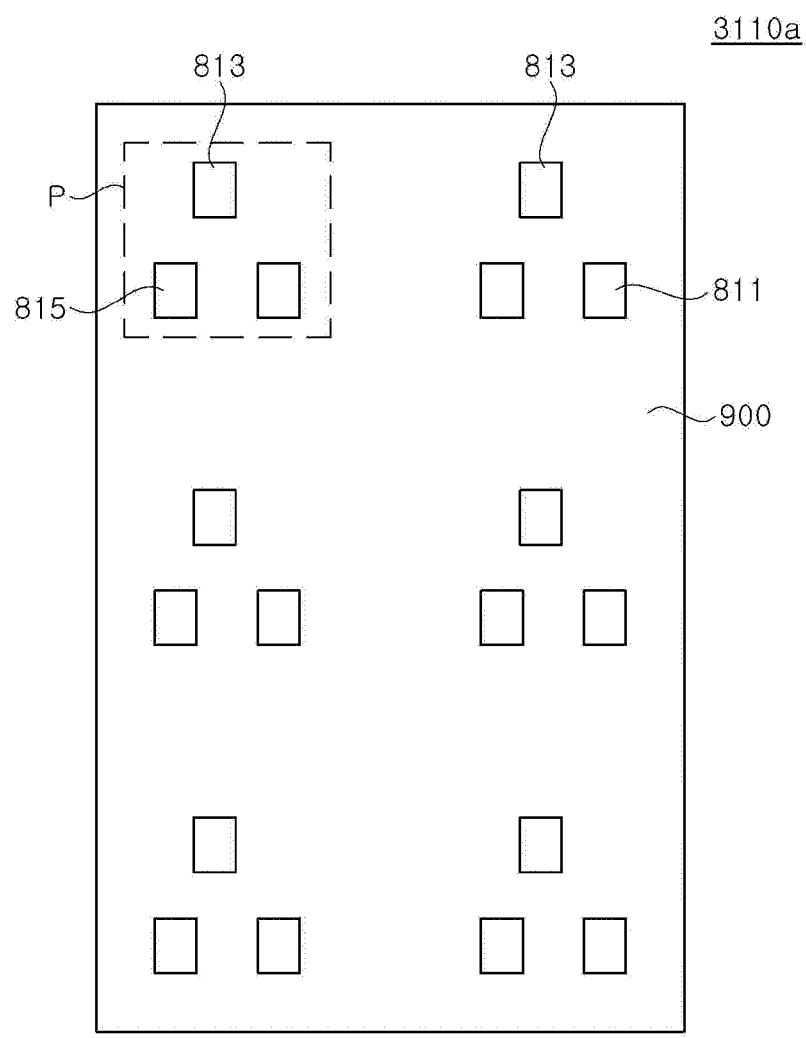
FIGS. 48A, 48B, and 48C are schematic plan views of light emitting modules having various sizes according to exemplary embodiments.
Figure 48B:
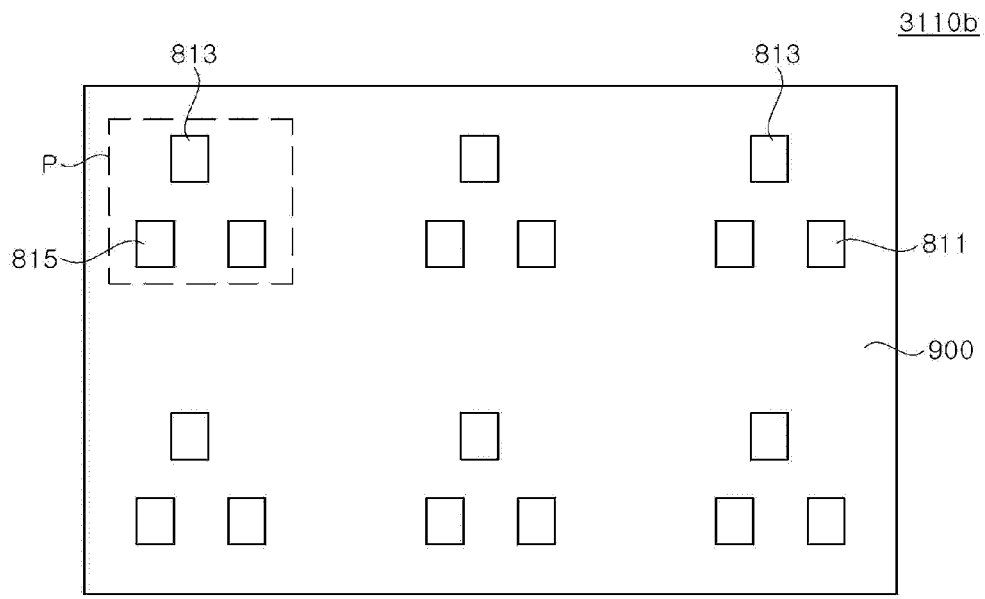
Figure 48C:
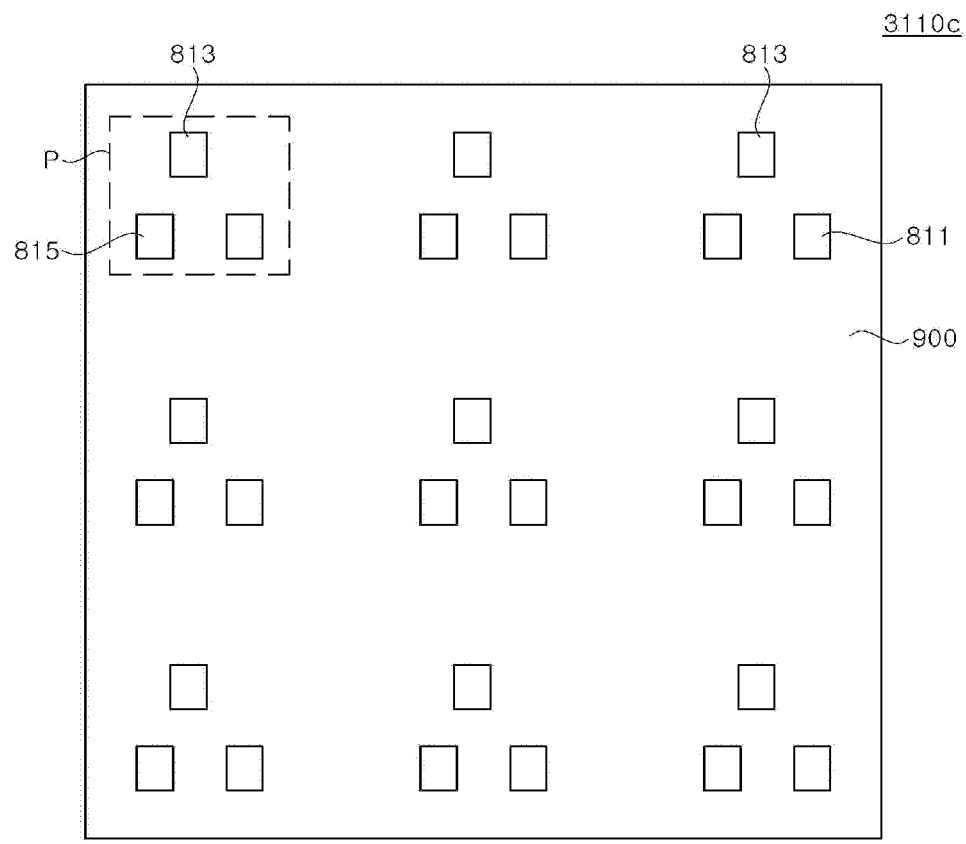

FIG. 48A, FIG. 48B, and FIG. 48C are schematic plan views of light emitting modules having various sizes according to exemplary embodiments.

Referring to FIG. 48A, a light emitting module 3110*a* according to an exemplary embodiment includes 6 pixels arranged in a 3×2 matrix.

Referring to FIG. 48B, a light emitting module 3110*b* according to another exemplary embodiment includes 6 pixels arranged in a 2×3 matrix.

Referring to FIG. 48C, a light emitting module 3110*c* according to a further exemplary embodiment includes 9 pixels arranged in a 3×3 matrix.

FIG. 48A, FIG. 48B, FIG. 48C show examples of the sizes of various light emitting modules, but the inventive concepts are not limited thereto. The light emitting module in other exemplary embodiments may include, for example, a single pixel P or more pixels.

For example, after a number of pixels is formed on a 3-inch or larger base substrate 900, the base substrate 900 may be divided into regions including good pixels through a test, thereby providing light emitting modules having various sizes. Exemplary embodiments may provide display devices using the light emitting modules having various sizes.

Figure 49A:
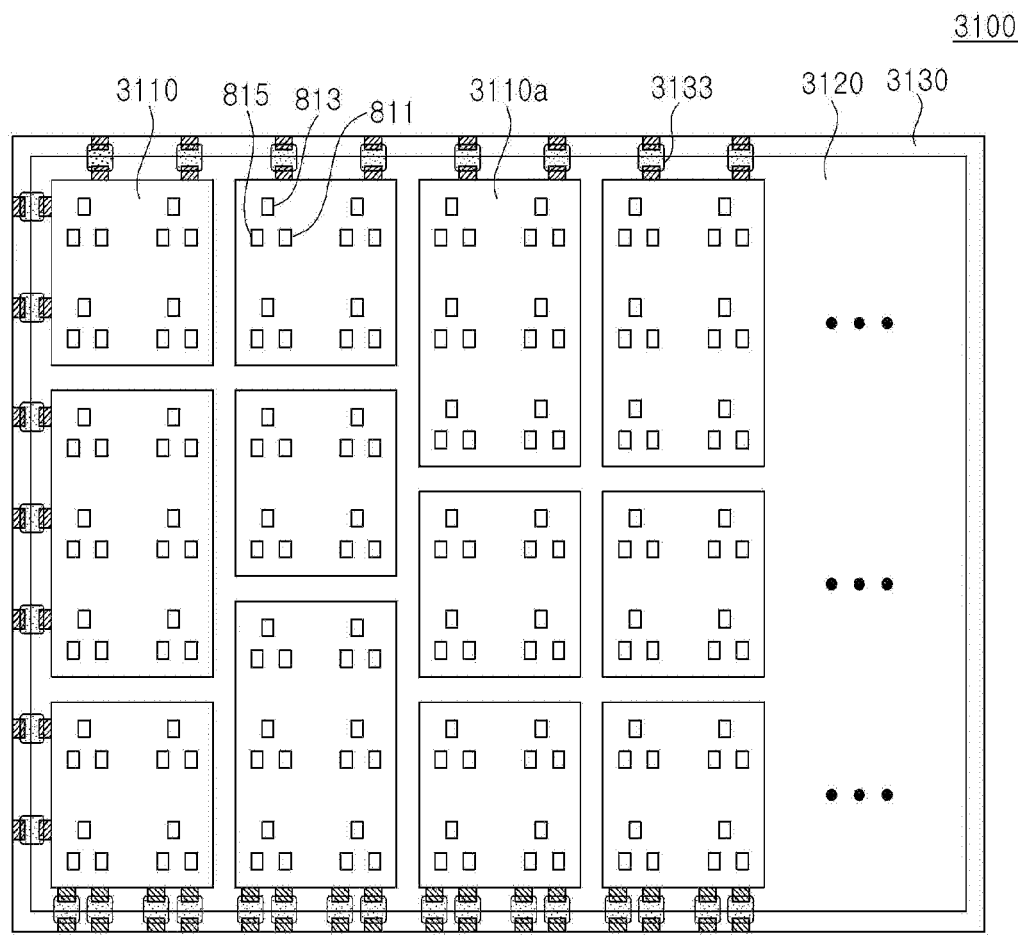
FIGS. 49A and 49B are a schematic plan view and a cross-sectional view of a display device according to yet another exemplary embodiment, respectively.
Figure 49B:
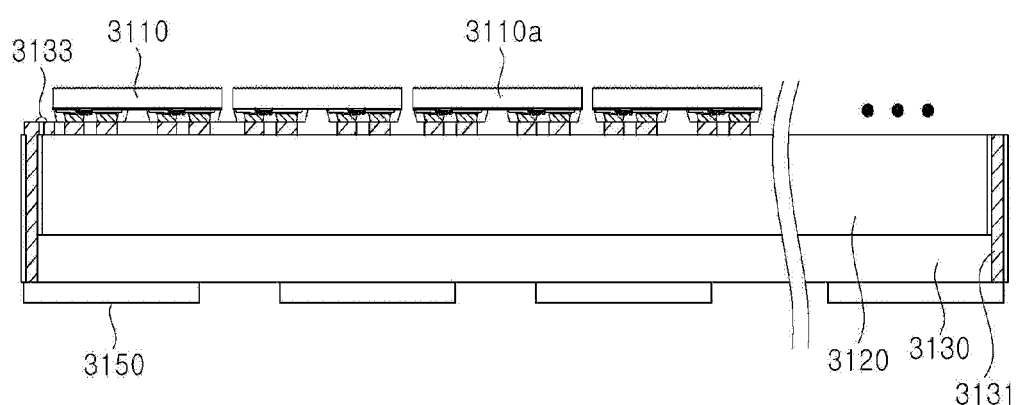

FIG. 49A and FIG. 49B are a schematic plan view and a cross-sectional view of a display device 3100 according to yet another exemplary embodiment, respectively.

Referring to FIG. 49A and FIG. 49B, the display device 3100 according to the illustrated exemplary embodiment includes a printed circuit board 3130, an interposer substrate 3120, and multiple light emitting modules 3110, 3110*a*, and may further include a drive IC 3150.

The light emitting modules 3110, 3110*a* are the same as those described above, and thus, repeated descriptions thereof will be omitted to avoid redundancy. In addition, according to the illustrated exemplary embodiment, the light emitting modules 3110, 3110*a* may be disposed together with other light emitting modules 3110*b*, 3110*c*, for example, having different sizes than the light emitting modules 3110, 3110*a*.

The printed circuit board 3130 includes circuits 3131 to supply signal current to the light emitting modules 3110 3110*a*. The printed circuit board 3130 may include a groove to receive the interposer substrate 3120 therein.

The drive ICs 3150 may be connected to a rear surface of the printed circuit board 3130, and may include circuits for driving the light emitting modules 3110, 3110a.

The light emitting modules 3110, 3110a are mounted on the interposer substrate 3120. The multiple light emitting modules 3110, 3110a may be mounted on one interposer substrate 3120. Furthermore, the interposer substrate 3120 may cover the overall area of the display device 3100, thereby simplifying manufacturing process of the display device 3100.

Figure 50:
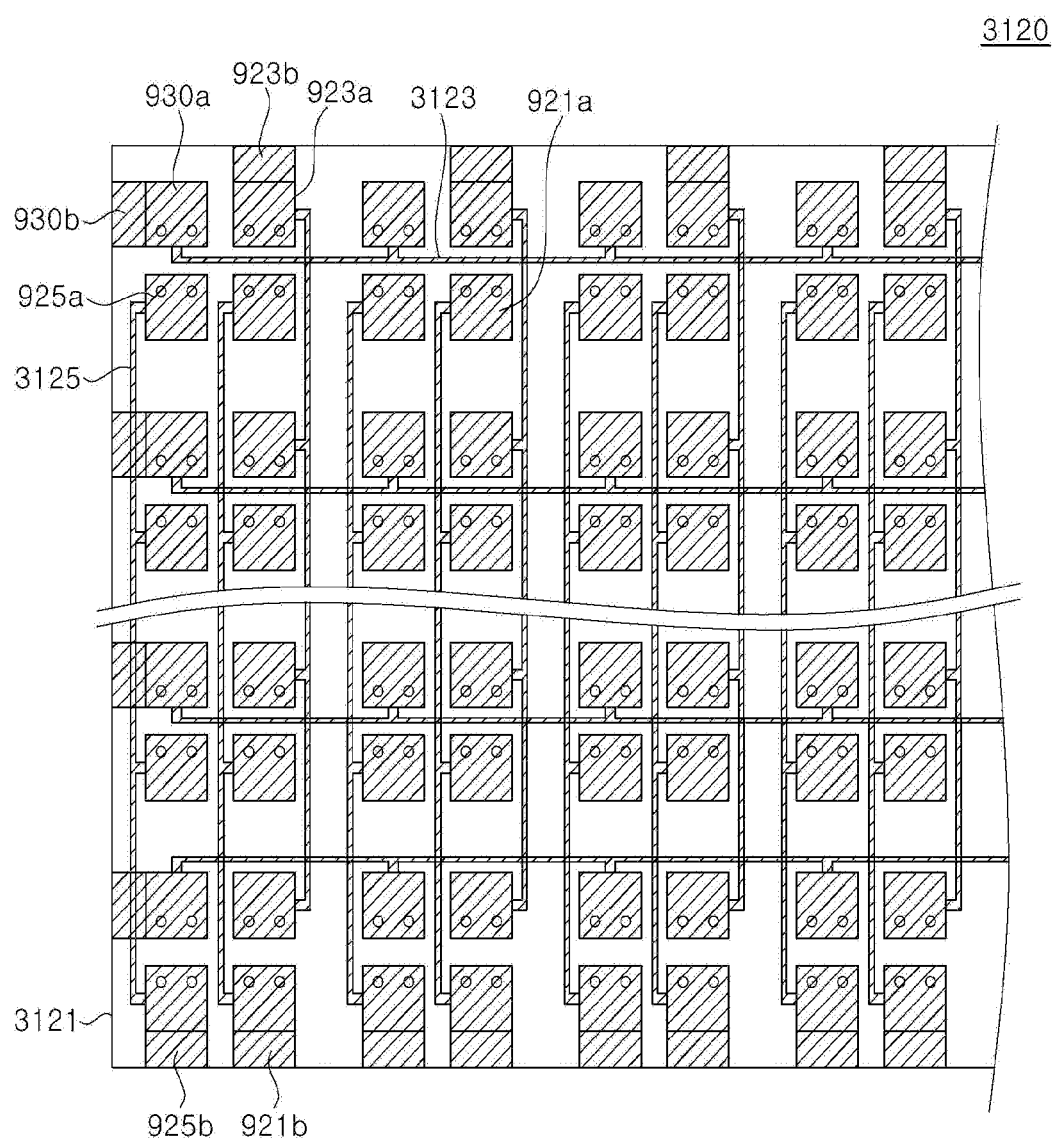
FIG. 50 is a schematic plan view illustrating an interposer substrate used in the display device according to an exemplary embodiment.

The interposer substrate 3120 may include signal lines 3125 and common lines 3123 on an upper surface thereof, as shown in FIG. 50. Further, the printed circuit board 3130 may include pads 921b, 923b, 925b, 930b for electrical connection to other pads. These pads 921b, 923b, 925b, 930b may be electrically connected to pads on the printed circuit board 3130 through connectors 3133. The connectors 3133 may include, for example, anisotropic conductive pastes, solder pastes, bonding wires, and the like.

Although FIG. 50 shows circuit patterns, these circuit patterns may be formed in a bilayer structure or a tri-layer structure, which may be separated by an insulation layer. Furthermore, the interposer substrate 3120 may be provided on the surface thereof with connection pads 921a, 923a, 925a, 930a, to which bumps 921, 923, 925, 930 of the light emitting modules 3110, 3110a are connected, and the signal lines 3125 and the common lines 3123 are electrically connected to these connection pads 921a, 923a, 925a, 930a.

Use of the interposer substrate 3120 allows formation of circuits in a broad pitch on the printed circuit board 3130, and the signal lines 3125 and the common lines 3123 may be formed in fine sizes on the interposer substrate 3120.

Figure 51A:
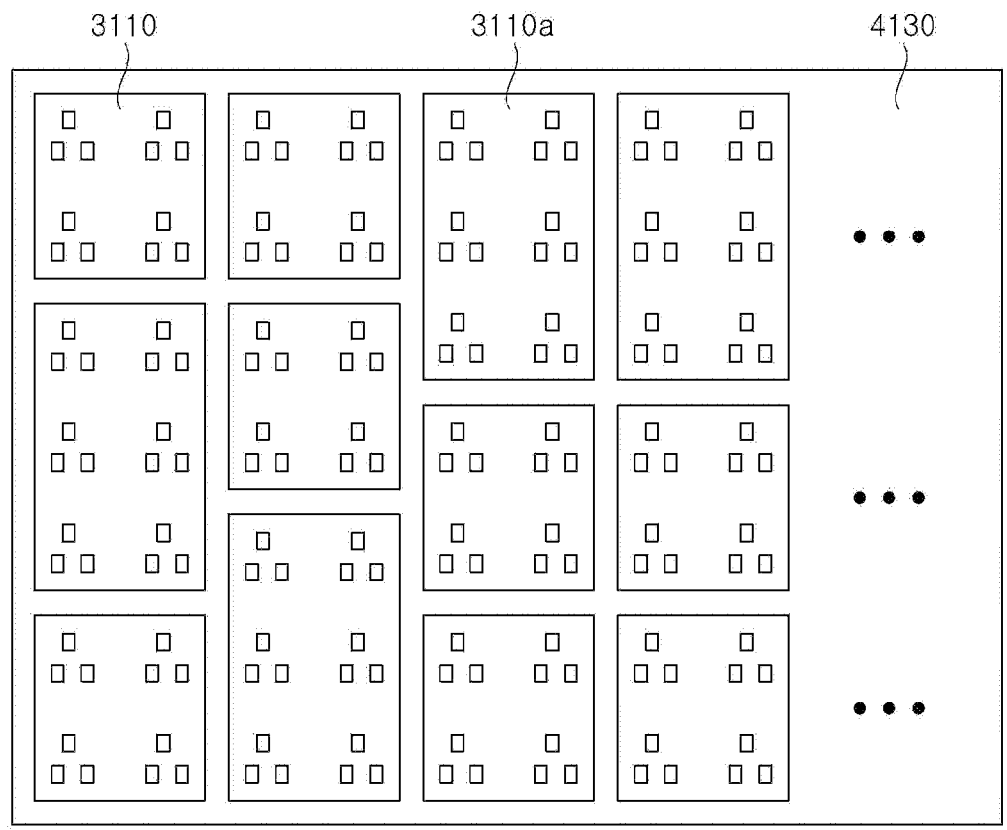
FIGS. 51A and 51B are a schematic plan view and a cross-sectional view of a display device according to yet another exemplary embodiment, respectively.
Figure 51B:
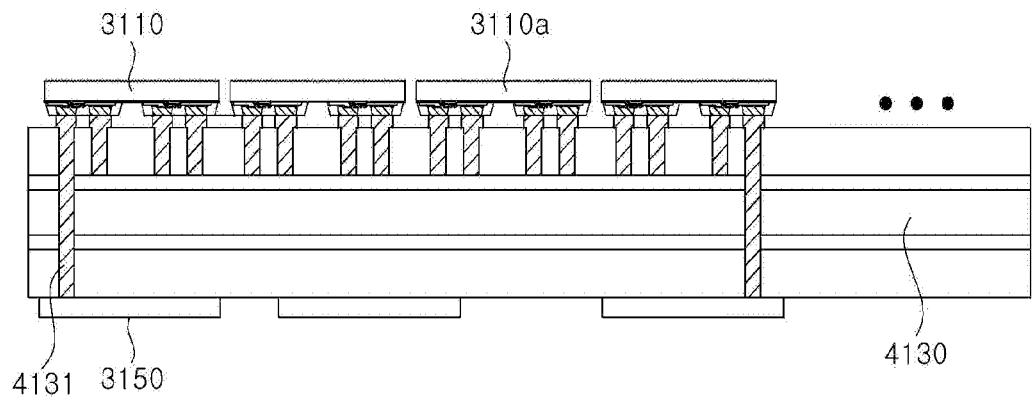

FIG. 51A and FIG. 51B are a schematic plan view and a cross-sectional view of a display device 4100 according to yet another exemplary embodiment, respectively.

Referring to FIG. 51A and FIG. 51B, the display device 4100 according to the illustrated exemplary embodiment is generally similar to the display device 3100 described with reference to FIG. 49A and FIG. 49B, except that the interposer substrate 3120 is omitted and the light emitting modules 3110, 3110a are directly mounted on a printed circuit board 4130. The printed circuit board 4130 includes signal lines and common lines, and may be provided on a surface thereof with connection pads, to which the bumps 921, 923, 925, 930 are connected. The connection pads may be connected to the signal lines and the common lines through via-holes, and may be electrically connected to drive ICs 3150.

According to exemplary embodiments, a large display device is manufactured using normal light emitting modules manufactured through a process of transferring multiple light emitting diode chips and selected by testing, thereby reducing time for manufacturing a large display device.

In addition, each of light emitting modules is manufactured in a single unit and multiple light emitting modules are manufactured in a state of being coupled to a motherboard to remove tolerance between the light emitting modules, thereby improving performance of the large display device.

Exemplary embodiments provide a display device that has a simple structure and can be manufactured in various sizes. Further, the display device according to the exemplary embodiments can be manufactured by a simple method and facilitates easy removal of defects.

Exemplary embodiments also provide a display device having high levels of color purity and color reproduction.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a plurality of light emitting modules having a plurality of signal lines and a plurality of common lines arranged thereon, each light emitting module comprising a base layer and a plurality of light emitting diodes mounted on an upper surface of the base layer and electrically connected to the signal lines and the common lines, respectively;
a motherboard coupled to the light emitting modules; and
a bonding layer having electrical conductivity and coupling the light emitting modules to the motherboard,
wherein:
each of the light emitting modules includes a plurality of signal line terminals and a plurality of common line terminals disposed on a lower surface of the base layer and electrically connected to the signal lines and the common lines, respectively; and
the motherboard includes a plurality of board signal line terminals and a plurality of board common line terminals disposed on an upper surface thereof at locations corresponding to the signal line terminals and the common line terminals of the light emitting modules.

2. The display device according to claim 1, wherein:
the signal line terminals formed on adjacent light emitting modules are electrically connected to each other by the board signal line terminals formed on the motherboard and the bonding layer; and
the common line terminals formed on adjacent light emitting modules are electrically connected to each other by the board common line terminals formed on the motherboard and the bonding layer.

3. The display device according to claim 1, wherein the bonding layer comprises one of an anisotropic conductive film (ACF), anisotropic conductive pastes (ACP), self-assembly pastes (SAP/epoxy+Sn-Bi), eutectic, AuSn, AgSn, In, and solder pastes.

4. A display device comprising:
a plurality of light emitting modules having a plurality of signal lines and a plurality of common lines arranged thereon, each light emitting module comprising a plurality of light emitting diodes mounted on an upper surface thereof and electrically connected to the signal lines and the common lines, respectively;
a motherboard coupled to the light emitting modules;
a bonding layer coupling the light emitting modules to the motherboard; and
a coupling part,
wherein:
each of the light emitting modules includes a plurality of signal line terminals and a plurality of common line terminals disposed on the upper surface thereof and electrically connected to the signal lines and the common lines, respectively; and
the coupling part electrically connects the signal line terminals formed on adjacent light emitting modules to each other and common line terminals formed on adjacent light emitting modules to each other.

5. The display device according to claim 4, wherein the coupling part comprises bonding wires electrically connecting the adjacent signal line terminals to each other and the adjacent common line terminals to each other.

6. The display device according to claim 4, wherein the coupling part comprises an electrically conductive bonding layer electrically connecting the adjacent signal line terminals to each other by covering upper surfaces thereof and electrically connecting the adjacent common line terminals to each other by covering upper surfaces thereof.

7. The display device according to claim 6, wherein the bonding layer comprises one of an anisotropic conductive film (ACF), anisotropic conductive pastes (ACP), self-assembly pastes (SAP/epoxy+Sn-Bi), eutectic, AuSn, AgSn, In, and solder pastes.

8. The display device according to claim 4, wherein:
each of the light emitting modules further includes a plurality of lateral signal line terminals disposed on a side surface thereof at locations corresponding to the signal line terminals and a plurality of lateral common line terminals on the side surface thereof at locations corresponding to the common line terminals; and
the coupling part comprises an electrically conductive bonding layer electrically connecting adjacent lateral signal line terminals to each other and adjacent lateral common line terminals to each other.

9. The display device according to claim 8, wherein the bonding layer comprises one of an anisotropic conductive film (ACF), anisotropic conductive pastes (ACP), self-assembly pastes (SAP/epoxy+Sn-Bi), eutectic, AuSn, AgSn, In, and solder pastes.

10. A method for manufacturing a display device, comprising:
transferring a plurality of light emitting diodes to a base substrate having a plurality of signal lines and a plurality of common lines arranged thereon, the base substrate including a plurality of mounts provided on an upper surface thereof to which the light emitting diodes are mounted to be electrically connected to the signal lines and the common lines, respectively;
cutting the base substrate having the light emitting diodes mounted thereon into first regions to provide a plurality of light emitting modules;
forming a bonding layer having electrical conductivity on a motherboard; and
coupling the light emitting modules to the motherboard on which the bonding layer is disposed,
wherein:
each of the light emitting modules includes a plurality of signal line terminals and a plurality of common line terminals disposed on a lower surface thereof and electrically connected to the signal lines and the common lines, respectively; and
the motherboard includes a plurality of board signal line terminals and a plurality of board common line terminals disposed on an upper surface thereof at locations corresponding to the signal lines terminals and the common line terminals of the light emitting modules, respectively.

11. The method according to claim 10, wherein, in coupling the light emitting modules to the motherboard,
the light emitting modules are coupled to the motherboard such that the signal line terminals formed on adjacent light emitting modules are electrically connected to each other by the board signal line terminals formed on the motherboard and the bonding layer; and
the common line terminals formed on adjacent light emitting modules are electrically connected to each other by the board common line terminals formed on the motherboard and the bonding layer.

12. The method according to claim 10, wherein the bonding layer comprises one of an anisotropic conductive film (ACF), anisotropic conductive pastes (ACP), self-assembly pastes (SAP/epoxy+Sn-Bi), eutectic, AuSn, AgSn, In, and solder pastes.

13. The method according to claim 10, further comprising testing operation states of the light emitting diodes when the light emitting diodes are mounted on the base substrate,
wherein the light emitting modules are manufactured after testing the operation states of the light emitting diodes.

14. The method according to claim 13, wherein testing the light emitting diodes is performed for each of the multiple light emitting modules manufactured by cutting.

15. A method for manufacturing a display device, comprising:
transferring a plurality of light emitting diodes to a base substrate having a plurality of signal lines and a plurality of common lines arranged thereon, the base substrate including a plurality of mounts on an upper surface thereof to which the light emitting diodes are mounted to be electrically connected to the signal lines and the common lines, respectively;
cutting the base substrate having the light emitting diodes mounted thereon into first regions to provide a plurality of light emitting modules;
forming a bonding layer on a motherboard;
coupling the light emitting modules to the motherboard on which the bonding layer is disposed; and
electrically connecting adjacent light emitting modules to each other,
wherein:
each of the light emitting modules includes a plurality of signal line terminals and a plurality of common line terminals disposed on an upper surface thereof and electrically connected to the signal lines and the common lines, respectively; and
electrically connecting the adjacent light emitting modules comprises electrically connecting the signal line terminals formed on the adjacent light emitting modules to each other and electrically connecting the common line terminals formed on the adjacent light emitting modules to each other.

16. The method according to claim 15, wherein, in electrically connecting the adjacent light emitting modules, the adjacent signal line terminals are electrically connected to each other by wire bonding, and the adjacent common line terminals are electrically connected to each other by wire bonding.

17. The method according to claim 15, wherein, in electrically connecting the adjacent light emitting modules, an upper surface of each of the adjacent signal line terminals is covered by an electrically conductive bonding layer, and an upper surface of each of the adjacent common line terminals is covered by the electrically conductive bonding layer, such that the adjacent signal line terminals are electrically connected to each other and the adjacent common line terminals are electrically connected to each other by the electrically conductive bonding layer.

18. The method according to claim 17, wherein the electrically conductive bonding layer comprises one of an anisotropic conductive film (ACF), anisotropic conductive pastes (ACP), self-assembly pastes (SAP/epoxy+Sn-Bi), eutectic, AuSn, AgSn, In, and solder pastes.

19. The method according to claim 15, further comprising forming a plurality of lateral signal line terminals on side surfaces of the light emitting modules at locations corresponding to the signal line terminals, and forming a plurality of lateral common line terminals on side surfaces of the light emitting modules at locations corresponding to the common line terminals, wherein electrically connecting the adjacent light emitting modules comprises electrically connecting adjacent lateral signal line terminals to each other and adjacent multiple lateral common line terminals to each other using an electrically conductive bonding layer.

20. The method according to claim 19, wherein the electrically conductive bonding layer comprises one of an anisotropic conductive film (ACF), anisotropic conductive pastes (ACP), self-assembly pastes (SAP/epoxy+Sn-Bi), eutectic, AuSn, AgSn, In, and solder pastes.

* * * * *